United States Patent
Koezuka et al.

(10) Patent No.: US 12,363,955 B2
(45) Date of Patent: Jul. 15, 2025

(54) METHOD FOR MANUFACTURING A SEMICONDUCTOR DEVICE

(71) Applicant: Semiconductor Energy Laboratory Co., Ltd., Atsugi (JP)

(72) Inventors: Junichi Koezuka, Tochigi (JP); Yasutaka Nakazawa, Tochigi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/599,592

(22) Filed: Mar. 8, 2024

(65) Prior Publication Data
US 2025/0081534 A1 Mar. 6, 2025

Related U.S. Application Data

(63) Continuation of application No. 17/869,960, filed on Jul. 21, 2022, now Pat. No. 11,935,963, which is a (Continued)

(30) Foreign Application Priority Data

Mar. 23, 2018 (JP) ................. 2018-056918

(51) Int. Cl.
*H01L 29/786* (2006.01)
*G01N 23/223* (2006.01)
(Continued)

(52) U.S. Cl.
CPC ....... *H10D 30/6755* (2025.01); *G01N 23/223* (2013.01); *G01N 23/2273* (2013.01); *H10D 62/40* (2025.01)

(58) Field of Classification Search
CPC ... H01L 29/7869; H01L 29/786; H01L 29/04; H01L 21/02274; H01L 21/32134;
(Continued)

(56) References Cited

U.S. PATENT DOCUMENTS 5,672,907 A 9/1997 Kasagi
8,541,780 B2 9/2013 Yamazaki et al.
(Continued)

FOREIGN PATENT DOCUMENTS

CN 102598283 A 7/2012
CN 106537604 A 3/2017
(Continued)

OTHER PUBLICATIONS

International Search Report (Application No. PCT/IB2019/051968) Dated Jun. 18, 2019.
(Continued)

*Primary Examiner* — Nikolay K Yushin
(74) *Attorney, Agent, or Firm* — Robinson Intellectual Property Law Office, P.C.; Eric J. Robinson

(57) ABSTRACT

A semiconductor device with favorable electrical characteristics is provided. A semiconductor device having stable electrical characteristics is provided. A highly reliable semiconductor device is provided. The semiconductor device includes a semiconductor layer, a first insulating layer, a second insulating layer, and a conductive layer. The first insulating layer is in contact with part of the top surface of the semiconductor layer, the conductive layer is positioned over the first insulating layer, and the second insulating layer is positioned over the semiconductor layer. The semiconductor layer contains a metal oxide and includes a first region overlapping with the conductive layer and a second region not overlapping with the conductive layer. The second region is in contact with the second insulating layer. The second insulating layer contains oxygen and a first element. The first element is one or more of phosphorus, boron, magnesium, aluminum, and silicon.

13 Claims, 26 Drawing Sheets

Related U.S. Application Data continuation of application No. 16/976,232, filed as application No. PCT/IB2019/051968 on Mar. 12, 2019, now Pat. No. 11,430,897.

(51) Int. Cl.
*G01N 23/2273* (2018.01)
*H10D 30/67* (2025.01)
*H10D 62/40* (2025.01)

(58) Field of Classification Search
CPC ........... H01L 21/76829; H01L 21/7682; H01L 27/0668; H01L 27/088; H01L 27/1255; H01L 27/0266; G01N 23/223; G01N 23/2273; G01N 23/22
See application file for complete search history.

(56) References Cited

U.S. PATENT DOCUMENTS

| | | | |
|---|---|---|---|
| 9,130,041 B2 | 9/2015 | Yamazaki et al. |
| 9,318,618 B2 | 4/2016 | Endo et al. |
| 9,496,408 B2 | 11/2016 | Yamazaki et al. |
| 9,496,412 B2 | 11/2016 | Koezuka et al. |
| 9,537,012 B2 | 1/2017 | Yamazaki et al. |
| 9,634,149 B2 | 4/2017 | Endo et al. |
| 9,741,865 B2 | 8/2017 | Yamazaki et al. |
| 9,748,403 B2 | 8/2017 | Koezuka et al. |
| 9,768,279 B2 | 9/2017 | Noda et al. |
| 9,837,512 B2 | 12/2017 | Koezuka et al. |
| 9,859,437 B2 | 1/2018 | Morosawa et al. |
| 9,899,536 B2 | 2/2018 | Yamazaki et al. |
| 10,032,929 B2 | 7/2018 | Koezuka et al. |
| 10,096,684 B2 | 10/2018 | Hosaka et al. |
| 10,158,008 B2 | 12/2018 | Koezuka et al. |
| 10,164,075 B2 | 12/2018 | Koezuka et al. |
| 10,535,742 B2 | 1/2020 | Hosaka et al. |
| 10,699,904 B2 | 6/2020 | Endo et al. |
| 10,763,371 B2 | 9/2020 | Morosawa et al. |
| 11,430,897 B2 | 8/2022 | Koezuka et al. |
| 2011/0057188 A1 | 3/2011 | Yamazaki et al. |
| 2014/0346501 A1 | 11/2014 | Yamazaki |
| 2015/0187951 A1 | 7/2015 | Endo et al. |
| 2017/0186843 A1 | 6/2017 | Hosaka et al. |
| 2020/0161435 A1 | 5/2020 | Hosaka et al. |

FOREIGN PATENT DOCUMENTS

| | | |
|---|---|---|
| CN | 107683531 A | 2/2018 |
| CN | 108473334 A | 8/2018 |
| JP | 03-159250 A | 7/1991 |
| JP | 04-177765 A | 6/1992 |
| JP | 08-321502 A | 12/1996 |
| JP | 2004-247414 A | 9/2004 |
| JP | 2005-093626 A | 4/2005 |
| JP | 2005-321670 A | 11/2005 |
| JP | 2008-270637 A | 11/2008 |
| JP | 2011-077515 A | 4/2011 |
| JP | 2011-198579 A | 10/2011 |
| JP | 2011-228622 A | 11/2011 |
| JP | 2012-033778 A | 2/2012 |
| JP | 2014-007399 A | 1/2014 |
| JP | 2015-144266 A | 8/2015 |
| JP | 2017-076787 A | 4/2017 |
| JP | 2018-006728 A | 1/2018 |
| KR | 2012-0050513 A | 5/2012 |
| KR | 2018-0099725 A | 9/2018 |
| TW | 201126721 | 8/2011 |
| WO | WO-2011/027723 | 3/2011 |
| WO | WO-2016/009310 | 1/2016 |
| WO | WO-2016/189414 | 12/2016 |
| WO | WO-2017/064590 | 4/2017 |
| WO | WO-2017/115222 | 7/2017 |

OTHER PUBLICATIONS

Written Opinion (Application No. PCT/IB2019/051968) Dated Jun. 18, 2019.
Chinese Office Action (Application No. 201980019782.4) Dated Oct. 14, 2023.

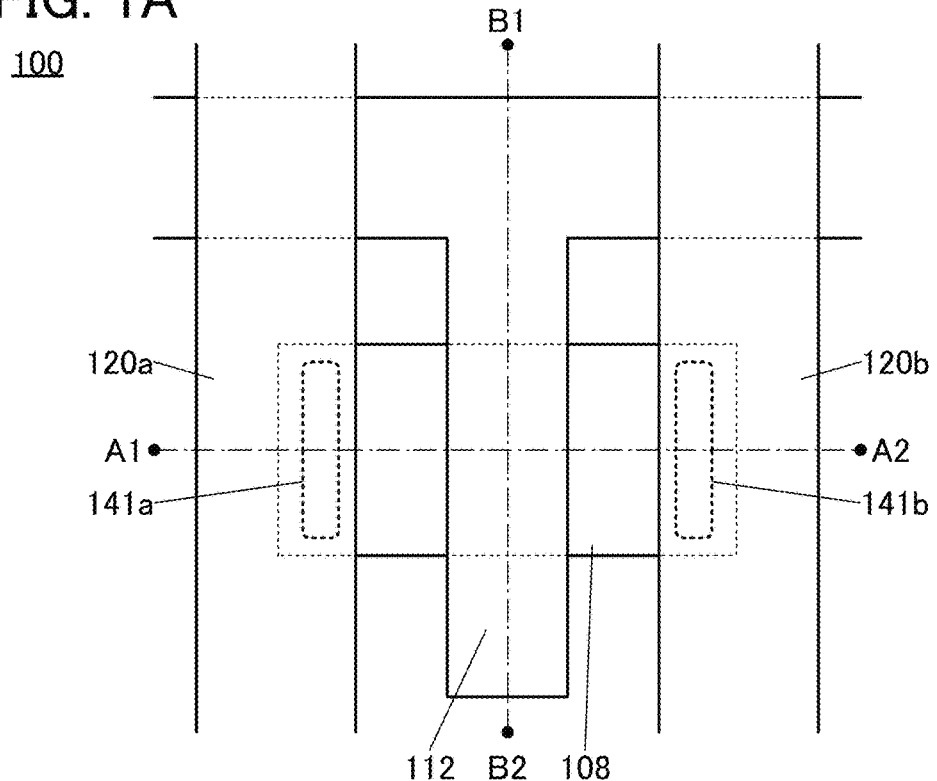
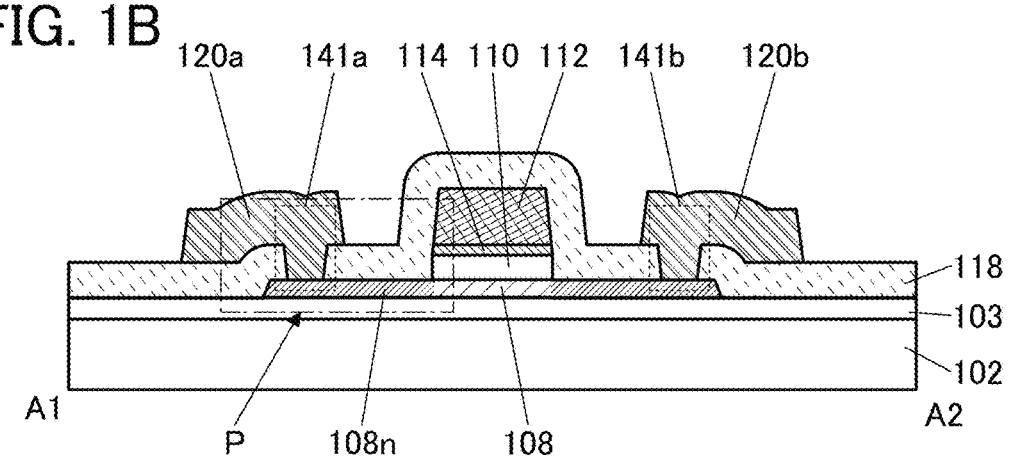
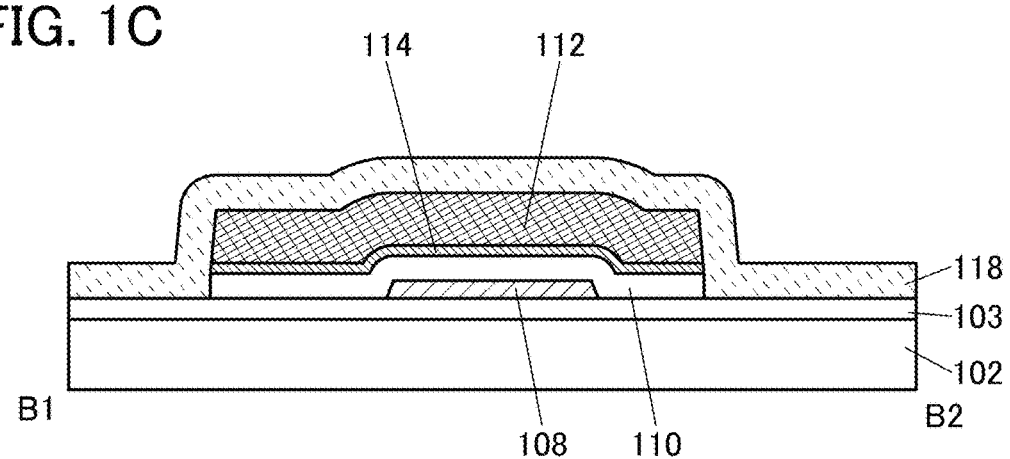

FIG. 16A
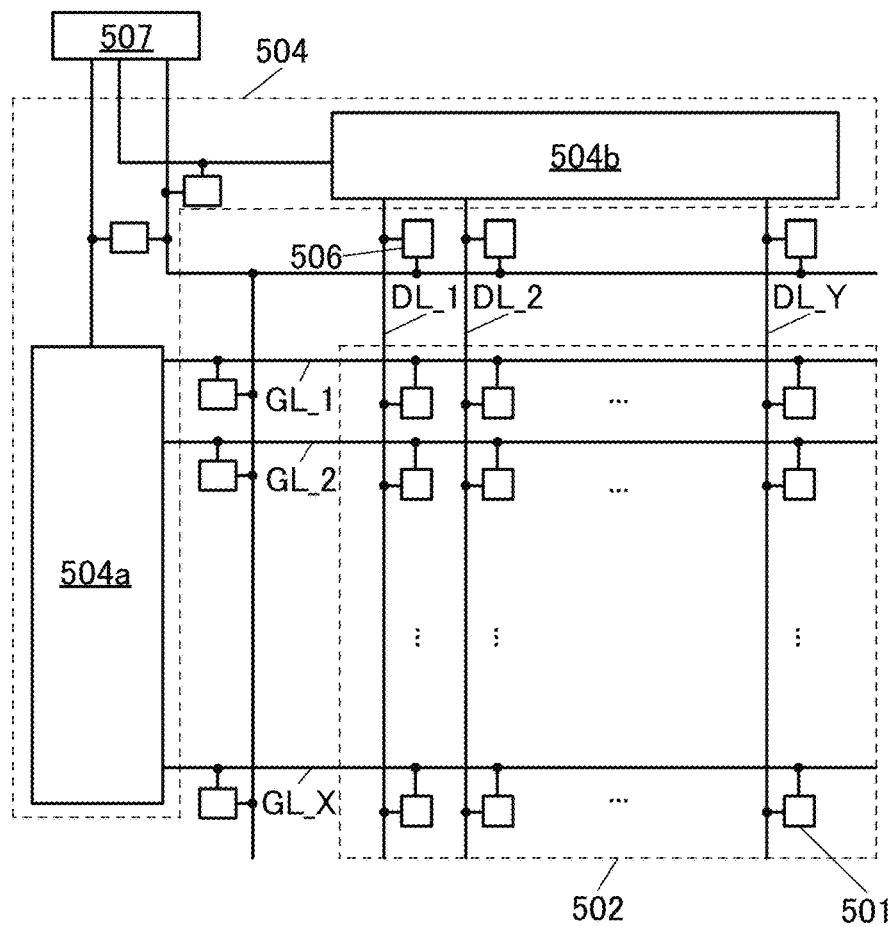
FIG. 16B
FIG. 16C
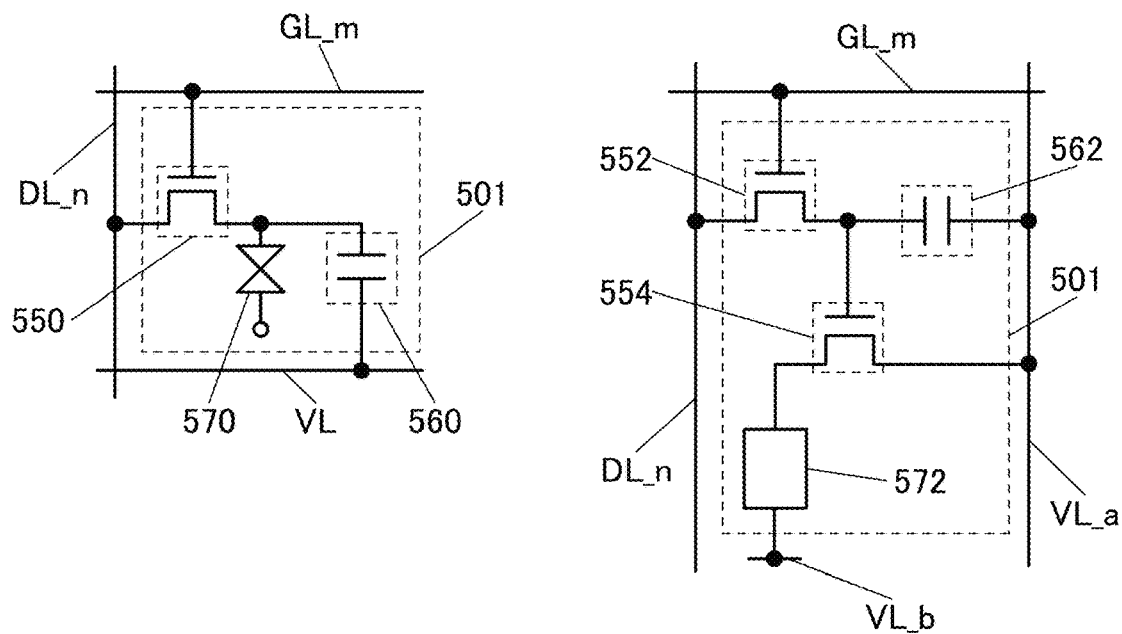

300nm

300nm

METHOD FOR MANUFACTURING A SEMICONDUCTOR DEVICE

TECHNICAL FIELD

One embodiment of the present invention relates to a semiconductor device. One embodiment of the present invention relates to a display device. One embodiment of the present invention relates to a method for manufacturing a semiconductor device or a display device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a fabrication method thereof. A semiconductor device generally means a device that can function by utilizing semiconductor characteristics.

BACKGROUND ART

As a semiconductor material that can be used in a transistor, an oxide semiconductor using a metal oxide has been attracting attention. For example, Patent Document 1 discloses a semiconductor device that makes field-effect mobility (simply referred to as mobility or μFE in some cases) to be increased by stacking a plurality of oxide semiconductor layers, containing indium and gallium in an oxide semiconductor layer serving as a channel in the plurality of oxide semiconductor layers, and making the proportion of indium higher than the proportion of gallium.

A metal oxide that can be used for a semiconductor layer can be formed by a sputtering method or the like, and thus can be used for a semiconductor layer of a transistor included in a large display device. In addition, capital investment can be reduced because part of production equipment for a transistor using polycrystalline silicon or amorphous silicon can be retrofitted and utilized. A transistor using a metal oxide has field-effect mobility higher than that in the case where amorphous silicon is used; therefore, a high-performance display device provided with driver circuits can be obtained.

Patent Document 2 discloses a thin film transistor in which an oxide semiconductor film including a low-resistance region containing at least one kind in a group consisting of aluminum, boron, gallium, indium, titanium, silicon, germanium, tin, and lead as a dopant is used for a source region and a drain region.

REFERENCES

Patent Document

[Patent Document 1] Japanese Published Patent Application No. 2014-7399
[Patent Document 2] Japanese Published Patent Application No. 2011-228622

SUMMARY OF THE INVENTION

Problems to be Solved by the Invention

One object of one embodiment of the present invention is to provide a semiconductor device having favorable electrical characteristics. Another object is to provide a semiconductor device having stable electrical characteristics. Another object is to provide a highly reliable semiconductor device.

Note that the descriptions of these objects do not disturb the existence of other objects. One embodiment of the present invention does not have to achieve all the objects. Note that objects other than them can be derived from the description of the specification, the drawings, the claims, and the like.

Means for Solving the Problems

One embodiment of the present invention is a semiconductor device including a semiconductor layer, a first insulating layer, a second insulating layer, and a conductive layer. The first insulating layer is in contact with part of a top surface of the semiconductor layer, the conductive layer is positioned over the first insulating layer, and the second insulating layer is positioned over the semiconductor layer. The semiconductor layer contains a metal oxide. The semiconductor layer includes a first region overlapping with the conductive layer and a second region not overlapping with the conductive layer, and the second region is in contact with the second insulating layer. The second insulating layer contains oxygen and a first element, and the first element is one or more of phosphorus, boron, magnesium, aluminum, and silicon. In addition, in the thickness direction of the second insulating layer, the ratio of the maximum concentration of the first element to the minimum concentration thereof is greater than or equal to 1.0 and less than or equal to 10.0.

One embodiment of the present invention is a semiconductor device including a semiconductor layer, a first insulating layer, a second insulating layer, and a conductive layer. The first insulating layer is in contact with a top surface and a side surface of the semiconductor layer, the conductive layer is positioned over the first insulating layer, and the second insulating layer is positioned over the semiconductor layer. The semiconductor layer contains a metal oxide. The semiconductor layer includes a first region overlapping with the conductive layer and a second region not overlapping with the conductive layer. The first insulating layer includes a third region overlapping with the conductive layer and a fourth region not overlapping with the conductive layer, and the fourth region is in contact with the second insulating layer. The second insulating layer contains oxygen and a first element, and the first element is one or more of phosphorus, boron, magnesium, aluminum, and silicon. In addition, in the thickness direction of the second insulating layer, the ratio of the maximum concentration of the first element to the minimum concentration thereof is greater than or equal to 1.0 and less than or equal to 10.0.

In the semiconductor device, the fourth region preferably contains the first element.

In the semiconductor device, the fourth region preferably has a smaller thickness than the third region.

In the semiconductor device, the second insulating layer preferably includes a region where the concentration of the first element is higher than or equal to $1 \times 10^{20}$ atoms/cm$^3$ and lower than or equal to $1 \times 10^{22}$ atoms/cm$^3$.

In the semiconductor device, a peak derived from a bond of the first element and oxygen is preferably observed in the second insulating layer in X-ray photoelectron spectroscopy analysis.

In the semiconductor device, the second region preferably contains the first element.

In the semiconductor device, the second region preferably includes a region where the concentration of the first element is higher than or equal to $1\times10^{20}$ atoms/cm$^3$ and lower than or equal to $1\times10^{22}$ atoms/cm$^3$.

In the semiconductor device, a peak derived from a bond of the first element and oxygen is preferably observed in the second region in X-ray photoelectron spectroscopy analysis.

Effect of the Invention

According to one embodiment of the present invention, it is possible to provide a semiconductor device having favorable electrical characteristics. Alternatively, it is possible to provide a semiconductor device having stable electrical characteristics. Alternatively, it is possible to provide a highly reliable display device.

Note that the descriptions of the effects do not disturb the existence of other effects. Note that one embodiment of the present invention does not need to have all these effects. Note that effects other than them can be derived from the description of the specification, the drawings, the claims, and the like.

BRIEF DESCRIPTION OF THE DRAWINGS

FIGS. 1A-1C A structure example of a transistor.
FIGS. 16A-16C A block diagram and circuit diagrams of a display device.

MODE FOR CARRYING OUT THE INVENTION

Figure 2A:
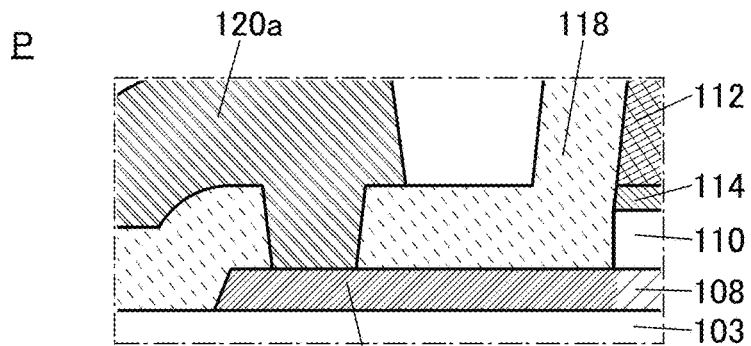
FIGS. 2A-2D Structure examples of transistors.

Hereinafter, embodiments will be described with reference to the drawings. Note that the embodiments can be implemented in many different modes, and it will be readily appreciated by those skilled in the art that modes and details of the embodiments can be changed in various ways without departing from the spirit and scope thereof. Thus, the present invention should not be interpreted as being limited to the following description of the embodiments.

In each drawing described in this specification, the size, the layer thickness, or the region of each component is exaggerated for clarity in some cases.

Ordinal numbers such as "first", "second", and "third" used in this specification are used in order to avoid confusion among components, and the terms do not limit the components numerically.

In this specification, terms for describing arrangement, such as "over" and "under", are used for convenience in describing a positional relation between components with reference to drawings. The positional relation between components is changed as appropriate in accordance with a direction in which the components are described. Thus, terms for the description are not limited to those used in this specification, and the description can be changed appropriately depending on the situation.

In this specification and the like, functions of a source and a drain of a transistor are sometimes switched from each other depending on the polarity of the transistor, the case where the direction of current flow is changed in circuit operation, or the like. Thus, the terms "source" and "drain" can be used interchangeably.

Note that in this specification and the like, a channel length direction of a transistor refers to one of the directions parallel to a straight line that connects a source region and a drain region in the shortest distance. In other words, the channel length direction corresponds to one of directions of current flowing in a semiconductor layer when a transistor is in an on state. A channel width direction refers to a direction orthogonal to the channel length direction. Note that each of the channel length direction and the channel width direction is not fixed to one direction in some cases depending on the structure and the shape of a transistor.

In this specification and the like, "electrically connected" includes the case where connection is made through an "object having any electric function". Here, there is no particular limitation on the "object having any electric function" as long as electric signals can be transmitted and received between the connected components. Examples of the "object having any electric function" include a switching element such as a transistor, a resistor, an inductor, a capacitor, and other elements with a variety of functions as well as an electrode and a wiring.

Moreover, in this specification and the like, the term "film" and the term "layer" can be interchanged with each other. For example, in some cases, the term "conductive layer" and the term "insulating layer" can be interchanged with the term "conductive film" and the term "insulating film", respectively.

Unless otherwise specified, an off-state current in this specification and the like refers to a drain current of a transistor in an off state (also referred to as a non-conducting state or a cutoff state). Unless otherwise specified, an off state refers to, in an n-channel transistor, a state where the voltage Vgs between its gate and source is lower than the threshold voltage Vth (in a p-channel transistor, higher than Vth).

In this specification and the like, a display panel that is one embodiment of a display device has a function of displaying (outputting) an image or the like on (to) a display surface. Thus, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Note that in this specification and the like, a touch panel that is one embodiment of a display device has a function of displaying an image or the like on a display surface and a function of a touch sensor capable of sensing the contact, press, approach, or the like of a sensing target such as a finger or a stylus with or to the display surface. Thus, the touch panel is one embodiment of an input/output device.

A touch panel can be referred to as, for example, a display panel (or a display device) with a touch sensor, or a display panel (or a display device) having a touch sensor function. A touch panel can include a display panel and a touch sensor panel. Alternatively, a touch panel can have a function of a touch sensor in the display panel or on the surface of the display panel.

In this specification and the like, a substrate of a touch panel on which a connector and an IC are mounted is referred to as a touch panel module, a display module, or simply a touch panel or the like in some cases.

Embodiment 1

In this embodiment, a semiconductor device including a transistor 100 of one embodiment of the present invention and a manufacturing method thereof will be described.

One embodiment of the present invention is a transistor including, over a formation surface, a semiconductor layer in which a channel is formed, a gate insulating layer (also referred to as a first insulating layer) over the semiconductor layer, and a conductive layer functioning as a gate electrode over the gate insulating layer. It is preferable that a protective insulating layer (also referred to as a second insulating layer) having a high barrier property against oxygen be further provided over the semiconductor layer.

The gate insulating layer is preferably provided in contact with a top surface of the semiconductor layer processed into an island shape. In addition, especially in the case where a metal oxide is used for the semiconductor layer, the gate insulating layer preferably contains an oxide.

The semiconductor layer preferably contains a metal oxide exhibiting semiconductor characteristics (hereinafter, also referred to as an oxide semiconductor). The semiconductor layer includes a channel formation region where a channel can be formed and a pair of low-resistance regions functioning as a source region and a drain region. The channel formation region is a region of the semiconductor layer that overlaps with the gate electrode. In addition, the pair of low-resistance regions is provided with the channel formation region therebetween and has lower resistance than the channel formation region. It is preferable that the low-resistance regions be in contact with the second insulating layer and covered with the second insulating layer.

The second insulating layer preferably contains an impurity element. Examples of the impurity element include hydrogen, boron, carbon, nitrogen, fluorine, phosphorus, sulfur, arsenic, aluminum, magnesium, silicon, and a rare gas. Note that typical examples of a rare gas include helium, neon, argon, krypton, and xenon. In particular, one or more of phosphorus, boron, magnesium, aluminum, and silicon are preferably contained.

In this specification and the like, an impurity element refers to an element other than a main component, and a main component refers to an element contained at 1 atomic % or more.

In particular, the second insulating layer preferably contains an impurity element that is easily bonded to oxygen. Examples of such an impurity element include boron, phosphorus, aluminum, magnesium, and silicon. When the second insulating layer contains the impurity element, oxygen contained in the second insulating layer is inhibited from being released from the second insulating layer.

When oxygen is supplied to the low-resistance region, the carrier density decreases and electrical resistance increases in some cases. However, in one embodiment of the present invention, the second insulating layer is in contact with the low-resistance region and the second insulating layer covers the low-resistance region. As a result, supply of oxygen from the second insulating layer to the low-resistance region can be inhibited, and the low-resistance region can maintain the low-electrical-resistance state. Furthermore, supply of oxygen from the second insulating layer to the gate electrode can be inhibited, and the gate electrode can maintain the low-electrical-resistance state.

In one embodiment of the present invention, the second insulating layer is in contact with a side surface of the gate insulating layer, and the second insulating layer covers the gate insulating layer. As a result, supply of oxygen from the gate insulating layer to the low-resistance region and the gate electrode can be inhibited, and the low-resistance region and the gate electrode can maintain the low-electrical-resistance state. In addition, oxygen contained in the gate insulating layer can be inhibited from being released to the second insulating layer side, and oxygen released from the gate insulating layer can be efficiently supplied to the channel formation region of the semiconductor layer. Thus, oxygen vacancies in the channel formation region of the semiconductor layer can be filled, and the transistor can have high reliability.

Employing such a structure makes it possible to achieve a semiconductor device including both a channel formation region with sufficiently reduced oxygen vacancies and extremely low carrier density and a source region and a drain region that have extremely low electrical resistance and having excellent electrical characteristics and high reliability.

More specific examples will be described below with reference to drawings.

Structure Example 1

FIG. 1(A) is a top view of the transistor 100, FIG. 1(B) corresponds to a cross-sectional view of a cut plane along dashed-dotted line A1-A2 in FIG. 1(A), and FIG. 1(C) corresponds to a cross-sectional view of a cut plane along dashed-dotted line B1-B2 in FIG. 1(A). Note that in FIG. 1(A), some components (e.g., a gate insulating layer) of the transistor 100 are not illustrated. In addition, the direction of dashed-dotted line A1-A2 corresponds to a channel length direction, and the direction of dashed-dotted line B1-B2 corresponds to a channel width direction. Furthermore, some components are not illustrated in top views of transistors in the following drawings, as in FIG. 1(A).

The transistor 100 is provided over a substrate 102 and includes an insulating layer 103, a semiconductor layer 108, an insulating layer 110, a metal oxide layer 114, a conductive layer 112, an insulating layer 118, and the like. The island-shaped semiconductor layer 108 is provided over the insulating layer 103. The insulating layer 110 is provided in contact with part of a top surface of the semiconductor layer 108. The metal oxide layer 114 and the conductive layer 112 are provided to be stacked in that order over the insulating layer 110 and include portions overlapping with the semiconductor layer 108. The insulating layer 118 is provided to cover a side surface and part of the top surface of the semiconductor layer 108, a side surface of the insulating layer 110, a side surface of the metal oxide layer 114, and a top surface and a side surface of the conductive layer 112. The insulating layer 118 functions as a protective layer protecting the transistor 100.

Part of the conductive layer 112 functions as a gate electrode. Part of the insulating layer 110 functions as a gate insulating layer. The transistor 100 is what is called a top-gate transistor, in which the gate electrode is provided over the semiconductor layer 108.

The semiconductor layer 108 preferably contains a metal oxide.

The semiconductor layer 108 preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. In particular, M is preferably one kind or a plurality of kinds selected from aluminum, gallium, yttrium, and tin.

It is particularly preferable to use an oxide containing indium, gallium, and zinc for the semiconductor layer 108.

The semiconductor layer 108 may have a stacked-layer structure in which layers with different compositions, layers with different crystallinities, or layers with different impurity concentrations are stacked.

The semiconductor layer 108 includes a region overlapping with the conductive layer 112 and a pair of low-resistance regions 108n between which the region is sandwiched. A region of the semiconductor layer 108 that overlaps with the conductive layer 112 functions as a channel formation region of the transistor 100. Meanwhile, the regions 108n function as a source region and a drain region of the transistor 100.

The region 108n can be regarded as a region having a lower resistance than the channel formation region, a region having a higher carrier density than the channel formation region, a region having a higher oxygen defect density than the channel formation region, or an n-type region.

The region 108n can be formed by exposing a metal oxide to plasma, for example. When a metal oxide is exposed to plasma, a defect, typically, an oxygen vacancy (hereinafter, also referred to as $V_O$ in some cases) is generated in the metal oxide. When the oxygen vacancy ($V_O$) and hydrogen exist in the metal oxide, a state in which hydrogen enters the oxygen vacancy (hereinafter, also referred to as $V_OH$ in some cases) is generated in some cases. $V_OH$ serves as a carrier generation source, and the carrier density is increased; thus, the metal oxide becomes n-type and the low-resistance region 108n is formed.

For example, when the insulating layer 118 is formed with a plasma-enhanced chemical vapor deposition apparatus (referred to as a PECVD apparatus or simply a plasma CVD apparatus), the region 108n can be formed in a self-aligned manner along with the formation of the insulating layer 118.

As illustrated in FIG. 1(B) and FIG. 1(C), it is preferable that the region 108n be in contact with the insulating layer 118 and the region 108n be covered with the insulating layer 118.

The insulating layer 118 contains an oxide. For the insulating layer 118, for example, an inorganic insulating material such as silicon oxide, silicon oxynitride, silicon nitride oxide, aluminum oxide, aluminum oxynitride, hafnium oxide, or hafnium aluminate can be used. Furthermore, the insulating layer 118 preferably contains an impurity element. Examples of the impurity element include hydrogen, boron, carbon, nitrogen, fluorine, phosphorus, sulfur, arsenic, aluminum, magnesium, silicon, and a rare gas. Note that typical examples of a rare gas include helium, neon, argon, krypton, and xenon. In particular, the insulating layer 118 preferably contains an impurity element that is easily bonded to oxygen, and preferably contains, for example, one or more of phosphorus, boron, magnesium, aluminum, and silicon. Alternatively, two or more of these impurity elements may be contained.

Note that in this specification and the like, an oxynitride refers to a substance that contains more oxygen than nitrogen in its composition. A nitride oxide refers to a substance that contains more nitrogen than oxygen in its composition.

The insulating layer 118 contains the above impurity element, whereby oxygen contained in the insulating layer 118 can be inhibited from being released from the insulating layer 118. In particular, the insulating layer 118 preferably contains an impurity element that is easily bonded to oxygen; when the impurity element is bonded to oxygen in the insulating layer 118, oxygen contained in the insulating layer 118 can be efficiently inhibited from being released from the insulating layer 118.

Here, oxygen contained in an insulating layer is released from the insulating layer in some cases. When the released oxygen reaches the region 108n, the oxygen deprives hydrogen of $V_OH$ included in the region 108n, so that a water molecule ($H_2O$) is released and $V_OH$ of which hydrogen is deprived becomes an oxygen vacancy ($V_O$). The oxygen vacancy ($V_O$) generated by depriving hydrogen of $V_OH$ is filled with another oxygen reaching the region 108n. When oxygen is supplied to the region 108n in this manner, $V_OH$ and the oxygen vacancies ($V_O$) included in the region 108n are reduced, that is, the carrier density of the region 108n is reduced, and the resistance of the region 108n is increased in some cases.

The transistor 100 of one embodiment of the present invention contains the above impurity element in the insulating layer 118 in contact with the region 108n. With such a structure, oxygen contained in the insulating layer 118 can be inhibited from being released from the insulating layer 118 and an increase in resistance of the region 108n can be inhibited.

The insulating layer 110 includes a region in contact with the channel formation region of the semiconductor layer 108, i.e., a region overlapping with the conductive layer 112.

As each of the insulating layer 103 and the insulating layer 110 that are in contact with the channel formation region of the semiconductor layer 108, an oxide film is preferably used. For example, an oxide film such as a silicon oxide film, a silicon oxynitride film, or an aluminum oxide film can be used. Accordingly, heat treatment or the like in the manufacturing process of the transistor 100 can supply oxygen released from the insulating layer 103 and the insulating layer 110 to the channel formation region to reduce oxygen vacancies in the channel formation region.

It is preferable that the side surface of the insulating layer 110 be in contact with the insulating layer 118 as illustrated in FIG. 1(B) and FIG. 1(C).

Here, when oxygen contained in the insulating layer 110 is released from the insulating layer 110 and the oxygen reaches the region 108n, in some cases, $V_OH$ and the oxygen vacancies ($V_O$) included in the region 108n are reduced and the resistance of the region 108n is increased. Moreover, when oxygen contained in the insulating layer 110 is released from the insulating layer 110 and the oxygen reaches the conductive layer 112, in some cases, the conductive layer 112 is oxidized and the resistance of the conductive layer 112 is increased.

In the transistor 100 of one embodiment of the present invention, the side surface of the insulating layer 110 is in contact with the insulating layer 118 and the insulating layer 110 is covered with the insulating layer 118. With such a structure, when oxygen contained in the insulating layer 110 is diffused into the insulating layer 118, the oxygen is captured by the impurity contained in the insulating layer 118 and the captured oxygen is not easily released from the insulating layer 118. In other words, an increase in resistance of the region 108n and the conductive layer 112, which is caused due to oxygen in the insulating layer 110 reaching the region 108n and the conductive layer 112 through the insulating layer 118, can be inhibited.

In addition, as illustrated in FIG. 1(A) and FIG. 1(B), the transistor 100 may include a conductive layer 120a and a conductive layer 120b over the insulating layer 118. The conductive layer 120a and the conductive layer 120b function as a source electrode and a drain electrode. The conductive layer 120a and the conductive layer 120b are electrically connected to the regions 108n included in the semiconductor layer 108 through an opening 141a and an opening 141b, respectively, which are provided in the insulating layer 118.

As illustrated in FIG. 1(B) and FIG. 1(C), the conductive layer 112, the metal oxide layer 114, and the insulating layer 110 are processed so that their top surface shapes are substantially the same.

Note that in this specification and the like, the expression "having substantially the same top surface shapes" means that at least outlines of stacked layers partly overlap with each other. For example, the case of processing or partly processing an upper layer and a lower layer with the use of the same mask pattern is included. However, in some cases, the outlines do not completely overlap with each other and the upper layer is positioned on an inner side of the lower layer or the upper layer is positioned on an outer side of the lower layer; such a case is also represented by the expression "having substantially the same top surface shapes".

The metal oxide layer 114 positioned between the insulating layer 110 and the conductive layer 112 functions as a barrier film that prevents diffusion of oxygen contained in the insulating layer 110 into a conductive layer 112 side. Furthermore, the metal oxide layer 114 also functions as a barrier film that prevents diffusion of hydrogen and water contained in the conductive layer 112 into an insulating layer 110 side. For the metal oxide layer 114, a material that is less likely to transmit oxygen and hydrogen than at least the insulating layer 110 can be used, for example.

Even in the case where a metal material that is likely to absorb oxygen, such as aluminum or copper, is used for the conductive layer 112, the metal oxide layer 114 can prevent diffusion of oxygen from the insulating layer 110 into the conductive layer 112. Furthermore, even in the case where the conductive layer 112 contains hydrogen or water, diffusion of hydrogen or water from the conductive layer 112 to the semiconductor layer 108 through the insulating layer 110 can be prevented. Consequently, carrier density in a channel formation region of the semiconductor layer 108 can be extremely low.

For the metal oxide layer 114, an insulating material or a conductive material can be used. When the metal oxide layer 114 has an insulating property, the metal oxide layer 114 functions as part of the gate insulating layer. In contrast, when the metal oxide layer 114 has conductivity, the metal oxide layer 114 functions as part of the gate electrode.

The metal oxide layer 114 is preferably formed using an insulating material having a higher dielectric constant than silicon oxide. It is particularly preferable to use an aluminum oxide film, a hafnium oxide film, a hafnium aluminate film, or the like because drive voltage can be reduced.

For the metal oxide layer 114, a conductive oxide such as indium oxide, indium tin oxide (ITO), or indium tin oxide containing silicon (ITSO) can also be used, for example. A conductive oxide containing indium is particularly preferable because of its high conductivity.

For the metal oxide layer 114, an oxide material containing one or more elements that are the same as those of the semiconductor layer 108 is preferably used. It is particularly preferable to use an oxide semiconductor material that can be used for the semiconductor layer 108. At this time, a metal oxide film formed using the same sputtering target as that for the semiconductor layer 108 is preferably used as the metal oxide layer 114, in which case the same apparatus can be used.

Alternatively, when a metal oxide material containing indium and gallium is used for both the semiconductor layer 108 and the metal oxide layer 114, the metal oxide layer 114 is preferably formed using a material having higher composition (content ratio) of gallium than that for the semiconductor layer 108 because an oxygen barrier property can be further increased. At this time, when the semiconductor layer 108 is formed using a material having a higher composition of indium than that for the metal oxide layer 114, the field-effect mobility of the transistor 100 can be increased.

In addition, the metal oxide layer 114 is preferably formed using a sputtering apparatus. For example, in the case where an oxide film is formed using a sputtering apparatus, forming the oxide film in an atmosphere containing an oxygen gas can suitably supply oxygen into the insulating layer 110 or the semiconductor layer 108.

FIG. 2(A) shows an enlarged cross-sectional view of a region P surrounded by a dashed-dotted line in FIG. 1(B).

The semiconductor layer 108 includes the region 108n in contact with the insulating layer 118. The region 108n does not overlap with the conductive layer 112. The side surface of the insulating layer 110 is in contact with the insulating layer 118.

The insulating layer 118 preferably includes a region where the concentration of the impurity element is higher than or equal to $1\times10^{19}$ atoms/cm$^3$ and lower than or equal to $1\times10^{23}$ atoms/cm$^3$, preferably higher than or equal to $5\times10^{19}$ atoms/cm$^3$ and lower than or equal to $5\times10^{22}$ atoms/cm$^3$, further preferably higher than or equal to $1\times10^{20}$ atoms/cm$^3$ and lower than or equal to $1\times10^{22}$ atoms/cm$^3$.

The concentration of the impurity element contained in the insulating layer 118 can be analyzed by an analysis method such as secondary ion mass spectrometry (SIMS) or X-ray photoelectron spectroscopy (XPS), for example. In the case of using XPS analysis, it is possible to find out the concentration distribution in the depth direction by combination of XPS analysis and ion sputtering from a front surface side or a rear surface side.

In addition, the impurity element preferably exists in an oxidized state in the insulating layer 118. For example, it is preferable to use an element that is easily oxidized, such as boron, phosphorus, magnesium, aluminum, or silicon, as the impurity element. Since such an element that is easily oxidized can exist stably in a state of being bonded to oxygen in the insulating layer 118, the element can be inhibited from being released even when a high temperature (e.g., higher than or equal to 400° C., higher than or equal to 600° C., or higher than or equal to 800° C.) is applied in a later step. Furthermore, when the impurity element is bonded to oxygen in the insulating layer 118, oxygen contained in the insulating layer 118 can be inhibited from being released from the insulating layer 118. Furthermore, oxygen is less likely to be diffused in the insulating layer 118 containing the impurity element in the oxidized state, so that it is also possible to prevent supply of oxygen from the outside of the insulating layer 118 to the region 108n and the conductive layer 112 through the insulating layer 118. Thus, in the case where high-temperature treatment is performed, the treatment is preferably performed with the region 108n and the conductive layer 112 covered with the insulating layer 118 that has a high oxygen barrier property.

For example, in the case where boron is used as the impurity element, boron contained in the insulating layer 118 can exist in a state of being bonded to oxygen. This can be confirmed when a spectrum peak attributed to a $B_2O_3$ bond is observed in XPS analysis, for example. Furthermore, in XPS analysis, the intensity of a spectrum peak attributed to a state where a boron element exists alone is so low that the spectrum peak is not observed or is buried in background noise at the measurement limit.

Here, oxygen vacancies that might be formed in the channel formation region of the semiconductor layer 108 will be described.

Oxygen vacancies that might be formed in the channel formation region of the semiconductor layer 108 adversely affect the transistor characteristics and therefore cause a problem. For example, when an oxygen vacancy is formed in the channel formation region, the oxygen vacancy might be bonded to hydrogen to serve as a carrier supply source. The carrier supply source generated in the channel formation region causes a change in the electrical characteristics, typically, a shift in the threshold voltage, of the transistor 100. Therefore, it is preferable that the amount of oxygen vacancies in the channel formation region be as small as possible.

In one embodiment of the present invention, a structure is employed in which insulating films in the vicinity of the channel formation region of the semiconductor layer 108, specifically, the insulating layer 110 positioned above the channel formation region and the insulating layer 103 positioned below the channel formation region each include an oxide film. When oxygen is transferred from the insulating layer 103 and the insulating layer 110 to the channel formation region by heat during the manufacturing process or the like, the amount of oxygen vacancies in the channel formation region can be reduced.

As illustrated in FIG. 1(B), FIG. 1(C), and FIG. 2(A), the insulating layer 118 having a high oxygen barrier property is in contact with the side surface of the insulating layer 110 and covers the insulating layer 110. Such a structure can prevent oxygen that might be released from the insulating layer 110 from being diffused to the insulating layer 118 side, so that oxygen vacancies in the channel formation region of the semiconductor layer 108 can be efficiently reduced.

In addition, the semiconductor layer 108 preferably includes a region where the atomic proportion of In is higher than the atomic proportion of M. A higher atomic proportion of In results in higher field-effect mobility of the transistor.

Here, in the case of a metal oxide containing In, Ga, and Zn, bonding strength between In and oxygen is weaker than bonding strength between Ga and oxygen; thus, with a higher atomic proportion of In, oxygen vacancies are likely to be generated in the metal oxide film. There is a similar tendency even when a metal element shown above as M is used instead of Ga. The existence of a large amount of oxygen vacancies in the metal oxide film leads to a reduction in electrical characteristics and a reduction in reliability of the transistor.

However, in one embodiment of the present invention, an extremely large amount of oxygen can be supplied into the semiconductor layer 108 containing a metal oxide; thus, a metal oxide material with a high atomic proportion of In can be used. Accordingly, it is possible to achieve a transistor with extremely high field-effect mobility, stable electrical characteristics, and high reliability.

For example, a metal oxide in which the atomic proportion of In is 1.5 times or higher, 2 times or higher, 3 times or higher, 3.5 times or higher, or 4 times or higher the atomic proportion of M can be suitably used.

It is particularly preferable that the atomic ratio of In, M, and Zn in the semiconductor layer 108 be In:M:Zn=5:1:6 or in the neighborhood thereof (M be greater than or equal to 0.5 and less than or equal to 1.5 and Zn be greater than or equal to 5 and less than or equal to 7 when In is 5). Alternatively, the atomic ratio of In, M, and Zn is preferably In:M:Zn=4:2:3 or in the neighborhood thereof. Furthermore, as the composition of the semiconductor layer 108, the atomic proportions of In, M, and Zn in the semiconductor layer 108 may be approximately equal to each other. That is, a material in which the atomic ratio of In, M, and Zn is In:M:Zn=1:1:1 or in the neighborhood thereof may be included.

For example, with the use of the transistor with high field-effect mobility in a gate driver that generates a gate signal, a display device with small frame width (also referred to as a narrow frame) can be provided. Furthermore, with the use of the transistor with high field-effect mobility in a source driver (particularly a demultiplexer connected to an output terminal of a shift register included in the source driver), a display device to which fewer wirings are connected can be provided.

Note that even when the semiconductor layer 108 includes the region where the atomic proportion of In is higher than the atomic proportion of M, the field-effect mobility might be low if the semiconductor layer 108 has high crystallinity. The crystallinity of the semiconductor layer 108 can be analyzed by using X-ray diffraction (XRD) or a transmission electron microscope (TEM), for example.

Here, impurities such as hydrogen or moisture entering the semiconductor layer 108 adversely affect the transistor characteristics and therefore cause a problem. Thus, it is preferable that the amount of impurities such as hydrogen or moisture in the semiconductor layer 108 be as small as possible. It is preferable to use a metal oxide film in which the impurity concentration is low and the density of defect states is low because a transistor having excellent electrical characteristics can be manufactured. By reducing the impurity concentration and reducing the density of defect states (reducing oxygen vacancies), the carrier density in the film can be reduced. A transistor using such a metal oxide film for a semiconductor layer rarely has electrical characteristics with a negative threshold voltage (also referred to as normally-on). Furthermore, a transistor using such a metal oxide film can have characteristics of an extremely low off-state current.

When a metal oxide film with high crystallinity is used as the semiconductor layer 108, damage at the time of processing the semiconductor layer 108 or depositing the insulating layer 110 can be inhibited, and a highly reliable transistor can be provided. By contrast, when a metal oxide film with relatively low crystallinity is used as the semiconductor layer 108, the electric conductivity can be improved, and a transistor with high field-effect mobility can be provided.

A metal oxide film having a CAAC (c-axis aligned crystal) structure described later, a metal oxide film having an nc (nano crystal) structure, or a metal oxide film in which a CAAC structure and an nc structure are mixed is preferably used as the semiconductor layer 108. In addition, the semiconductor layer 108 may have a stacked-layer structure of two or more layers.

For example, the semiconductor layer 108 in which two or more metal oxide films with different compositions are stacked can be used. For instance, in the case of using an In—Ga—Zn oxide, it is preferable to use a stack of two or more films each formed using a sputtering target with an atomic ratio of In:M:Zn=5:1:6, In:M:Zn=4:2:3, In:M:Zn=1:1:1, In:M:Zn=2:2:1, In:M:Zn=1:3:4, or In:M:Zn=1:3:2 or in the neighborhood thereof.

Alternatively, the semiconductor layer 108 in which two or more metal oxide films with different crystallinities are stacked can be used. In that case, the metal oxide films are preferably successively formed without exposure to the air using the same oxide target under different deposition conditions.

In this case, the semiconductor layer 108 can have a stacked-layer structure of a metal oxide film having an nc structure and a metal oxide film having a CAAC structure. Alternatively, a stacked-layer structure of a metal oxide film having an nc structure and a metal oxide film having an nc structure may be employed. Note that for a function or a material composition of a metal oxide that can be suitably used for a semiconductor layer 108a and a semiconductor layer 108b, refer to a CAC (Cloud-Aligned Composite) described later.

For example, the oxygen flow rate ratio at the time of depositing the earlier-formed first metal oxide film is set smaller than the oxygen flow rate ratio at the time of depositing the subsequently formed second metal oxide film. Alternatively, a condition without oxygen flowing is employed at the time of depositing the first metal oxide film. In such a manner, oxygen can be effectively supplied at the time of depositing the second metal oxide film. The first metal oxide film can have lower crystallinity and higher electrical conductivity than the second metal oxide film. Meanwhile, when the second metal oxide film provided in an upper portion has higher crystallinity than the first metal oxide film, damage caused at the time of processing the semiconductor layer 108 or depositing the insulating layer 110 can be inhibited.

Specifically, the oxygen flow rate ratio at the time of depositing the first metal oxide film is higher than or equal to 0% and lower than 50%, preferably higher than or equal to 0% and lower than or equal to 30%, further preferably higher than or equal to 0% and lower than or equal to 20%, typically 10%. The oxygen flow rate ratio at the time of depositing the second metal oxide film is higher than or equal to 50% and lower than or equal to 100%, preferably higher than or equal to 60% and lower than or equal to 100%, further preferably higher than or equal to 80% and lower than or equal to 100%, still further preferably higher than or equal to 90% and lower than or equal to 100%, typically 100%. Although the conditions at the time of the deposition such as pressure, temperature, and power may vary between the first metal oxide film and the second metal oxide film, it is preferable to employ the same conditions other than the oxygen flow rate ratio, in which case the time required for the deposition steps can be shortened.

With such a structure, the transistor 100 with excellent electrical characteristics and high reliability can be achieved.

Next, an example of a structure partly different from the structure of the transistor 100 is described.

Figure 3A:
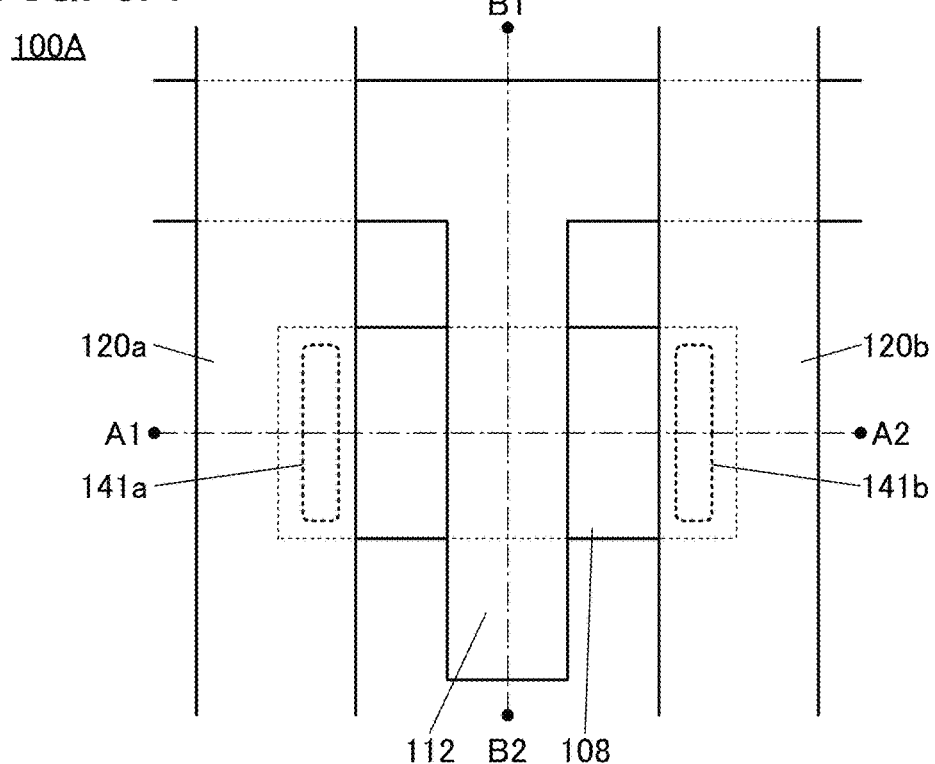
FIGS. 3A-3C A structure example of a transistor.
Figure 3B:
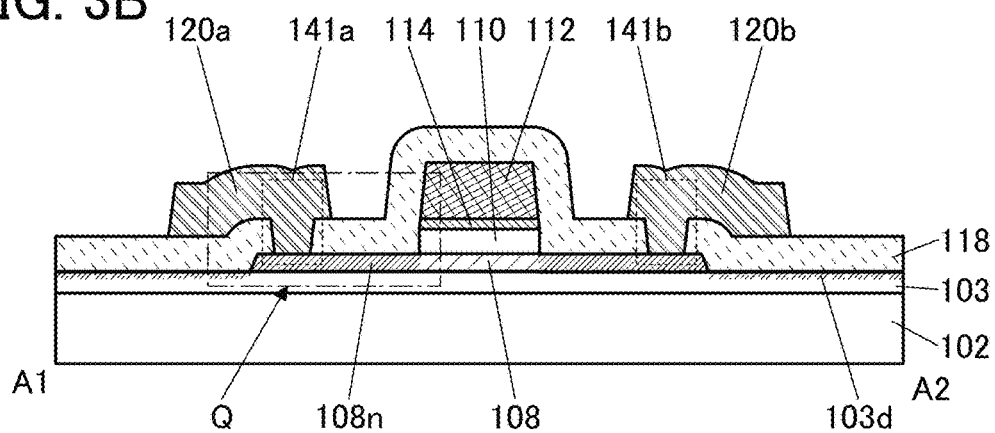
Figure 3C:
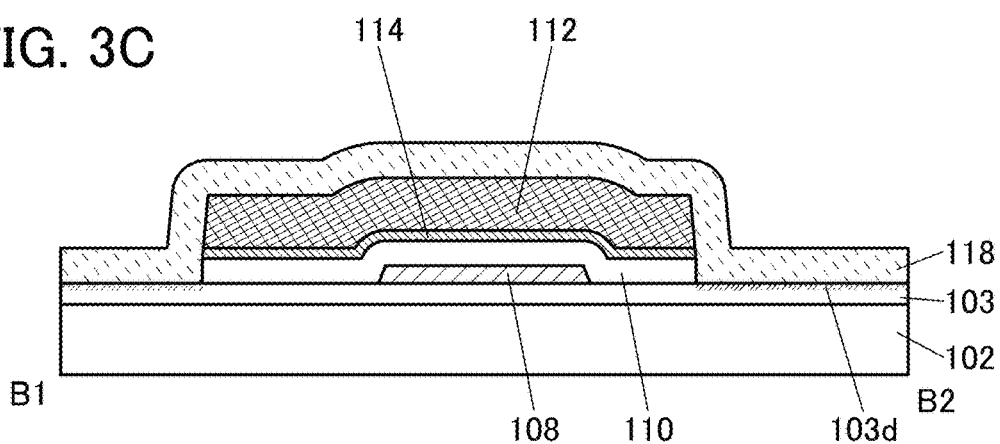

FIG. 3(A) is a top view of a transistor 100A. FIG. 3(B) is a cross-sectional view of the transistor 100A in the channel length direction. FIG. 3(C) is a cross-sectional view of the transistor 100A in the channel width direction.

The transistor 100A is different from the transistor 100 mainly in that the region 108n contains the above impurity element.

In addition, the insulating layer 103 may include a region 103d containing the impurity element in the vicinity of an interface in contact with the insulating layer 118. Furthermore, the region 103d may also be provided in the vicinity of an interface in contact with the region 108n. In that case, a portion overlapping with the region 108n has a lower impurity concentration than a portion in contact with the insulating layer 118 in some cases.

The region 103d can be formed in such a manner that heat treatment is performed after the formation of the insulating layer 118 so that the impurity element contained in the insulating layer 118 is diffused to the insulating layer 103. Furthermore, the impurity element contained in the insulating layer 118 is diffused to the semiconductor layer 108 by the heat treatment, whereby the region 108n containing the impurity element can be formed. Accordingly, a region 110d can be formed in a self-aligned manner at the same time as the formation of the region 108n containing the impurity element. In the transistor 100A, the region 108n can also be regarded as a region having a higher concentration of the impurity element than the channel formation region. Note that when the insulating layer 118 is formed, the region 108n and the region 103d containing the impurity element is formed in some cases.

Figure 2B:
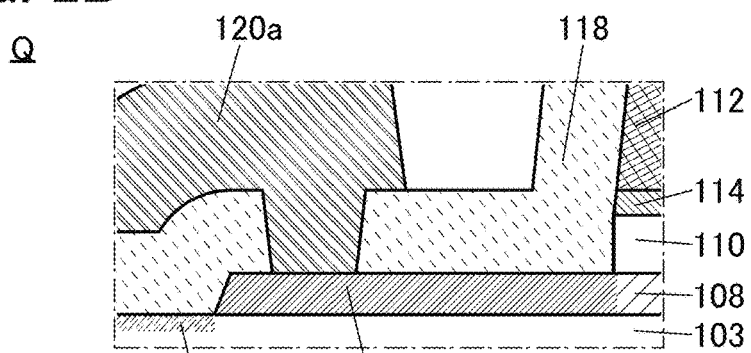

FIG. 2(B) shows an enlarged cross-sectional view of a region Q surrounded by a dashed-dotted line in FIG. 3(B).

In the case where the region 108n contains the impurity element, the concentration of the impurity element in the region 108n preferably has a concentration gradient such that the concentration is higher in a region closer to the insulating layer 118. In that case, an upper portion of the region 108n has lower resistance, and thus contact resistance with the conductive layer 120a (or the conductive layer 120b) can be more effectively reduced. The total amount of the impurity element in the region 108n can be smaller than that in the case where the concentration is uniform throughout the entire region 108n; thus, the amount of the impurity that might be diffused to the channel formation region owing to the influence of the heat during the manufacturing process can be kept small. The concentration of the impurity element in the region 108n can be adjusted with formation conditions for the insulating layer 118 and a temperature and a time of the heat treatment performed after the formation of the insulating layer 118.

Note that in FIG. 2(B) and the like, to show, in an exaggerated way, that a portion with a high concentration of the impurity element in the insulating layer 103 is positioned in the vicinity of an interface with the insulating layer 118, the region 103d is illustrated with a hatching pattern only in the vicinity of the insulating layer 118 in the insulating layer 103; however, the impurity element may be actually contained in the entire insulating layer 103 in the thickness direction.

The region 108n and the region 103d each preferably include a region where the impurity concentration is higher than or equal to $1\times10^{19}$ atoms/cm$^3$ and lower than or equal to $1\times10^{23}$ atoms/cm$^3$, preferably higher than or equal to $5\times10^{19}$ atoms/cm$^3$ and lower than or equal to $5\times10^{22}$ atoms/cm$^3$, further preferably higher than or equal to $1\times10^{20}$ atoms/cm$^3$ and lower than or equal to $1\times10^{22}$ atoms/cm$^3$.

The concentration of the impurity contained in each of the region 108n and the region 103d can be analyzed by an analysis method such as secondary ion mass spectrometry (SIMS) or X-ray photoelectron spectroscopy (XPS), for example. In the case of using XPS analysis, it is possible to find out the concentration distribution in the depth direction by combination of XPS analysis and ion sputtering from a front surface side or a rear surface side.

In addition, the impurity element preferably exists in an oxidized state in the region 108n. For example, it is preferable to use an element that is easily oxidized, such as boron, phosphorus, magnesium, aluminum, or silicon, as the impurity element. Since such an element that is easily oxidized can exist stably in a state of being bonded to oxygen in the semiconductor layer 108, the element can be inhibited from being released even when a high temperature (e.g., higher than or equal to 400° C., higher than or equal to 600° C., or higher than or equal to 800° C.) is applied in a later step. Furthermore, the impurity element deprives oxygen in the semiconductor layer 108, and many oxygen vacancies ($V_O$) are generated in the region 108n. When $V_O$H in which the oxygen vacancy ($V_O$) and hydrogen in the film are bonded to each other is formed, the carrier density is increased and the region 108n is brought into an extremely low-resistance state.

Note that an increase in resistance might be caused if much oxygen is supplied from the outside or a film near the region 108n to the region 108n at the time of performing high-temperature treatment in a later step. Thus, in the case where high-temperature treatment is performed, the treatment is preferably performed with the region 108n covered with the insulating layer 118 that has a high oxygen barrier property.

In addition, the impurity element preferably exists in an oxidized state also in the region 103d. Since such an element that is easily oxidized can exist stably in a state of being bonded to oxygen in the insulating layer 103, the element can be inhibited from being released even when a high temperature is applied in a later step. Furthermore, particularly in the case where oxygen (also referred to as excess oxygen) that might be released by heating is contained in the insulating layer 103, the excess oxygen and the impurity element are bonded to each other and stabilized, so that oxygen can be inhibited from being supplied from the region 103d to the region 108n. Moreover, oxygen is less likely to be diffused into the region 103d containing the impurity element in the oxidized state, so that oxygen can also be prevented from being supplied from a portion above the region 103d to the region 108n through the region 103d.

For example, in the case where boron is used as the impurity element, boron contained in the region 108n and the region 103d can exist in a state of being bonded to oxygen. This can be confirmed when a spectrum peak attributed to a $B_2O_3$ bond is observed in XPS analysis. Furthermore, in XPS analysis, the intensity of a spectrum peak attributed to a state where a boron element exists alone is so low that the spectrum peak is not observed or is buried in background noise at the measurement limit.

The region 103d may also be provided in the vicinity of an interface in contact with the region 108n. In that case, a portion overlapping with the region 108n has a lower impurity concentration than a portion in contact with the insulating layer 110.

The above is the description of Structure example 1.

Structure Example 2

A transistor example that has a structure partly different from Structure example 1 shown above will be described below. Note that description of the same portions as those in Structure example 1 will be omitted below in some cases. Furthermore, in drawings that are referred to later, the same hatching pattern is applied to portions having functions similar to those in the above structure example, and the portions are not denoted by reference numerals in some cases.

Figure 4A:
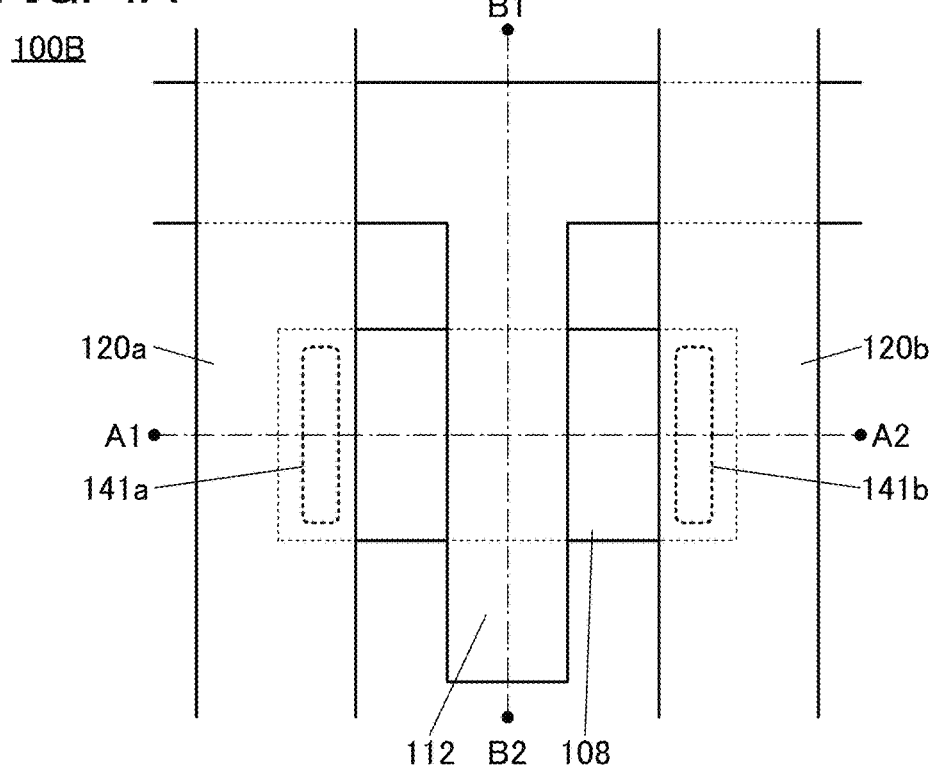
FIGS. 4A-4C A structure example of a transistor.
Figure 4B:
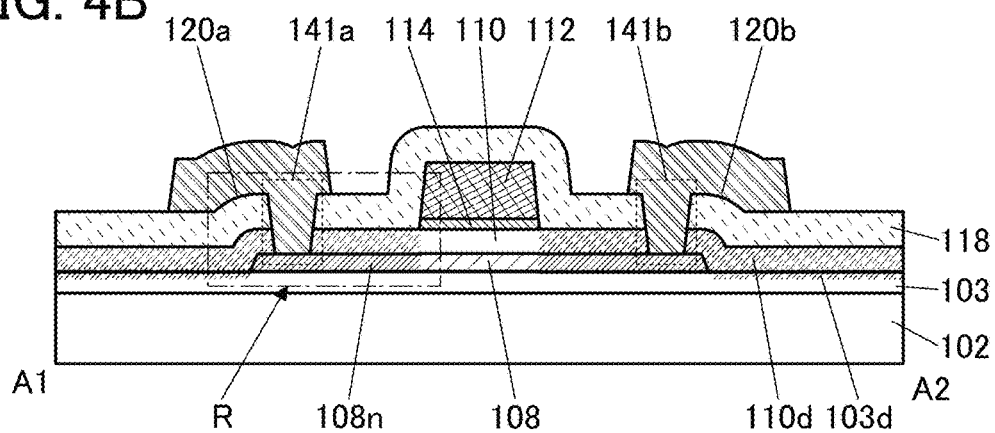
Figure 4C:
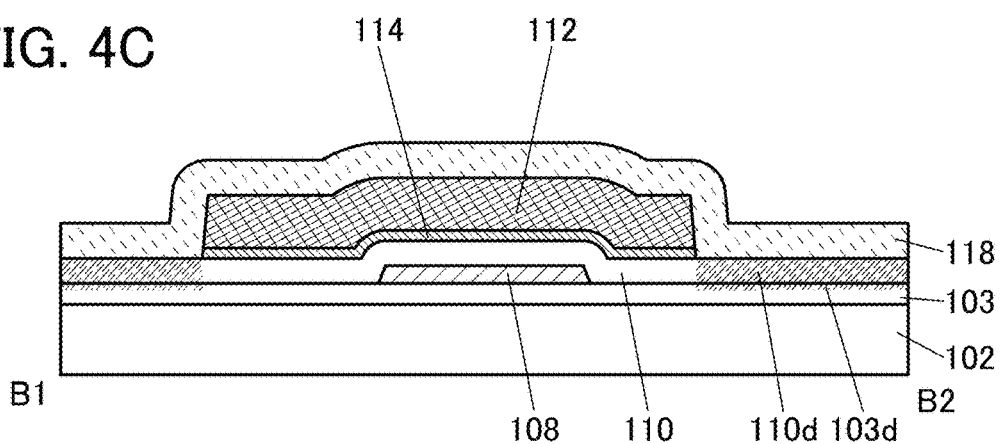

FIG. 4(A) is a top view of a transistor 100B. FIG. 4(B) is a cross-sectional view of the transistor 100B in the channel length direction. FIG. 4(C) is a cross-sectional view of the transistor 100B in the channel width direction.

The transistor 100B is different from Structure example 1 mainly in that the insulating layer 110 is formed to extend over the region 108n and the insulating layer 103. In the transistor 100B, the insulating layer 110 includes a region being provided in contact with the top surface and the side surface of the semiconductor layer 108 and the top surface of the insulating layer 103 and not overlapping with the conductive layer 112.

Figure 2C:
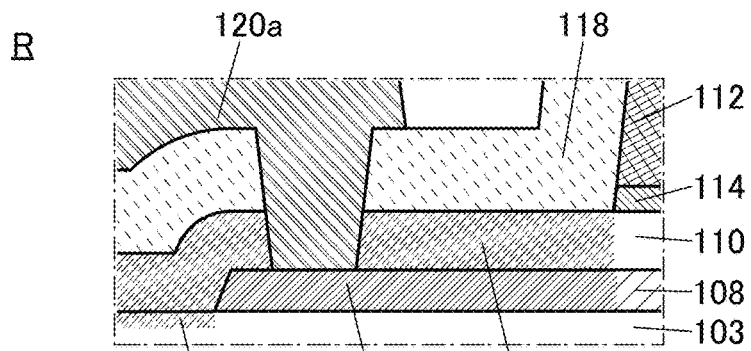

FIG. 2(C) shows an enlarged cross-sectional view of a region R surrounded by a dashed-dotted line in FIG. 4(B).

In the transistor 100B, the region 108n may include the above impurity element. In the region 108n, the concentration of the impurity element preferably has a concentration gradient such that the concentration is higher in a portion closer to the insulating layer 110. In that case, an upper portion of the region 108n has lower resistance, and thus contact resistance with the conductive layer 120a (or the conductive layer 120b) can be more effectively reduced. The total amount of the impurity element in the region 108n can be smaller than that in the case where the concentration is uniform throughout the entire region 108n; thus, the amount of the impurity that might be diffused to the channel formation region owing to the influence of the heat during the manufacturing process can be kept small. The concentration of the impurity element in the region 108n can be adjusted with the thickness of the insulating layer 110, formation conditions for the insulating layer 118, and a temperature and a time of the heat treatment performed after the formation of the insulating layer 118.

The insulating layer 110 includes a region 110d in contact with the region 108n and the insulating layer 103. The region 110d contains the above impurity element. It is preferable that the region 110d not be provided in a portion in contact with the channel formation region of the semiconductor layer 108, as illustrated in FIG. 4(B), FIG. 4(C), and FIG. 2(C).

In the insulating layer 110 using an oxide film from which oxygen can be released by heating, release of oxygen in the region 110d containing the above impurity element can be reduced as compared to that in the other regions. Therefore, the region 110d functions as a barrier layer against oxygen and can effectively reduce oxygen supplied to the region 108n.

The region 110d can be formed in such a manner that heat treatment is performed after the formation of the insulating layer 118 so that the impurity element contained in the insulating layer 118 is diffused to the insulating layer 110. Furthermore, the impurity element is diffused also to the semiconductor layer 108 by the heat treatment, whereby the region 108n can contain the impurity element.

The region 110d preferably includes a region where the impurity concentration is higher than or equal to $1 \times 10^{19}$ atoms/cm$^3$ and lower than or equal to $1 \times 10^{23}$ atoms/cm$^3$, preferably higher than or equal to $5 \times 10^{19}$ atoms/cm$^3$ and lower than or equal to $5 \times 10^{22}$ atoms/cm$^3$, further preferably higher than or equal to $1 \times 10^{20}$ atoms/cm$^3$ and lower than or equal to $1 \times 10^{22}$ atoms/cm$^3$. In addition, the region 108n preferably includes a portion having a higher impurity concentration than the region 110d of the insulating layer 110 because the electrical resistance of the region 108n can be further effectively reduced.

The concentration of the impurity contained in the region 110d can be analyzed by an analysis method such as secondary ion mass spectrometry (SIMS) or X-ray photoelectron spectroscopy (XPS), for example. In the case of using XPS analysis, it is possible to find out the concentration distribution in the depth direction by combination of XPS analysis and ion sputtering from a front surface side or a rear surface side.

In addition, the impurity element preferably exists in an oxidized state in the region 110d. For example, it is preferable to use an element that is easily oxidized, such as boron, phosphorus, magnesium, aluminum, or silicon, as the impurity element. Since such an element that is easily oxidized can exist stably in a state of being bonded to oxygen in the insulating layer 110, the element can be inhibited from being released even when a high temperature is applied in a later step. Furthermore, particularly in the case where oxygen (also referred to as excess oxygen) that might be released by heating is contained in the insulating layer 110, the excess oxygen and the impurity element are bonded to each other and stabilized, so that oxygen can be inhibited from being supplied from the region 110d to the region 108n. Moreover, oxygen is less likely to be diffused into the region 110d containing the impurity element in the oxidized state, so that oxygen can also be prevented from being supplied from a portion above the region 110d to the region 108n through the region 110d.

For example, in the case where boron is used as the impurity element, boron contained in the region 110d can exist in a state of being bonded to oxygen. This can be confirmed when a spectrum peak attributed to a $B_2O_3$ bond is observed in XPS analysis. Furthermore, in XPS analysis, the intensity of a spectrum peak attributed to a state where a boron element exists alone is so low that the spectrum peak is not observed or is buried in background noise at the measurement limit.

In addition, the insulating layer 103 may include a region 103d containing the impurity element in the vicinity of an interface in contact with the insulating layer 110. Furthermore, the region 103d may also be provided in the vicinity of an interface in contact with the region 108n. In that case, a portion overlapping with the region 108n has a lower impurity concentration than a portion in contact with the insulating layer 110.

Next, an example of a structure partly different from the structure of the transistor 100B is described.

Figure 5A:
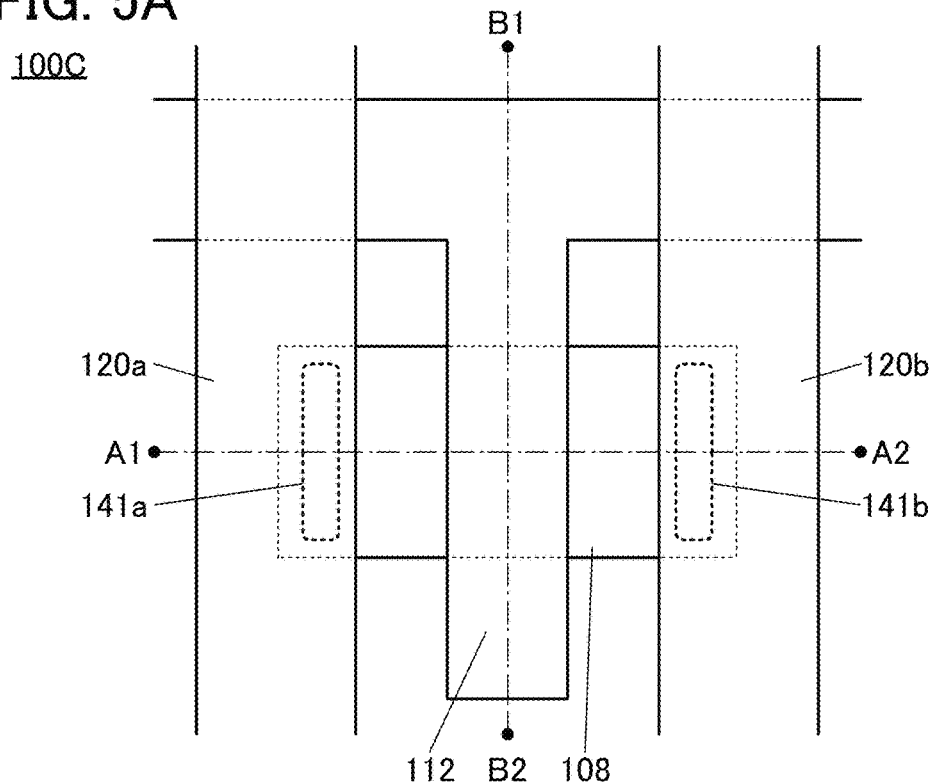
FIGS. 5A-5C A structure example of a transistor.
Figure 5B:
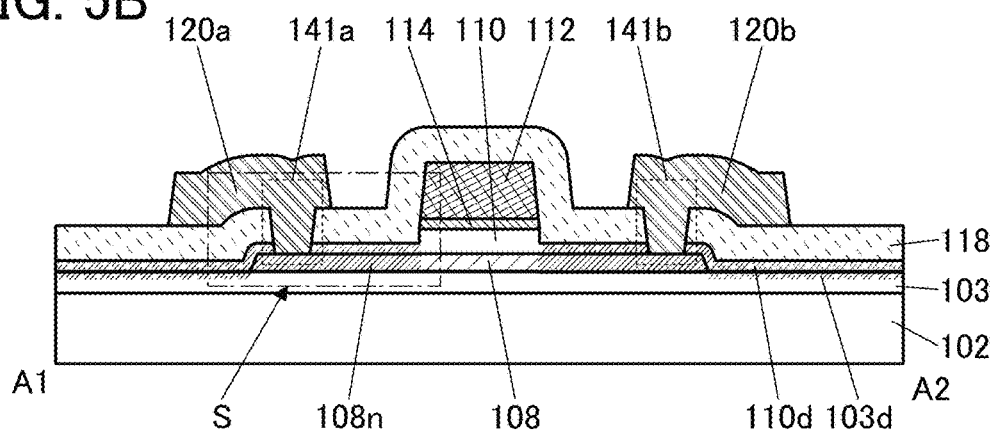
Figure 5C:
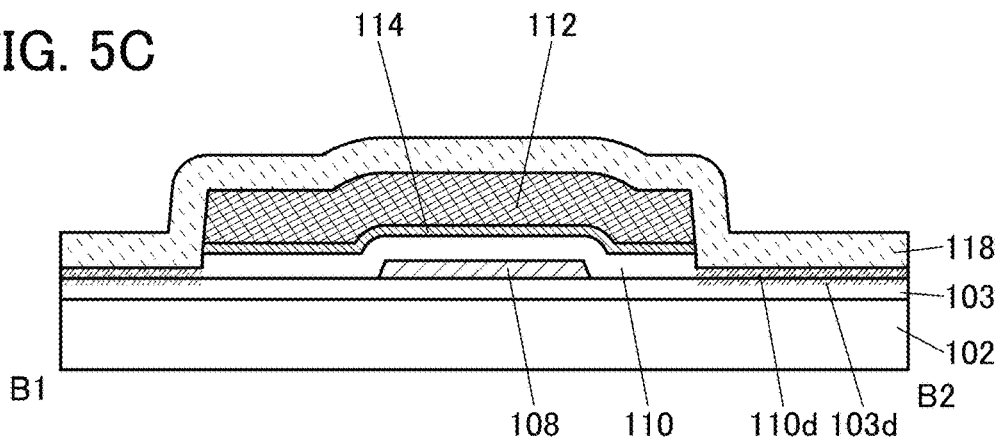

FIG. 5(A) is a top view of a transistor 100C. FIG. 5(B) is a cross-sectional view of the transistor 100C in the channel length direction. FIG. 5(C) is a cross-sectional view of the transistor 100C in the channel width direction.

The transistor 100C is different from the transistor 100B mainly in that the insulating layer 110 includes regions with different thicknesses.

Figure 2D:
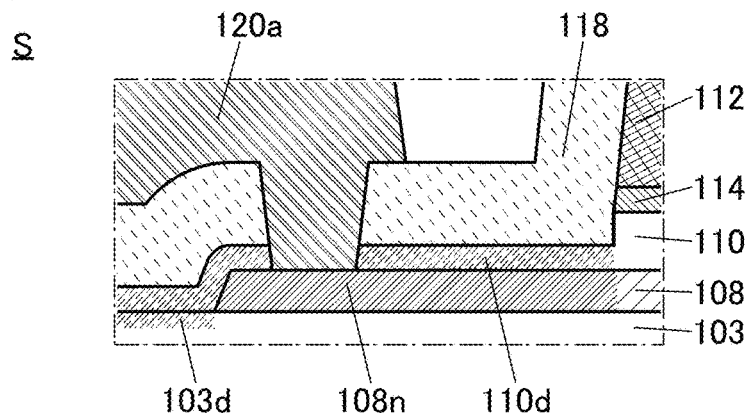

FIG. 2(D) shows an enlarged cross-sectional view of a region S surrounded by a dashed-dotted line in FIG. 5(B).

In a transistor 100D, the thickness of the insulating layer 110 in the region not overlapping with the conductive layer 112, i.e., the region 110d, is smaller than the thickness of the insulating layer 110 in a region overlapping with the conductive layer 112. With such a structure, the distance between the insulating layer 118 and the region 108n can be shortened and the impurity concentration in the region 108n can be increased. In addition, the concentration of the impurity element in the region 108n can be easily adjusted by adjusting the thickness of the region 110d. The concentration of the impurity element in the region 108n can also be adjusted with a temperature and a time of the heat treatment performed after the formation of the insulating layer 118.

The above is the description of Structure example 2.

Structure Example 3

A transistor example that has a structure partly different from Structure example 1 shown above will be described below. Note that description of the same portions as those in Structure example 1 will be omitted below in some cases. Furthermore, in drawings that are referred to later, the same hatching pattern is applied to portions having functions similar to those in the above structure example, and the portions are not denoted by reference numerals in some cases.

Figure 6A:
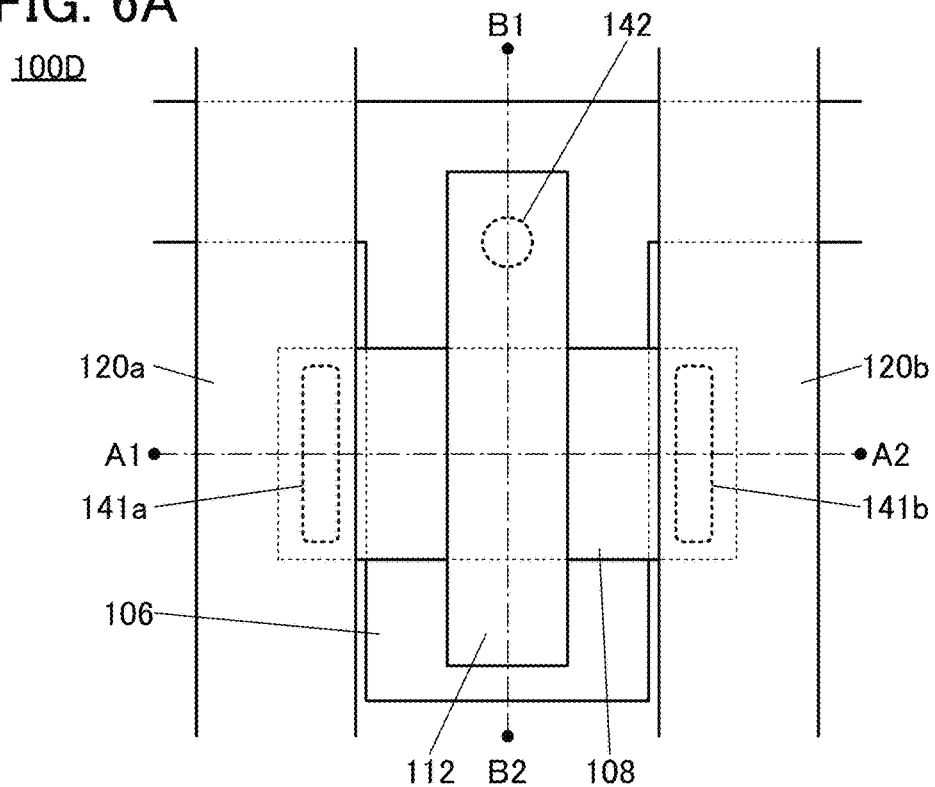
FIGS. 6A-6C A structure example of a transistor.
Figure 6B:
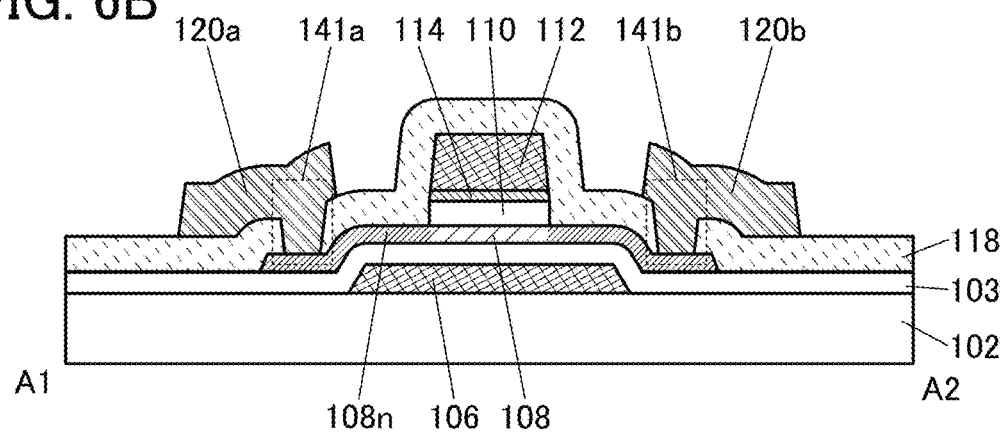
Figure 6C:
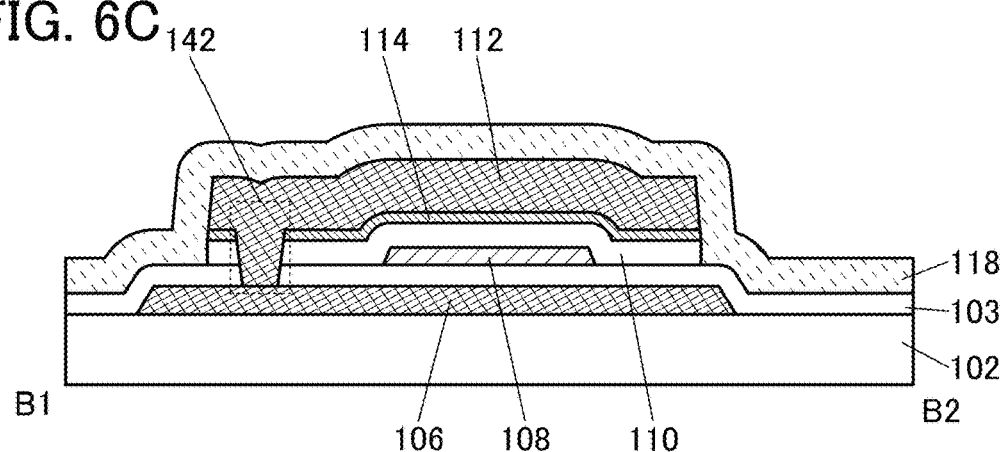

FIG. 6(A) is a top view of a transistor 100D. FIG. 6(B) is a cross-sectional view of the transistor 100D in the channel length direction. FIG. 6(C) is a cross-sectional view of the transistor 100D in the channel width direction.

The transistor 100D is different from the transistor 100 mainly in including a conductive layer 106 between the substrate 102 and the insulating layer 103. The conductive layer 106 includes a region overlapping with the semiconductor layer 108 and the conductive layer 112.

Figure 7A:
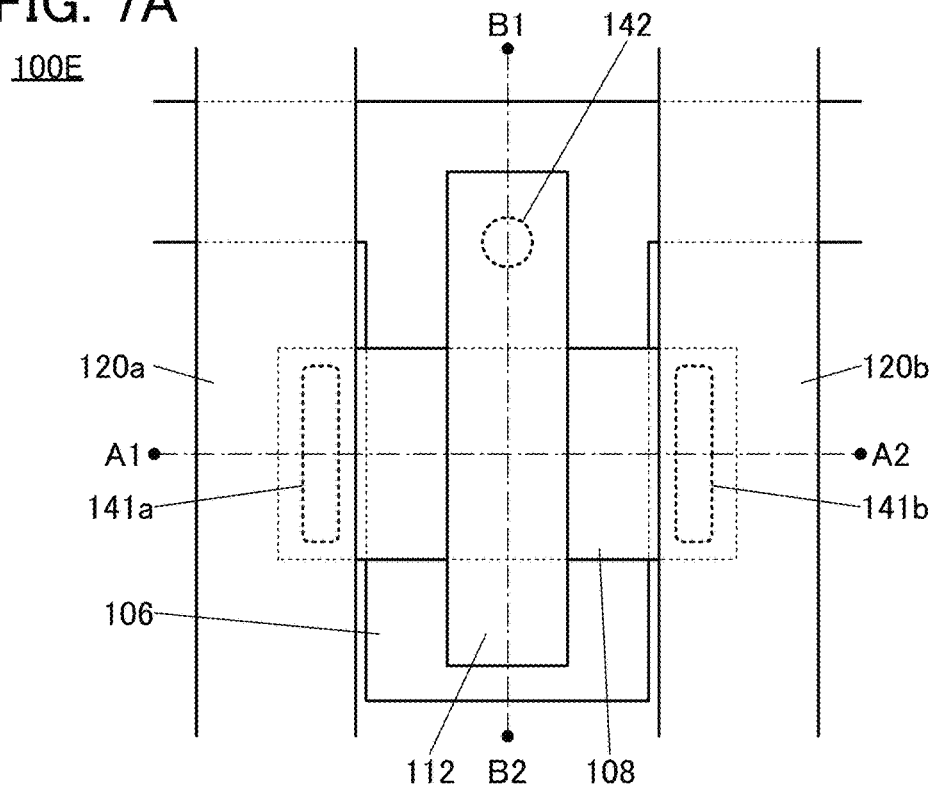
FIGS. 7A-7C A structure example of a transistor.
Figure 7B:
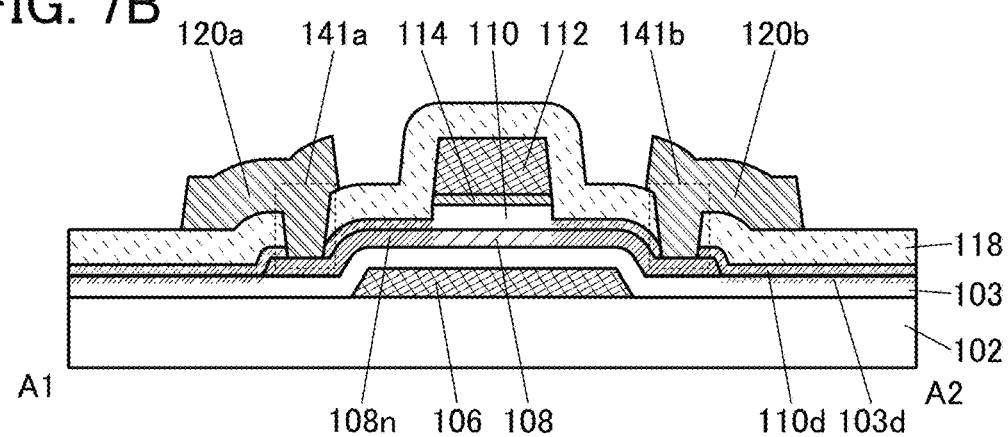
Figure 7C:
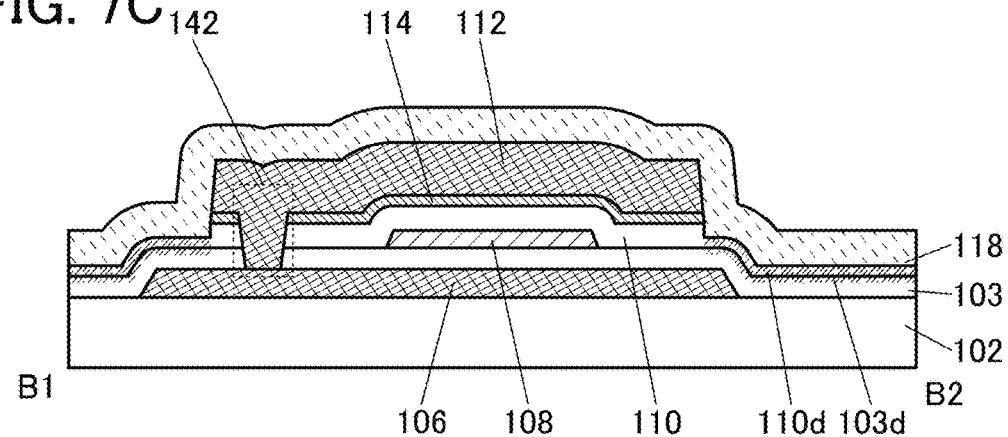

An example different from the above will be described. FIG. 7(A) is a top view of a transistor 100E. FIG. 7(B) is a cross-sectional view of the transistor 100E in the channel length direction. FIG. 7(C) is a cross-sectional view of the transistor 100E in the channel width direction.

The transistor 100E is different from the transistor 100C mainly in including the conductive layer 106 between the substrate 102 and the insulating layer 103. The conductive layer 106 includes the region overlapping with the semiconductor layer 108 and the conductive layer 112.

In each of the transistor 100D and the transistor 100E, the conductive layer 106 functions as a first gate electrode (also referred to as a bottom gate electrode), and the conductive layer 112 functions as a second gate electrode (also referred to as a top gate electrode). In addition, part of the insulating layer 103 functions as a first gate insulating layer, and part of the insulating layer 110 functions as a second gate insulating layer.

A portion of the semiconductor layer 108 that overlaps with at least one of the conductive layer 112 and the conductive layer 106 functions as a channel formation region. Note that for easy explanation, a portion of the semiconductor layer 108 that overlaps with the conductive layer 112 will be sometimes referred to as a channel formation region in the following description; however, a channel can also be actually formed in a portion not overlapping with the conductive layer 112 and overlapping with the conductive layer 106 (a portion including the region 108*n*).

In addition, as illustrated in FIG. 6(C) and FIG. 7(C), the conductive layer 106 may be electrically connected to the conductive layer 112 through an opening 142 provided in the metal oxide layer 114, the insulating layer 110, and the insulating layer 103. In that case, the same potential can be supplied to the conductive layer 106 and the conductive layer 112.

For the conductive layer 106, a material similar to that for the conductive layer 112, the conductive layer 120*a*, or the conductive layer 120*b* can be used. In particular, a material containing copper is preferably used for the conductive layer 106 because wiring resistance can be reduced.

In addition, as illustrated in FIG. 6(A), FIG. 6(C), FIG. 7(A), and FIG. 7(C), the conductive layer 112 and the conductive layer 106 preferably extend beyond an end portion of the semiconductor layer 108 in the channel width direction. In that case, as illustrated in FIG. 6(C) and FIG. 7(C), a structure is employed in which the semiconductor layer 108 in the channel width direction is entirely covered with the conductive layer 112 and the conductive layer 106 with the insulating layer 110 and the insulating layer 103 therebetween.

With such a structure, the semiconductor layer 108 can be electrically surrounded by electric fields generated by a pair of gate electrodes. At this time, it is particularly preferable that the same potential be applied to the conductive layer 106 and the conductive layer 112. In that case, electric fields for inducing a channel can be effectively applied to the semiconductor layer 108, so that the on-state current of each of the transistor 100D and the transistor 100E can be increased. Thus, the transistor 100D and the transistor 100E can also be miniaturized.

Note that a structure in which the conductive layer 112 and the conductive layer 106 are not connected to each other may be employed. In that case, a constant potential may be applied to one of the pair of gate electrodes, and a signal for driving the transistor 100D and the transistor 100E may be applied to the other. In this case, the potential applied to one of the electrodes can control the threshold voltage at the time of driving the transistor 100D and the transistor 100E with the other electrode.

The above is the description of Structure example 3.

Application Example

Examples where a semiconductor film containing an impurity is used as one electrode of a capacitor and a transistor and the capacitor are formed on the same plane will be described below.

Figure 8A:
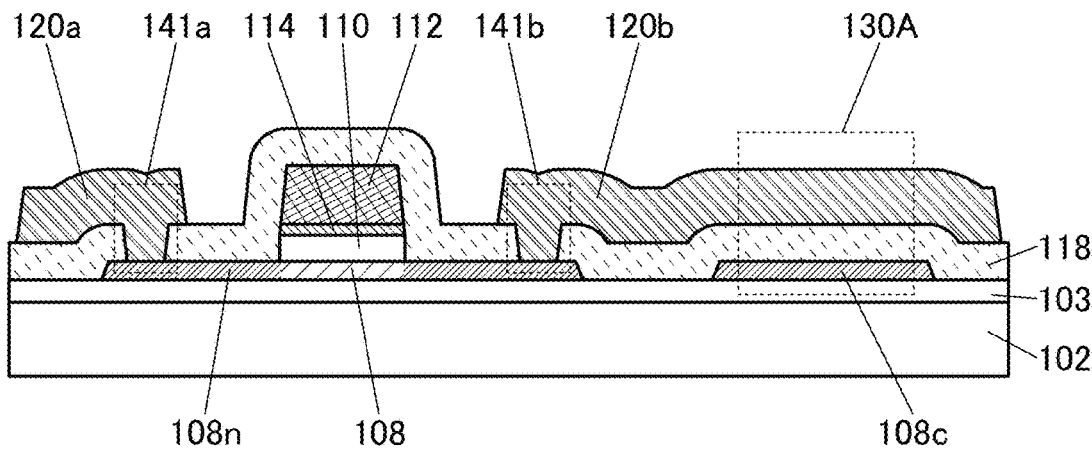
FIGS. 8A-8C Structure examples of transistors.

In a cross-sectional view illustrated in FIG. 8(A), a capacitor 130A is provided next to the transistor 100 described in Structure example 1.

Figure 8B:
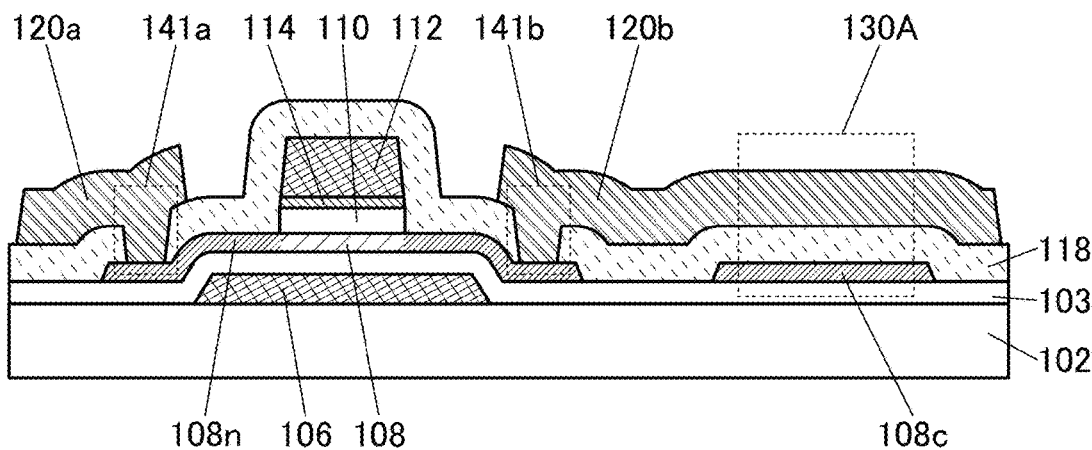

In addition, in a cross-sectional view illustrated in FIG. 8(B), the capacitor 130A is provided next to the transistor 100D described in Structure example 3.

The capacitor 130A has a structure in which the insulating layer 110 and the insulating layer 118 that serve as a dielectric are provided between a semiconductor layer 108*c* and the conductive layer 120*b*.

The semiconductor layer 108*c* is provided on the same plane as the semiconductor layer 108. For example, the semiconductor layer 108*c* can be formed in such a manner that the same metal oxide film as that for the semiconductor layer 108 is processed and the same impurity element as that for the region 108*n* is then added.

With such a structure, the capacitor 130A can be manufactured without an increase in the number of steps.

Figure 8C:
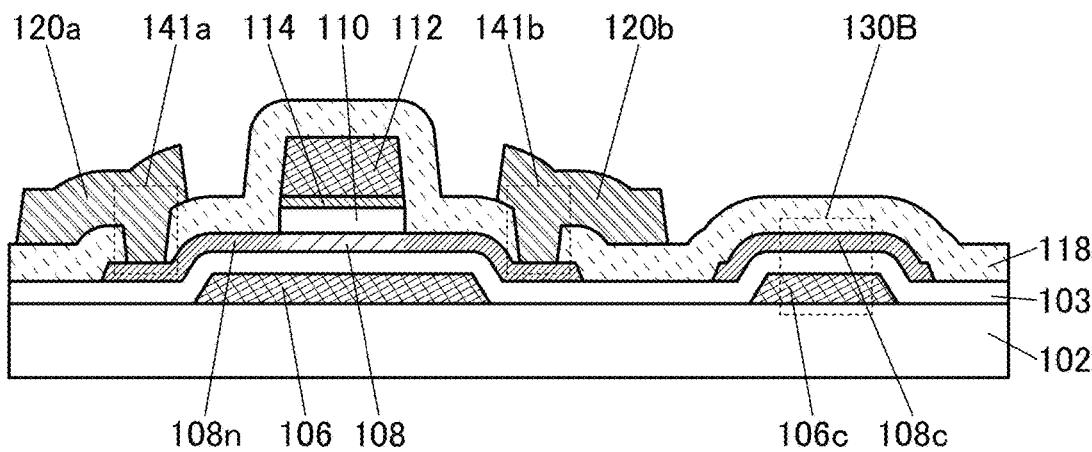

A capacitor 130B illustrated in FIG. 8(C) has a structure in which the insulating layer 103 serving as a dielectric is provided between a conductive layer 106*c* and the semiconductor layer 108*c*.

The conductive layer 106*c* is provided on the same plane as the conductive layer 106. The conductive layer 106*c* can be formed by processing the same conductive film as that for the conductive layer 106.

The capacitor 130B can have a thinner dielectric than the capacitor 130A and thus can have higher capacitance.

The above is the description of the application example.

<Components of Semiconductor Device>

Next, components of the semiconductor device in this embodiment will be described in detail.

[Substrate]

Although there is no particular limitation on a material and the like of the substrate 102, it is necessary that the substrate have heat resistance high enough to withstand at least heat treatment performed later. For example, a single crystal semiconductor substrate or a polycrystalline semiconductor substrate including silicon or silicon carbide as a material, a compound semiconductor substrate of silicon germanium or the like, an SOI substrate, a glass substrate, a ceramic substrate, a quartz substrate, a sapphire substrate, or the like may be used as the substrate 102. Alternatively, these substrates provided with semiconductor elements may be used as the substrate 102.

Alternatively, a flexible substrate may be used as the substrate 102, and the transistor 100 or the like may be formed directly on the flexible substrate. Alternatively, a separation layer may be provided between the substrate 102 and the transistor 100 or the like. The separation layer can be used in separating a semiconductor device from the substrate 102 after partly or wholly completing the semiconductor device over the separation layer, and in transferring the separated semiconductor device to another substrate. In such a case, the transistor 100 or the like can be transferred onto a substrate having low heat resistance or a flexible substrate as well.

[Insulating Layer 103]

The insulating layer 103 can be formed by a sputtering method, a CVD method, an evaporation method, a pulsed laser deposition (PLD) method, or the like as appropriate. In addition, for example, the insulating layer 103 can be formed to have a single layer or stacked layers of an oxide insulating film or a nitride insulating film. Note that to improve the properties of the interface with the semiconductor layer 108, at least a region in the insulating layer 103 that is in contact with the semiconductor layer 108 is preferably formed using an oxide insulating film. Furthermore, a film from which oxygen is released by heating is preferably used for the insulating layer 103.

For example, the insulating layer 103 can be provided to have a single layer or stacked layers using silicon oxide, silicon oxynitride, silicon nitride oxide, silicon nitride, aluminum oxide, hafnium oxide, gallium oxide, a Ga—Zn oxide, or the like.

In addition, in the case where a film other than an oxide film, such as a silicon nitride film, is used for a side of the insulating layer 103 that is in contact with the semiconductor layer 108, pretreatment such as oxygen plasma treatment is preferably performed on a surface in contact with the semiconductor layer 108 to oxidize the surface or the vicinity of the surface.

[Conductive Film]

The conductive layer 112 and the conductive layer 106 that function as the gate electrode, the conductive layer 120a that functions as the source electrode, and the conductive layer 120b that functions as the drain electrode can each be formed using a metal element selected from chromium, copper, aluminum, gold, silver, zinc, molybdenum, tantalum, titanium, tungsten, manganese, nickel, iron, or cobalt; an alloy containing the metal element as its component; an alloy including a combination of the metal elements; or the like.

An oxide conductor or a metal oxide film such as an In—Sn oxide, an In—W oxide, an In—W—Zn oxide, an In—Ti oxide, an In—Ti—Sn oxide, an In—Zn oxide, an In—Sn—Si oxide, or an In—Ga—Zn oxide can also be used for each of the conductive layer 112, the conductive layer 106, the conductive layer 120a, and the conductive layer 120b.

Here, an oxide conductor (OC) is described. For example, when oxygen vacancies are formed in a metal oxide having semiconductor characteristics and hydrogen is added to the oxygen vacancies, a donor level is formed in the vicinity of the conduction band. As a result, the conductivity of the metal oxide is increased, so that the metal oxide becomes a conductor. The metal oxide having become a conductor can be referred to as an oxide conductor.

In addition, the conductive layer 112 or the like may have a stacked-layer structure of a conductive film containing the oxide conductor (the metal oxide) and a conductive film containing a metal or an alloy. The use of a conductive film containing a metal or an alloy can reduce wiring resistance. In that case, a conductive film containing an oxide conductor is preferably used as the conductive film on the side in contact with the insulating layer functioning as a gate insulating film.

Furthermore, among the above metal elements, it is particularly preferable that any one or more metal elements selected from titanium, tungsten, tantalum, and molybdenum be included in the conductive layer 112, the conductive layer 106, the conductive layer 120a, and the conductive layer 120b. It is particularly preferable to use a tantalum nitride film. The tantalum nitride film has conductivity, has a high barrier property against copper, oxygen, or hydrogen, and releases little hydrogen from itself; thus, the tantalum nitride film can be suitably used as a conductive film that is in contact with the semiconductor layer 108 or a conductive film that is in the vicinity of the semiconductor layer 108.

[Insulating Layer 110]

The insulating layer 110 functioning as a gate insulating film of the transistor 100 or the like can be formed by a PECVD method, a sputtering method, or the like. As the insulating layer 110, an insulating layer including one or more kinds of a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film can be used. Note that the insulating layer 110 may have a stacked-layer structure of two layers or a stacked-layer structure of three or more layers.

In addition, the insulating layer 110 that is in contact with the semiconductor layer 108 is preferably an oxide insulating film and further preferably includes a region containing oxygen in excess of that in the stoichiometric composition. In other words, the insulating layer 110 is an insulating film capable of releasing oxygen. It is also possible to supply oxygen into the insulating layer 110 by forming the insulating layer 110 in an oxygen atmosphere, performing heat treatment, plasma treatment, or the like on the deposited insulating layer 110 in an oxygen atmosphere, or depositing an oxide film over the insulating layer 110 in an oxygen atmosphere, for example.

For the insulating layer 110, a material having a higher relative permittivity than silicon oxide or silicon oxynitride, such as hafnium oxide, can also be used. In that case, the insulating layer 110 can be thick and leakage current due to tunnel current can be inhibited. In particular, hafnium oxide having crystallinity is preferable because it has a higher relative permittivity than amorphous hafnium oxide.

[Semiconductor Layer]

In the case where the semiconductor layer 108 is an In-M-Zn oxide, a sputtering target used for depositing the In-M-Zn oxide preferably has the atomic proportion of In higher than or equal to the atomic proportion of M. Examples of the atomic ratio of metal elements in such a sputtering target includes In:M:Zn=1:1:1, In:M:Zn=1:1:1.2, In:M:Zn=2:1:3, In:M:Zn=3:1:2, In:M:Zn=4:2:3, In:M:Zn=4:2:4.1, In:M:Zn=5:1:6, In:M:Zn=5:1:7, In:M:Zn=5:1:8, In:M:Zn=6:1:6, and In:M:Zn=5:2:5.

In addition, a target containing a polycrystalline oxide is preferably used as the sputtering target, which facilitates formation of the semiconductor layer 108 having crystallinity. Note that the atomic ratio in the semiconductor layer 108 to be deposited varies within the range of +40% from the atomic ratio of the metal elements contained in the sputtering target. For example, in the case where the composition of a sputtering target used for the semiconductor layer 108 is In:Ga:Zn=4:2:4.1 [atomic ratio], the composition of the semiconductor layer 108 to be deposited is in the neighborhood of In:Ga:Zn=4:2:3 [atomic ratio] in some cases.

Note that when the atomic ratio is described as In:Ga:Zn=4:2:3 or as being in the neighborhood thereof, the case is included where the atomic proportion of Ga is greater than or equal to 1 and less than or equal to 3 and the atomic proportion of Zn is greater than or equal to 2 and less than or equal to 4 with the atomic proportion of In being 4. In addition, when the atomic ratio is described as In:Ga:Zn=5:1:6 or as being in the neighborhood thereof, the case is included where the atomic proportion of Ga is greater than 0.1 and less than or equal to 2 and the atomic proportion of Zn is greater than or equal to 5 and less than or equal to 7 with the atomic proportion of In being 5. Furthermore, when the atomic ratio is described as In:Ga:Zn=1:1:1 or as being in the neighborhood thereof, the case is included where the atomic proportion of Ga is greater than 0.1 and less than or equal to 2 and the atomic proportion of Zn is greater than 0.1 and less than or equal to 2 with the atomic proportion of In being 1.

In addition, the energy gap of the semiconductor layer 108 is greater than or equal to 2 eV, preferably greater than or equal to 2.5 eV. With the use of such a metal oxide having a wider energy gap than silicon, the off-state current of the transistor can be reduced.

Furthermore, the semiconductor layer 108 preferably has a non-single-crystal structure. Examples of the non-single-crystal structure include a CAAC structure to be described later, a polycrystalline structure, a microcrystalline structure, and an amorphous structure. Among the non-single-crystal structures, the amorphous structure has the highest density of defect states, whereas the CAAC structure has the lowest density of defect states.

A CAAC (c-axis aligned crystal) will be described below. A CAAC refers to an example of a crystal structure.

The CAAC structure is a crystal structure of a thin film or the like that has a plurality of nanocrystals (crystal regions having a maximum diameter of less than 10 nm), characterized in that the nanocrystals each have c-axis alignment in a particular direction, the nanocrystals each have neither a-axis alignment nor b-axis alignment, and the nanocrystals have continuous crystal connection in the a-axis and b-axis directions without forming a grain boundary. In particular, a thin film having the CAAC structure is characterized in that the c-axes of nanocrystals are likely to be aligned in a film thickness direction, a normal direction of a surface where the thin film is formed, or a normal direction of a surface of the thin film.

A CAAC-OS (Oxide Semiconductor) is an oxide semiconductor with high crystallinity. Meanwhile, in the CAAC-OS, it can be said that a reduction in electron mobility due to the crystal grain boundary is less likely to occur because a clear crystal grain boundary cannot be observed. Furthermore, the mixing of impurities, formation of defects, or the like might decrease the crystallinity of the oxide semiconductor; thus, it can also be said that the CAAC-OS is an oxide semiconductor having small amounts of impurities and defects (oxygen vacancies or the like). Thus, an oxide semiconductor including a CAAC-OS is physically stable. Therefore, the oxide semiconductor including a CAAC-OS is resistant to heat and has high reliability.

Here, in crystallography, in a unit cell formed with three axes (crystal axes) of the a-axis, the b-axis, and the c-axis, a specific axis is generally taken as the c-axis. In particular, in the case of a crystal having a layered structure, two axes parallel to the plane direction of a layer are regarded as the a-axis and the b-axis and an axis intersecting with the layer is regarded as the c-axis in general. Typical examples of such a crystal having a layered structure include graphite, which is classified as a hexagonal system. In a unit cell of graphite, the a-axis and the b-axis are parallel to a cleavage plane and the c-axis is orthogonal to the cleavage plane. For example, an $InGaZnO_4$ crystal having a $YbFe_2O_4$ type crystal structure, which is a layered structure, can be classified as a hexagonal system, and in a unit cell thereof, the a-axis and the b-axis are parallel to the plane direction of a layer and the c-axis is orthogonal to the layer (i.e., the a-axis and the b-axis).

In an image observed with a TEM, crystal parts cannot be found clearly in an oxide semiconductor film having a microcrystalline structure (a microcrystalline oxide semiconductor film) in some cases. In most cases, the size of a crystal part included in the microcrystalline oxide semiconductor film is greater than or equal to 1 nm and less than or equal to 100 nm, or greater than or equal to 1 nm and less than or equal to 10 nm. In particular, an oxide semiconductor film including a nanocrystal (nc) that is a microcrystal with a size greater than or equal to 1 nm and less than or equal to 10 nm, or greater than or equal to 1 nm and less than or equal to 3 nm is referred to as an nc-OS (nanocrystalline Oxide Semiconductor) film. In an image observed with a TEM, for example, a crystal grain boundary cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different crystal parts in the nc-OS film. Thus, the orientation in the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the size of a crystal part, a peak that shows a crystal plane does not appear. Furthermore, a diffraction pattern like a halo pattern is observed when the nc-OS film is subjected to electron diffraction (also referred to as selected-area electron diffraction) using an electron beam with a probe diameter (e.g., 50 nm or larger) that is larger than the size of a crystal part. Meanwhile, in some cases, a circular (ring-like) region with high luminance is observed when electron diffraction (also referred to as nanobeam electron diffraction) using an electron beam with a probe diameter (e.g., 1 nm or larger and 30 nm or smaller) close to or smaller than the size of a crystal part is performed on the nc-OS film, and a plurality of spots are observed in the ring-like region.

The nc-OS film has a lower density of defect states than an amorphous oxide semiconductor film. Note that there is no regularity of crystal orientation between different crystal parts in the nc-OS film. Thus, the nc-OS film has a higher density of defect states than the CAAC-OS film. Accordingly, the nc-OS film has a higher carrier density and higher electron mobility than the CAAC-OS film in some cases. Therefore, a transistor including the nc-OS film may have high field-effect mobility.

The nc-OS film can be formed at a lower oxygen flow rate ratio in deposition than the CAAC-OS film. The nc-OS film can also be formed at a lower substrate temperature in deposition than the CAAC-OS film. For example, the nc-OS film can be formed at a relatively low substrate temperature (e.g., a temperature of 130° C. or lower) or without heating of the substrate and thus is suitable for a large glass substrate, a resin substrate, or the like, and productivity can be increased.

An example of a crystal structure of a metal oxide is described. Note that a metal oxide formed by a sputtering method using an In—Ga—Zn oxide target (In:Ga:Zn=4:2:4.1 [atomic ratio]) is described below as an example. A metal oxide that is formed by a sputtering method using the above target at a substrate temperature higher than or equal to 100° C. and lower than or equal to 130° C. is likely to have either the nc (nano crystal) structure or the CAAC structure, or a structure in which both structures are mixed. By contrast, a metal oxide formed by a sputtering method at a substrate temperature set at room temperature (R.T.) is likely to have the nc structure. Note that room temperature (R.T.) here also includes a temperature in the case where a substrate is not heated.

[Composition of Metal Oxide]

The composition of a CAC (Cloud-Aligned Composite)-OS that can be used in a transistor disclosed in one embodiment of the present invention will be described below.

Note that in this specification and the like, CAAC (c-axis aligned crystal) or CAC (Cloud-Aligned Composite) might be stated. Note that CAAC refers to an example of a crystal structure, and CAC refers to an example of a function or a material composition.

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in an active layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

Furthermore, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, the conductive regions are observed to be coupled in a cloud-like manner with their boundaries blurred, in some cases.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in an on state of the transistor, that is, a high on-state current and high field-effect mobility can be obtained.

In other words, the CAC-OS or the CAC-metal oxide can also be referred to as a matrix composite or a metal matrix composite.

The above is the description of the components.

Manufacturing Method Example 1

A manufacturing method example of a transistor of one embodiment of the present invention will be described below. Here, description will be made giving, as an example, the transistor 100D described in Structure example 3.

Note that thin films (insulating films, semiconductor films, conductive films, and the like) that constitute the semiconductor device can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD) method and a thermal CVD method. In addition, as an example of the thermal CVD method, a metal organic chemical vapor deposition (MOCVD) method can be given.

Alternatively, the thin films (the insulating films, the semiconductor films, the conductive films, and the like) that constitute the semiconductor device can be formed by a method such as spin coating, dipping, spray coating, ink-jetting, dispensing, screen printing, offset printing, a doctor knife, slit coating, roll coating, curtain coating, or knife coating.

In addition, when the thin films that constitute the semiconductor device are processed, a photolithography method or the like can be used for the processing. Alternatively, the thin films may be processed by a nanoimprinting method, a sandblasting method, a lift-off method, or the like. Alternatively, island-shaped thin films may be directly formed by a deposition method using a blocking mask such as a metal mask.

There are the following two typical ways of a photolithography method. One is a method in which a resist mask is formed over a thin film that is to be processed, the thin film is processed by etching or the like, and the resist mask is removed. The other is a method in which, after a photosensitive thin film is deposited, exposure and development are performed to process the thin film into a desired shape.

As light for exposure in a photolithography method, for example, an i-line (with a wavelength of 365 nm), a g-line (with a wavelength of 436 nm), an h-line (with a wavelength of 405 nm), or light in which the i-line, the g-line, and the h-line are mixed can be used. Alternatively, ultraviolet light, KrF laser light, ArF laser light, or the like can be used. In addition, exposure may be performed by liquid immersion exposure technique. Furthermore, as the light for the exposure, extreme ultra-violet light (EUV: Extreme Ultra-violet) or X-rays may be used. Moreover, instead of the light for the exposure, an electron beam can also be used. It is preferable to use extreme ultra-violet light, X-rays, or an electron beam because extremely minute processing can be performed. Note that in the case of performing exposure by scanning of a beam such as an electron beam, a photomask is unnecessary.

For etching of the thin films, a dry etching method, a wet etching method, a sandblasting method, or the like can be used.

In each of drawings shown in FIG. 9 and FIG. 10, cross sections of the transistor 100D in the channel length direction and in the channel width direction in each step in the manufacturing process are shown side by side.

[Formation of Conductive Layer 106]

A conductive film is deposited over the substrate 102 and processed by etching to form the conductive layer 106 functioning as a gate electrode.

[Formation of Insulating Layer 103]

Figure 9A:
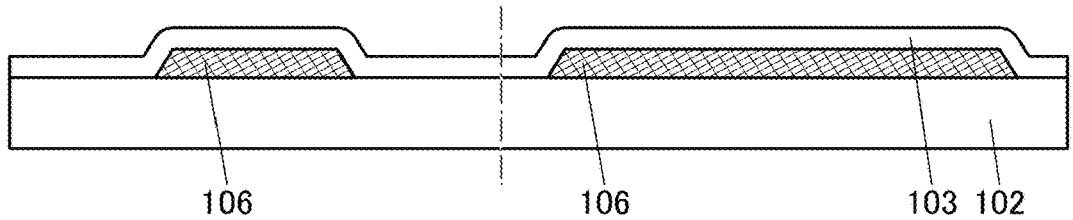
FIGS. 9A-9E Diagrams illustrating a method for manufacturing a transistor.

Then, the insulating layer 103 is formed to cover the substrate 102 and the conductive layer 106 (FIG. 9(A)). The insulating layer 103 can be formed by a PECVD method, an ALD method, a sputtering method, or the like.

After the insulating layer 103 is formed, treatment for supplying oxygen to the insulating layer 103 may be performed. For example, plasma treatment, heat treatment, or the like in an oxygen atmosphere can be performed. Alternatively, oxygen may be supplied to the insulating layer 103 by a plasma ion doping method or an ion implantation method.

[Formation of Semiconductor Layer 108]

Figure 9B:
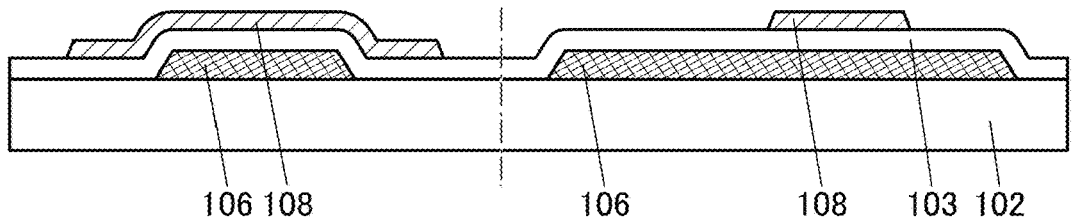

Next, a metal oxide film is deposited over the insulating layer 103 and processed to form the island-shaped semiconductor layer 108 (FIG. 9(B)).

The metal oxide film is preferably formed by a sputtering method using a metal oxide target.

In addition, in depositing the metal oxide film, an inert gas (such as a helium gas, an argon gas, or a xenon gas) may be mixed in addition to an oxygen gas. Note that when the proportion of the oxygen gas in the whole deposition gas (hereinafter also referred to as an oxygen flow rate ratio) at the time of depositing the metal oxide film is higher, the crystallinity of the metal oxide film can be higher and a transistor with high reliability can be achieved. In contrast, when the oxygen flow rate ratio is lower, the crystallinity of the metal oxide film is lower and a transistor with a high on-state current can be obtained.

In addition, as deposition conditions of the metal oxide film, the substrate temperature is higher than or equal to room temperature and lower than or equal to 200° C., and the substrate temperature is preferably higher than or equal to room temperature and lower than or equal to 140° C. For example, when the deposition temperature is higher than or equal to room temperature and lower than 140° C., high productivity is achieved, which is preferable. Furthermore, when the metal oxide film is deposited with the substrate temperature set at room temperature or without heating, the crystallinity can be made low.

In addition, it is preferable to perform treatment for desorbing water, hydrogen, a component of an organic substance, or the like adsorbed onto a surface of the insulating layer 103 or treatment for supplying oxygen into the insulating layer 103 before deposition of the metal oxide film. For example, heat treatment can be performed at a temperature higher than or equal to 70° C. and lower than or equal to 200° C. in a reduced-pressure atmosphere. Alternatively, plasma treatment may be performed in an oxygen-containing atmosphere. In addition, when plasma treatment containing a nitrogen monoxide gas is performed, an organic substance on the surface of the insulating layer 103 can be suitably removed. After such treatment, the metal oxide film is preferably deposited successively without exposure of the surface of the insulating layer 103 to the air.

For processing of the metal oxide film, either one or both a wet etching method and a dry etching method is used. At this time, part of the insulating layer 103 that does not overlap with the semiconductor layer 108 is etched and thinned in some cases.

In addition, after the metal oxide film is deposited or processed into the semiconductor layer 108, heat treatment may be performed to remove hydrogen or water in the metal oxide film or the semiconductor layer 108. The temperature of the heat treatment can be typically higher than or equal to 150° C. and lower than the strain point of the substrate, higher than or equal to 250° C. and lower than or equal to 450° C., or higher than or equal to 300° C. and lower than or equal to 450° C.

The heat treatment can be performed in an atmosphere containing a rare gas or nitrogen. Alternatively, heating may be performed in the atmosphere, and then heating may be performed in an oxygen-containing atmosphere. Note that it is preferable that the atmosphere of the heat treatment not contain hydrogen, water, or the like. An electric furnace, an RTA apparatus, or the like can be used for the heat treatment. The use of an RTA apparatus can shorten the heat treatment time.

[Formation of Insulating Film 110f and Metal Oxide Film 114f]

Figure 9C:
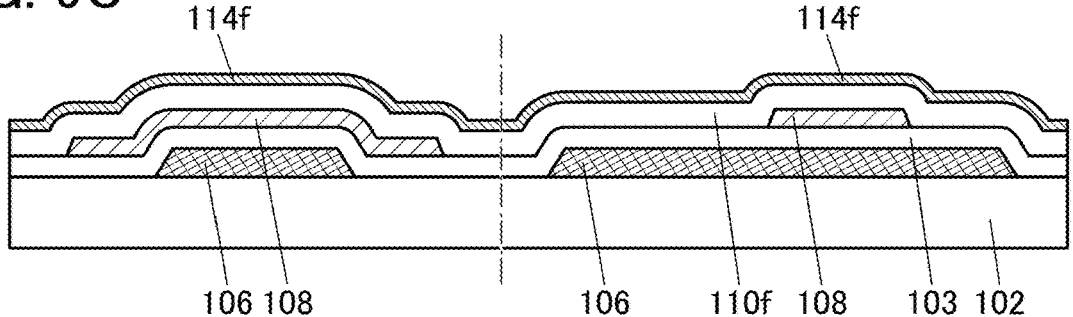

Next, a stack of an insulating film 110f to be the insulating layer 110 and a metal oxide film 114f to be the metal oxide layer 114 is deposited to cover the insulating layer 103 and the semiconductor layer 108 (FIG. 9(C)).

As the insulating film 110f, for example, an oxide film such as a silicon oxide film or a silicon oxynitride film is preferably formed with a plasma-enhanced chemical vapor deposition apparatus (a PECVD apparatus or simply referred to as a plasma CVD apparatus). Alternatively, the insulating film 110f may be formed by a PECVD method using a microwave.

The metal oxide film 114f is preferably deposited in an oxygen-containing atmosphere, for example. It is particularly preferable that the metal oxide film 114f be formed by a sputtering method in an oxygen-containing atmosphere. In that case, oxygen can be supplied to the insulating film 110f at the time of deposition of the metal oxide film 114f.

The above description can be referred to for the case where the metal oxide film 114f is formed by a sputtering method using an oxide target containing a metal oxide as in the case of the semiconductor layer 108.

For example, as deposition conditions of the metal oxide film 114f, a metal oxide film may be formed by a reactive sputtering method with a metal target using oxygen as a deposition gas. When aluminum is used for the metal target, for example, an aluminum oxide film can be deposited.

At the time of depositing the metal oxide film 114f, the amount of oxygen supplied into the insulating film 110f can be increased with a higher proportion of the oxygen flow rate to the total flow rate of the deposition gas introduced into a deposition chamber of a deposition apparatus (a higher oxygen flow rate ratio) or with higher oxygen partial pressure in the deposition chamber. The oxygen flow rate ratio or the oxygen partial pressure is, for example, higher than or equal to 50% and lower than or equal to 100%, preferably higher than or equal to 65% and lower than or equal to 100%, further preferably higher than or equal to 80% and lower than or equal to 100%, still further preferably higher than or equal to 90% and lower than or equal to 100%. It is particularly preferable that the oxygen flow rate ratio be 100% and the oxygen partial pressure be as close to 100% as possible.

When the metal oxide film 114f is formed by a sputtering method in an oxygen-containing atmosphere in this manner, oxygen can be supplied to the insulating film 110f and release of oxygen from the insulating film 110f can be prevented during the deposition of the metal oxide film 114f. As a result, an extremely large amount of oxygen can be enclosed in the insulating film 110f. Moreover, a large amount of oxygen can be supplied to the semiconductor layer 108 by heat treatment performed later. Consequently, the amount of oxygen vacancies in the semiconductor layer 108 can be reduced and a highly reliable transistor can be achieved.

In addition, oxygen may be supplied from the insulating film 110f to the semiconductor layer 108 by heat treatment performed after the formation of the metal oxide film 114f. The heat treatment can be performed at a temperature higher than or equal to 200° C. and lower than or equal to 400° C. in an atmosphere containing one or more of nitrogen, oxygen, and a rare gas.

Then, after the deposition of the metal oxide film 114f, the metal oxide film 114f, the insulating film 110f, and the insulating layer 103 are partly etched to form an opening reaching the conductive layer 106. Accordingly, the conductive layer 112 to be formed later can be electrically connected to the conductive layer 106 through the opening.

[Formation of Insulating Layer 110, Conductive Layer 112, and Metal Oxide Layer 114]

Figure 9D:
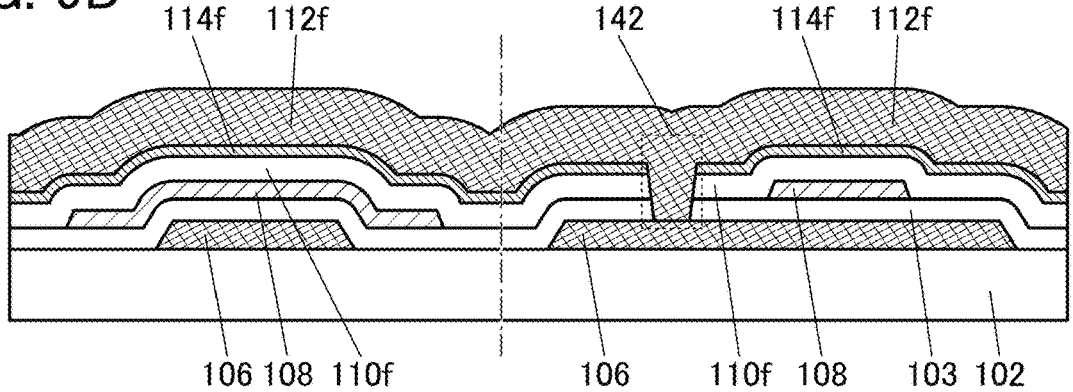

Next, a conductive film 112f to be the conductive layer 112 is deposited over the insulating film 110f and the metal oxide film 114f (FIG. 9(D)). The conductive film 112f is preferably deposited by a sputtering method using a sputtering target of a metal or an alloy.

Figure 9E:
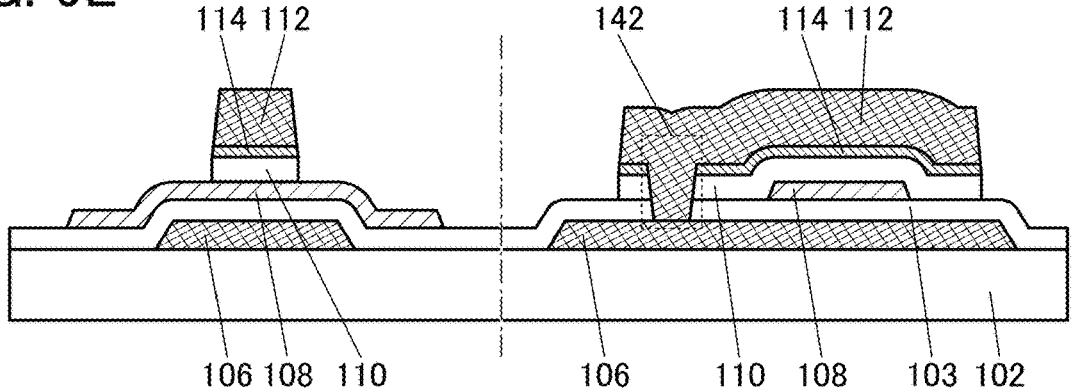

Next, the insulating film 110f, the conductive film 112f, and the metal oxide film 114f are partly etched to form the insulating layer 110, the conductive layer 112, and the metal oxide layer 114 (FIG. 9(E)). The insulating film 110f, the conductive film 112f, and the metal oxide film 114f are preferably processed using the same resist mask. Alternatively, the insulating film 110f and the metal oxide film 114f may be etched using the conductive layer 112 after etching as a hard mask.

In such a manner, the conductive layer 110, the conductive layer 112, and the metal oxide layer 114 that have substantially the same top surface shapes can be formed.

[Formation of Insulating Layer 118]

Figure 10A:
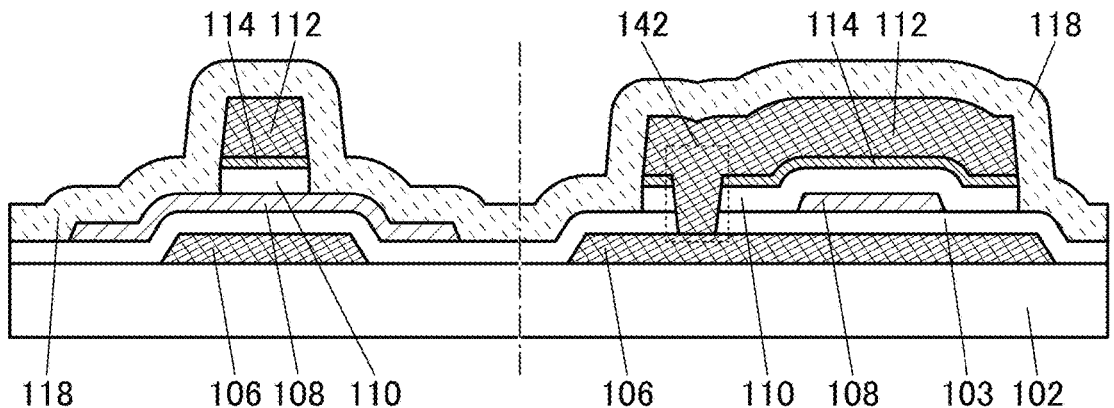
FIGS. 10A-10C Diagrams illustrating a method for manufacturing a transistor.
Figure 10B:
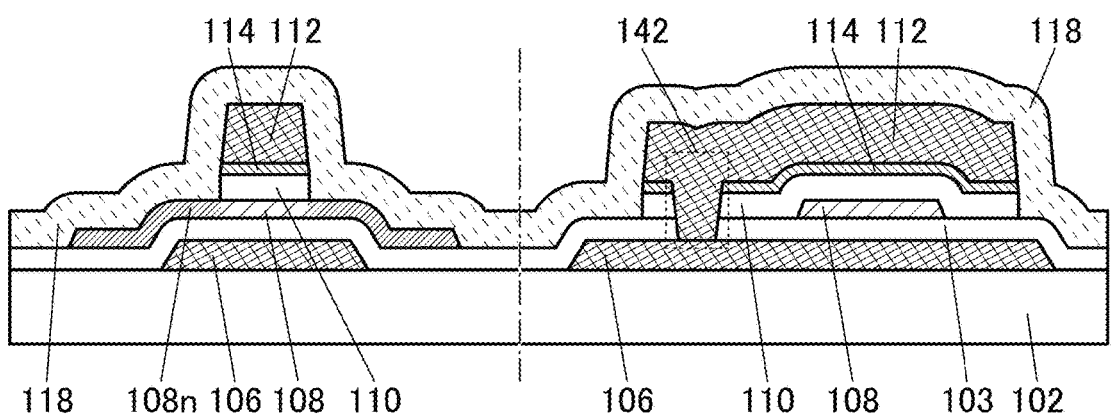

Next, the insulating layer 118 is formed (FIG. 10(A)). The insulating layer 118 can be formed by a CVD method such as a plasma CVD method, a low-pressure CVD method, or an ECRCVD method. As the source gas, a gas containing the impurity element (an impurity element source) can be used.

For example, in the case where silicon oxide containing the impurity element is formed as the insulating layer 118, a silicon source, an oxygen source, and an impurity element source can be used as the source gas. In the case where the insulating layer 118 is formed using silicon oxynitride containing the impurity element, a silicon source, an oxygen source, a nitrogen source, and an impurity element source can be used as the source gas. As the silicon source, organosilane such as TEOS (Tetraethyl orthosilicate), or inorganic silane such as $SiH_4$ (monosilane) or $Si_2H_6$ (disilane) can be used. As the oxygen source, $O_2$, $O_3$, $N_2O$, or the like can be used. As the nitrogen source, $NH_3$, $N_2O$, or the like can be used. Note that $N_2O$ can be used as the oxygen source and the nitrogen source. In the case where phosphorus is used as the impurity element, $PH_3$ (phosphine) or the like can be used as the impurity element source. When boron is used as the impurity element, $B_2H_6$ (diborane) or the like can be used as the impurity element source. A plurality of these impurity element sources may be used.

When the insulating layer 118 is formed using the source gas containing the impurity element source, the whole insulating layer 118 can contain the impurity element. The whole insulating layer 118 contains the impurity element, whereby oxygen contained in the insulating layer 118 can be efficiently inhibited from being released from the insulating layer 118. Furthermore, the concentration of the impurity element in the thickness direction of the insulating layer 118 can be uniform. In the thickness direction of the insulating layer 118, the ratio of the maximum impurity concentration to the minimum impurity concentration is preferably greater than or equal to 1.0 and less than or equal to 10.0, further preferably greater than or equal to 1.0 and less than or equal to 7.0, still further preferably greater than or equal to 1.0 and less than or equal to 5.0, yet still further preferably greater than or equal to 1.0 and less than or equal to 3.0. Furthermore, variation in the concentration of the impurity element in the substrate surface can be reduced. Thus, a semiconductor device having favorable electrical characteristics can be manufactured with high productivity.

When the insulating layer 118 is formed using the source gas containing the impurity element source, the insulating layer 118 containing the impurity element source can be formed over the semiconductor layer 108 while damage to the semiconductor layer 108 is suppressed. Damage to the semiconductor layer 108 at the time of forming the insulating layer 118 is suppressed, so that a decrease in crystallinity of the semiconductor layer 108 can be inhibited. In particular, the crystallinity of the region 108n not overlapping with the conductive layer 112 can be efficiently inhibited from being decreased. Accordingly, a decrease in electrical characteristics of the semiconductor device, which is caused by an increase in electrical resistance of the region 108n due to a reduction in crystallinity, can be inhibited. The semiconductor layer 108 in the region overlapping with the conductive layer 112 and the region 108n not overlapping with the conductive layer 112 have crystallinity, and both can have the same degree of crystallinity.

Note that by using a plasma CVD method for forming the insulating layer 118, oxygen vacancies ($V_O$) can be formed efficiently in the semiconductor layer 108. In the case where the insulating layer 118 is formed by a plasma CVD method at a deposition temperature too high, the impurity contained in the region 108n and the like might be diffused into a peripheral portion including the channel formation region of the semiconductor layer 108 or might increase the electrical resistance of the region 108n. The deposition temperature of the insulating layer 118 is preferably higher than or equal to 150° C. and lower than or equal to 400° C., further preferably higher than or equal to 180° C. and lower than or equal to 360° C., still further preferably higher than or equal to 200° C. and lower than or equal to 250° C., for example. Deposition of the insulating layer 118 at low temperatures enables the transistor to have favorable electrical characteristics even when it has a short channel length.

In addition, at the stage of forming the insulating layer 118, a region of the semiconductor layer 108 in contact with the insulating layer 118 contains the impurity element in some cases.

Next, a method for forming the insulating layer 118, which is different from the above, is described.

The insulating layer 118 can also be formed in such a manner that, after an insulating layer to be the insulating layer 118 is formed, the insulating layer is subjected to treatment for supplying (adding or injecting) the impurity element. The insulating layer to be the insulating layer 118 can be formed using an oxide not containing the impurity element. The insulating layer to be the insulating layer 118 may be formed using an oxide containing the impurity element.

The insulating layer to be the insulating layer 118 can be formed by a CVD method such as a plasma CVD method, a low-pressure CVD method, or an ECRCVD method. For example, in the case where silicon oxide is formed as the insulating layer to be the insulating layer 118, a silicon source and an oxygen source can be used as the source gas. In the case where silicon oxynitride is formed as the insulating layer to be the insulating layer 118, a silicon source, an oxygen source, and a nitrogen source can be used as the source gas.

A plasma ion doping method or an ion implantation method can be suitably used for the supply of the impurity element to the insulating layer to be the insulating layer 118. In these methods, the concentration profile in the depth direction can be controlled with high accuracy by the acceleration voltage and the dosage of ions, or the like. The use of a plasma ion doping method can increase productivity. In addition, the use of an ion implantation method with mass separation can increase the purity of an impurity element to be supplied.

It is preferable to control treatment conditions for the treatment for supplying the impurity element such that the insulating layer to be the insulating layer 118 has the highest concentration of the impurity element. Accordingly, treatment at a low acceleration voltage can be performed, which results in an improvement in productivity.

As the source gas of the impurity element supplied to the insulating layer to be the insulating layer 118, a gas containing the above impurity element can be used. In the case where boron is supplied, typically, a $B_2H_6$ gas, a $BF_3$ gas, or the like can be used. In the case where phosphorus is supplied, typically, a $PH_3$ gas can be used. A mixed gas in which any of these source gases is diluted with a rare gas may be used.

Besides, any of $CH_4$, $N_2$, $NH_3$, $AlH_3$, $AlCl_3$, $SiH_4$, $Si_2H_6$, $F_2$, HF, $H_2$, $(C_5H_5)_2Mg$, a rare gas, and the like can be used as the source gas. In addition, an ion source is not limited to a gas, and a solid or a liquid that is vaporized by heating may be used.

Supply of the impurity element can be controlled by setting the conditions such as the accelerating voltage and the dosage in consideration of the composition, the density, the thickness, or the like of the insulating layer to be the insulating layer 118.

For example, in the case where boron is added by an ion implantation method or a plasma ion doping method, the acceleration voltage can be, for example, within the range of higher than or equal to 5 kV to lower than or equal to 100 kV, preferably higher than or equal to 7 kV to lower than or equal to 70 kV, further preferably higher than or equal to 10 kV to lower than or equal to 50 kV. In addition, the dosage can be, for example, within the range of greater than or equal to $1\times10^{13}$ ions/cm$^2$ to less than or equal to $1\times10^{17}$ ions/cm$^2$, preferably greater than or equal to $1\times10^{14}$ ions/cm$^2$ to less than or equal to $5\times10^{16}$ ions/cm$^2$, further preferably greater than or equal to $1\times10^{15}$ ions/cm$^2$ to less than or equal to $3\times10^{16}$ ions/cm$^2$.

In addition, in the case where phosphorus is added by an ion implantation method or a plasma ion doping method, the acceleration voltage can be, for example, within the range of higher than or equal to 10 kV to lower than or equal to 100 kV, preferably higher than or equal to 30 kV to lower than or equal to 90 kV, further preferably higher than or equal to 40 kV to lower than or equal to 80 kV. In addition, the dosage can be, for example, within the range of greater than or equal to $1\times10^{13}$ ions/cm$^2$ to less than or equal to $1\times10^{17}$ ions/cm$^2$, preferably greater than or equal to $1\times10^{14}$ ions/cm$^2$ to less than or equal to $5\times10^{16}$ ions/cm$^2$, further preferably greater than or equal to $1\times10^{15}$ ions/cm$^2$ to less than or equal to $3\times10^{16}$ ions/cm$^2$.

Note that a method for supplying the impurity element is not limited thereto; plasma treatment, treatment using thermal diffusion by heating, or the like may be used, for example. In a plasma treatment method, plasma is generated in a gas atmosphere containing an impurity element to be added and plasma treatment is performed, so that the impurity element can be added. A dry etching apparatus, an ashing apparatus, a plasma CVD apparatus, a high-density plasma CVD apparatus, or the like can be used as an apparatus for generating the plasma.

By controlling the treatment conditions such that the insulating layer to be the insulating layer 118 has the highest concentration of the impurity element, a degradation of crystallinity can be inhibited at the time of supplying the impurity element even when the semiconductor layer 108 has crystallinity. Therefore, this is particularly suitable for the case where a reduction in crystallinity increases electrical resistance.

[Heat Treatment]

After the formation of the insulating layer 118, heat treatment is performed. It is preferable that the heat treatment be performed at a temperature higher than or equal to 150° C. and lower than or equal to 450° C., preferably higher than or equal to 200° C. and lower than or equal to 400° C. in an atmosphere containing one or more of nitrogen, oxygen, and a rare gas. By the heat treatment, $V_OH$ is formed in the semiconductor layer 108, so that the low-resistance region 108n is formed (FIG. 10(B)). For example, by performing heat treatment at the above temperature, the impurity element contained in the insulating layer 118 is diffused and the region 108n and the region 103d that contain the impurity element can be formed. Note that when the temperature of the heat treatment is too high (e.g., higher than or equal to 500° C.), the impurity element might also be diffused into the channel formation region, so that the electrical characteristics and reliability of the transistor might be degraded.

The defects included in the channel formation region of the semiconductor layer 108 and the insulating layer 110 can be repaired by the heat treatment in some cases.

Furthermore, oxygen can be supplied from the insulating layer 110 to the channel formation region of the semiconductor layer 108 by the heat treatment. At this time, since the side surface of the insulating layer 110 is in contact with the insulating layer 118, oxygen is inhibited from being released from the insulating layer 110 to the insulating layer 118 side. As a result, an increase in resistance of the region 108n can be prevented effectively. In addition, at this time, oxygen released from the insulating layer 110 can be selectively supplied to the channel formation region.

In addition, the region 108n is in a state where a larger amount of oxygen vacancies than that in the channel formation region exist; thus, through the heat treatment, an effect of performing gettering of hydrogen contained in the channel formation region by the oxygen vacancies can be expected. Thus, a hydrogen concentration in the channel formation region can be reduced, so that a more reliable transistor can be achieved. Furthermore, hydrogen supplied from the channel formation region is bonded to the oxygen vacancy in the region 108n to serve as a carrier generation source, so that the region 108n that has much lower resistance can be achieved.

[Formation of Opening 141a and Opening 141b]

Next, a mask is formed by lithography in a desired position on the insulating layer 118, and then the insulating layer 118 is partly etched, so that the opening 141a and the opening 141b each reaching the region 108n are formed.

[Formation of Conductive Layer 120a and Conductive Layer 120b]

Figure 10C:
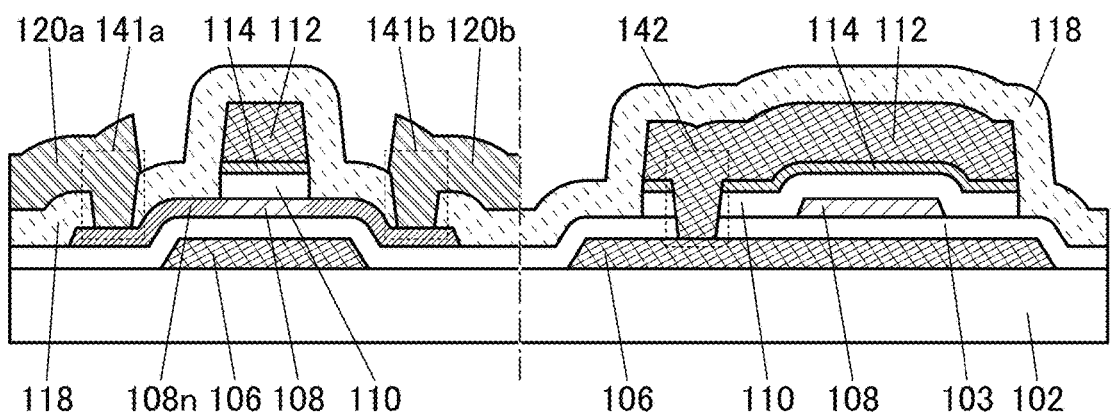

Next, a conductive film is deposited over the insulating layer 118 to cover the opening 141a and the opening 141b, and the conductive film is processed into a desired shape, so that the conductive layer 120a and the conductive layer 120b are formed (FIG. 10(C)).

Through the above steps, the transistor 100D can be manufactured. In the case where the transistor 100D is used for a pixel of a display device, for example, this process may be followed by a process for forming one or more of a protective insulating layer, a planarization layer, a pixel electrode, and a wiring.

The above is the description of Manufacturing method example 1.

Manufacturing Method Example 2

A manufacturing method example of a transistor of one embodiment of the present invention will be described below. Here, description will be made giving, as an example, the transistor 100E described in Structure example 3.

In each of drawings shown in FIG. 11, cross sections of the transistor 100E in the channel length direction and in the channel width direction in each step in the manufacturing process are shown side by side.

The steps up to and including the formation of the conductive film 112f are similar to those in the manufacturing method described in <Manufacturing method example 1>. Thus, the method for manufacturing the transistor in FIG. 9(A) to FIG. 9(D) can be referred to.

[Formation of Insulating Layer 110, Conductive Layer 112, and Metal Oxide Layer 114]

Figure 11A:
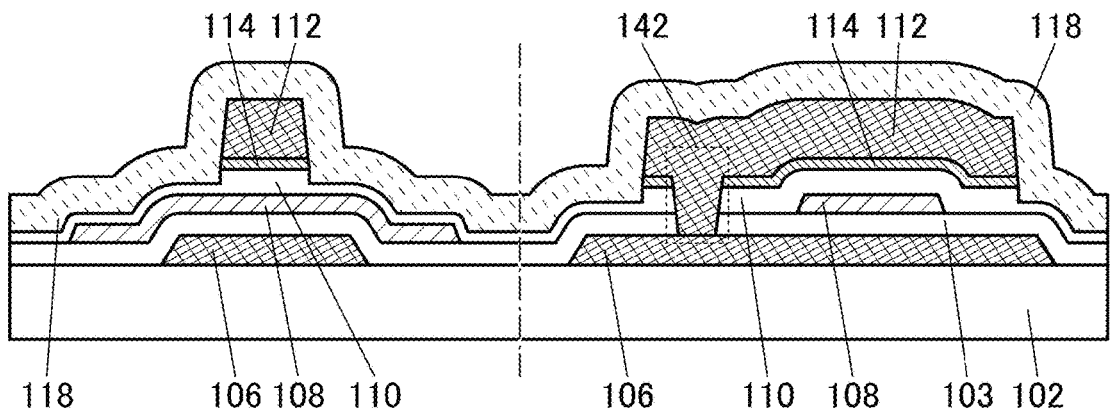
FIGS. 11A-11C Diagrams illustrating a method for manufacturing a transistor.
Figure 11B:
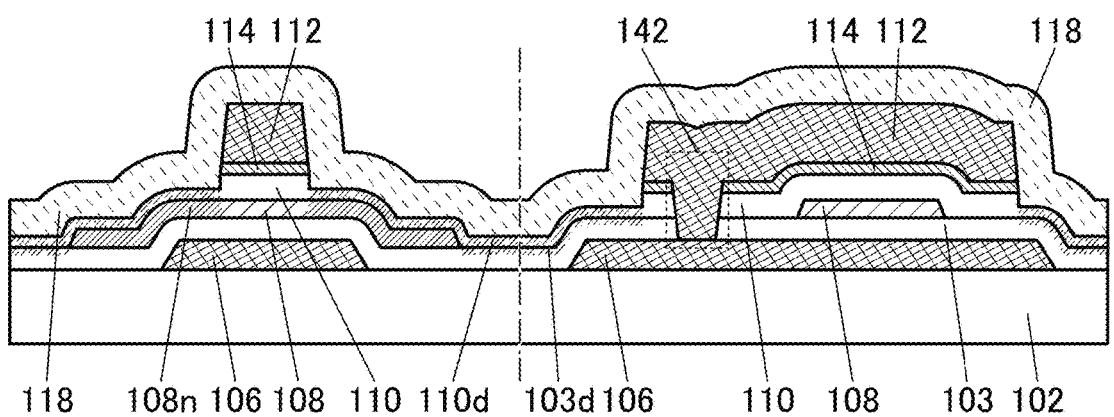

Next, the insulating film 110f, the conductive film 112f, and the metal oxide film 114f are partly etched to form the insulating layer 110, the conductive layer 112, and the metal oxide layer 114 (FIG. 11(A)). Part of the insulating film 110f in the region not overlapping with the conductive layer 112 is left in etching, whereby the insulating layer 110 can be formed to have different thicknesses. When not the whole insulating film 110f in the region not overlapping with the conductive layer 112 is etched and the top surface and the side surface of the semiconductor layer 108 and the insulating layer 103 are covered, it is possible to prevent the semiconductor layer 108 and the insulating layer 103 from being partly etched and thinned in etching the conductive layer 112 or the like.

The insulating film 110f, the conductive film 112f, and the metal oxide film 114f are preferably processed using the same resist mask. Alternatively, the insulating film 110f and the metal oxide film 114f may be etched using the conductive layer 112 after etching as a hard mask.

In such a manner, the conductive layer 112 and the metal oxide layer 114 that have substantially the same top surface shapes can be formed.

[Formation of Insulating Layer 118]

Next, the insulating layer 118 is formed (FIG. 11(A)). The insulating layer 118 can be formed by a CVD method such as a plasma CVD method, a low-pressure CVD method, or an ECRCVD method. As the source gas, a gas containing the impurity element (an impurity element source) can be used. The above description can be referred to for the formation of the insulating layer 118; thus, a detailed description thereof is omitted.

A method for forming the insulating layer 118, which is different from the above, is described.

The insulating layer 118 can also be formed in such a manner that, after an insulating layer to be the insulating layer 118 is formed, the insulating layer is subjected to treatment for supplying (adding or injecting) the impurity element. The insulating layer to be the insulating layer 118 can be formed using an oxide not containing the impurity element. The insulating layer to be the insulating layer 118 can be formed using an oxide containing the impurity element. The insulating layer to be the insulating layer 118 may be formed using an oxide not containing the impurity element.

The above description can be referred to for the formation of the insulating layer to be the insulating layer 118; thus, a detailed description thereof is omitted.

A plasma ion doping method or an ion implantation method can be suitably used for the supply of the impurity element to the insulating layer to be the insulating layer 118. The above description can be referred to for the supply of the impurity element to the insulating layer to be the insulating layer 118; thus, a detailed description thereof is omitted.

For example, in the case where boron is added by an ion implantation method or a plasma ion doping method, the acceleration voltage can be, for example, within the range of higher than or equal to 5 kV to lower than or equal to 100 kV, preferably higher than or equal to 7 kV to lower than or equal to 80 kV, further preferably higher than or equal to 10 kV to lower than or equal to 60 kV. In addition, the dosage can be, for example, within the range of greater than or equal to $1\times10^{13}$ ions/cm$^2$ to less than or equal to $1\times10^{17}$ ions/cm$^2$, preferably greater than or equal to $1\times10^{14}$ ions/cm$^2$ to less than or equal to $5\times10^{16}$ ions/cm$^2$, further preferably greater than or equal to $1\times10^{15}$ ions/cm$^2$ to less than or equal to $3\times10^{16}$ ions/cm$^2$.

In addition, in the case where phosphorus is added by an ion implantation method or a plasma ion doping method, the acceleration voltage can be, for example, within the range of higher than or equal to 10 kV to lower than or equal to 100 kV, preferably higher than or equal to 30 kV to lower than or equal to 100 kV, further preferably higher than or equal to 40 kV to lower than or equal to 100 kV. In addition, the dosage can be, for example, within the range of greater than or equal to $1\times10^{13}$ ions/cm$^2$ to less than or equal to $1\times10^{17}$ ions/cm$^2$, preferably greater than or equal to $1\times10^{14}$ ions/cm$^2$ to less than or equal to $5\times10^{16}$ ions/cm$^2$, further preferably greater than or equal to $1\times10^{15}$ ions/cm$^2$ to less than or equal to $3\times10^{16}$ ions/cm$^2$.

[Heat Treatment]

After the formation of the insulating layer 118, heat treatment is performed. By the heat treatment, the impurity element contained in the insulating layer 118 is diffused into the semiconductor layer 108 through the insulating layer 110. The impurity element diffused into the semiconductor layer 108 is bonded to oxygen contained in the semiconductor layer 108, so that an oxygen vacancy ($V_O$) is formed. The oxygen vacancy ($V_O$) is bonded to hydrogen contained in the semiconductor layer 108 to form $V_O H$, so that the low-resistance region 108n is formed (FIG. 11(B)). The impurity element is also diffused into the insulating layer 103 in contact with the insulating layer 118, so that the region 103d is formed. The above description can be referred to for the heat treatment; thus, a detailed description thereof is omitted.

[Formation of Opening 141a and Opening 141b]

Next, a mask is formed by lithography in a desired position on the insulating layer 118, and then the insulating layer 118 and the insulating layer 110 are partly etched, so that the opening 141a and the opening 141b each reaching the region 108n are formed.

[Formation of Conductive Layer 120a and Conductive Layer 120b]

Figure 11C:
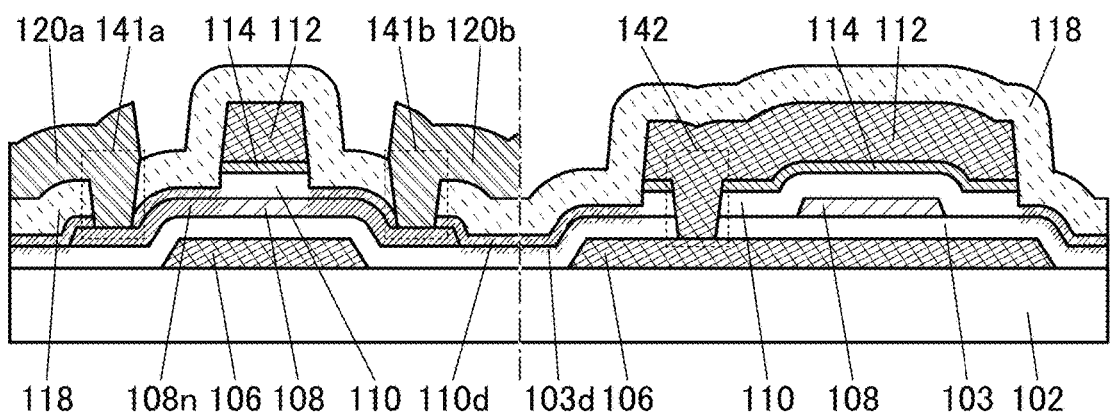

Next, a conductive film is deposited over the insulating layer 118 to cover the opening 141a and the opening 141b, and the conductive film is processed into a desired shape, so that the conductive layer 120a and the conductive layer 120b are formed (FIG. 11(C)).

Through the above steps, the transistor 100E can be manufactured. In the case where the transistor 100E is used for a pixel of a display device, for example, this process may be followed by a process for forming one or more of a protective insulating layer, a planarization layer, a pixel electrode, and a wiring.

The above is the description of Manufacturing method example 2.

At least part of the structure examples, the manufacturing method examples, the drawings corresponding thereto, and the like described in this embodiment can be implemented in combination with the other structure examples, the other manufacturing method examples, the other drawings, and the like as appropriate.

At least part of this embodiment can be implemented in combination with the other embodiments described in this specification as appropriate.

Embodiment 2

In this embodiment, an example of a display device that includes any of the transistors described in the above embodiment will be described.

Structure Example

Figure 12A:
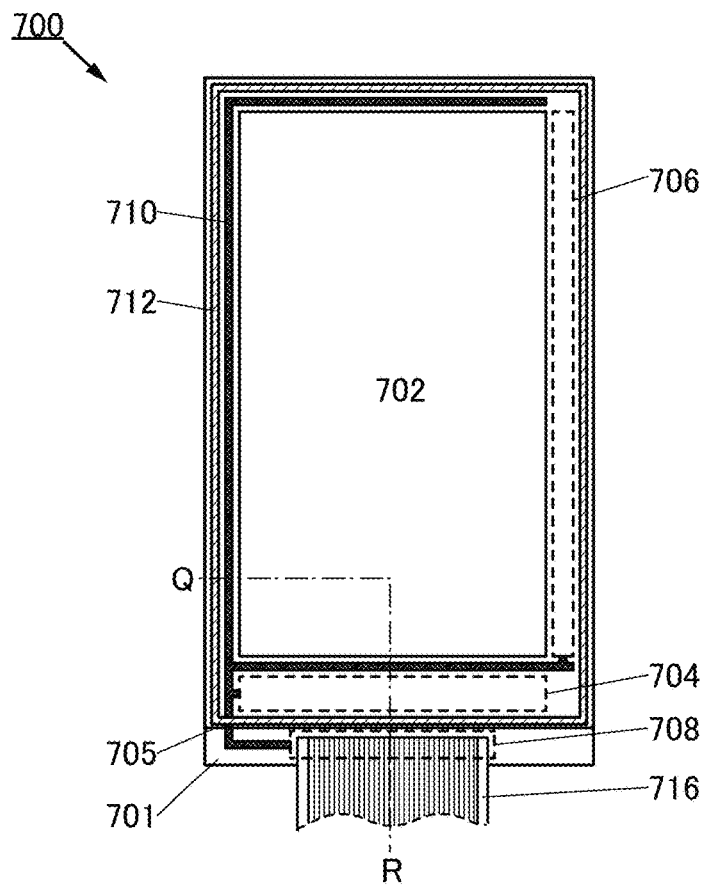
FIGS. 12A-12B Top views of display devices.

FIG. 12(A) is a top view of a display device 700. The display device 700 includes a first substrate 701 and a second substrate 705 that are attached to each other with a sealant 712. In a region sealed with the first substrate 701, the second substrate 705, and the sealant 712, a pixel portion 702, a source driver circuit portion 704, and a gate driver circuit portion 706 are provided over the first substrate 701. In the pixel portion 702, a plurality of display elements are provided.

An FPC terminal portion 708 to which an FPC 716 (FPC: Flexible printed circuit) is connected is provided in a portion of the first substrate 701 that does not overlap with the second substrate 705. The pixel portion 702, the source driver circuit portion 704, and the gate driver circuit portion 706 are each supplied with a variety of signals and the like from the FPC 716 through the FPC terminal portion 708 and a signal line 710.

A plurality of gate driver circuit portions 706 may be provided. The gate driver circuit portion 706 and the source driver circuit portion 704 may be formed separately on semiconductor substrates or the like to obtain packaged IC chips. The IC chips can each be mounted on the first substrate 701 or the FPC 716.

Any of the transistors that are the semiconductor devices of embodiments of the present invention can be used as transistors included in the pixel portion 702, the source driver circuit portion 704, and the gate driver circuit portion 706.

Examples of the display element provided in the pixel portion 702 include a liquid crystal element and a light-emitting element. As the liquid crystal element, a transmissive liquid crystal element, a reflective liquid crystal element, a transflective liquid crystal element, or the like can be used. As the light-emitting element, a self-luminous light-emitting element such as an LED (Light Emitting Diode), an OLED (Organic LED), a QLED (Quantum-dot LED), or a semiconductor laser can be used. It is also possible to use a MEMS (Micro Electro Mechanical Systems) shutter element, an optical interference type MEMS element, or a display element using a microcapsule method, an electrophoretic method, an electrowetting method, an Electronic Liquid Powder (registered trademark) method, or the like, for instance.

Figure 12B:
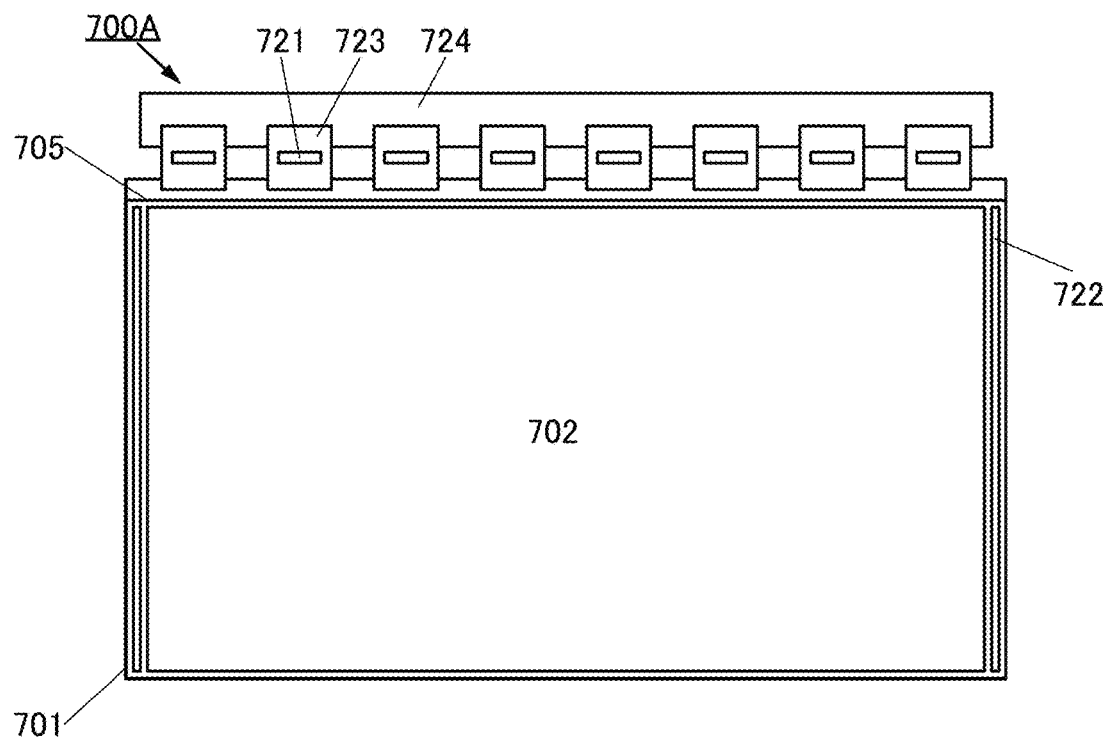

A display device 700A illustrated in FIG. 12(B) is a display device that can be suitably used for an electronic device with a large screen. For example, the display device 700A can be suitably used for a television device, a monitor device, a personal computer (including a laptop type and a desktop type), a tablet terminal, digital signage, or the like.

The display device 700A includes a plurality of source driver ICs 721 and a pair of gate driver circuit portions 722.

The plurality of source driver ICs 721 are attached to respective FPCs 723. In each of the plurality of FPCs 723, one of terminals is connected to the substrate 701, and the other terminal is connected to a printed circuit board 724. By bending the FPCs 723, the printed circuit board 724 can be placed on the back side of the pixel portion 702 so that the display device 700A can be mounted on an electrical device; thus, the electronic device can be downsized.

By contrast, the gate driver circuit portions 722 are provided over the substrate 701. Thus, an electronic device with a narrow bezel can be provided.

With such a structure, a large-size and high-resolution display device can be provided. For example, use in a display device with a screen diagonal of 30 inches or more, 40 inches or more, 50 inches or more, or 60 inches or more is possible. Furthermore, a display device with extremely high resolution such as 4K2K or 8K4K can be provided.

Cross-Sectional Structure Example

Figure 13:
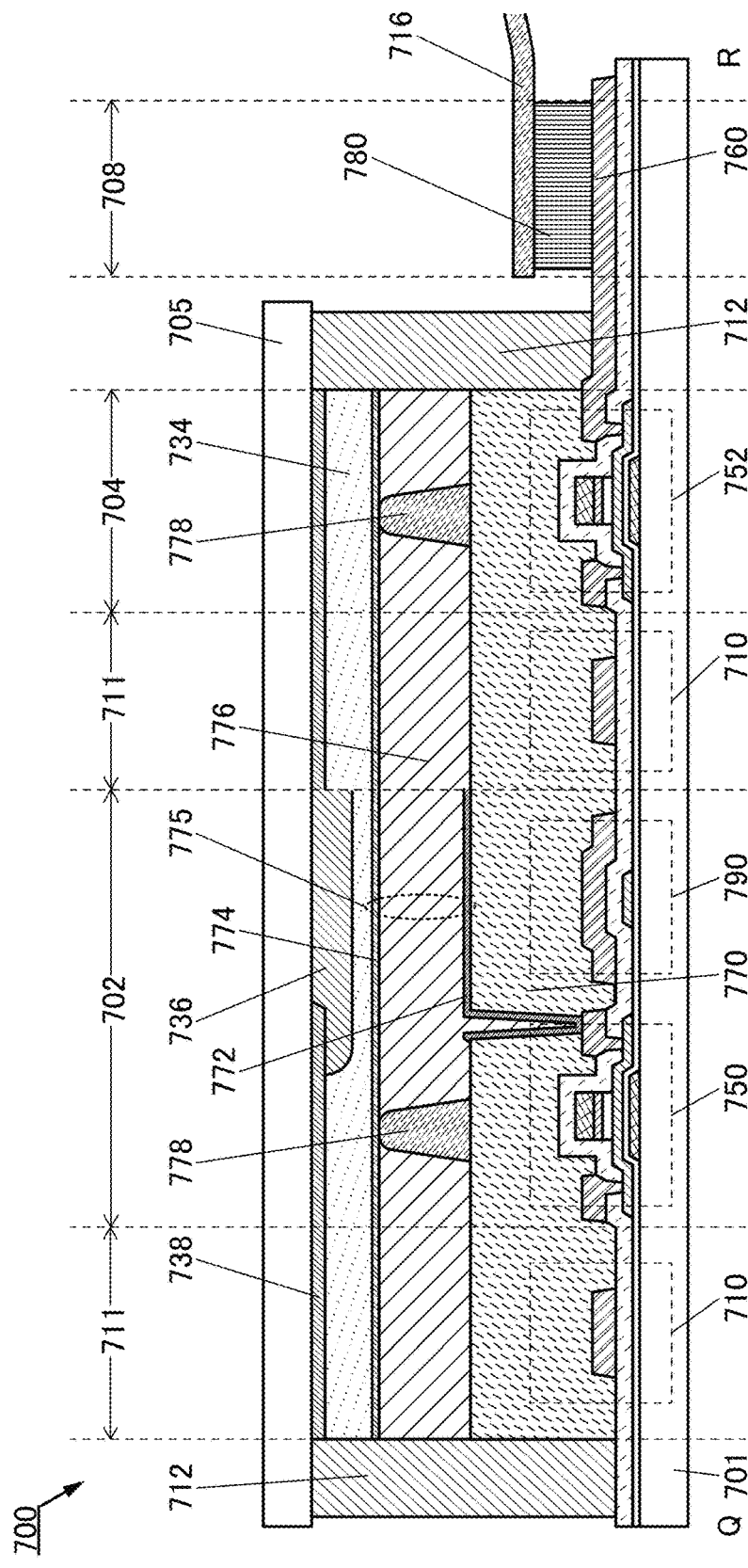
FIG. 13 A cross-sectional view of a display device.
Figure 14:
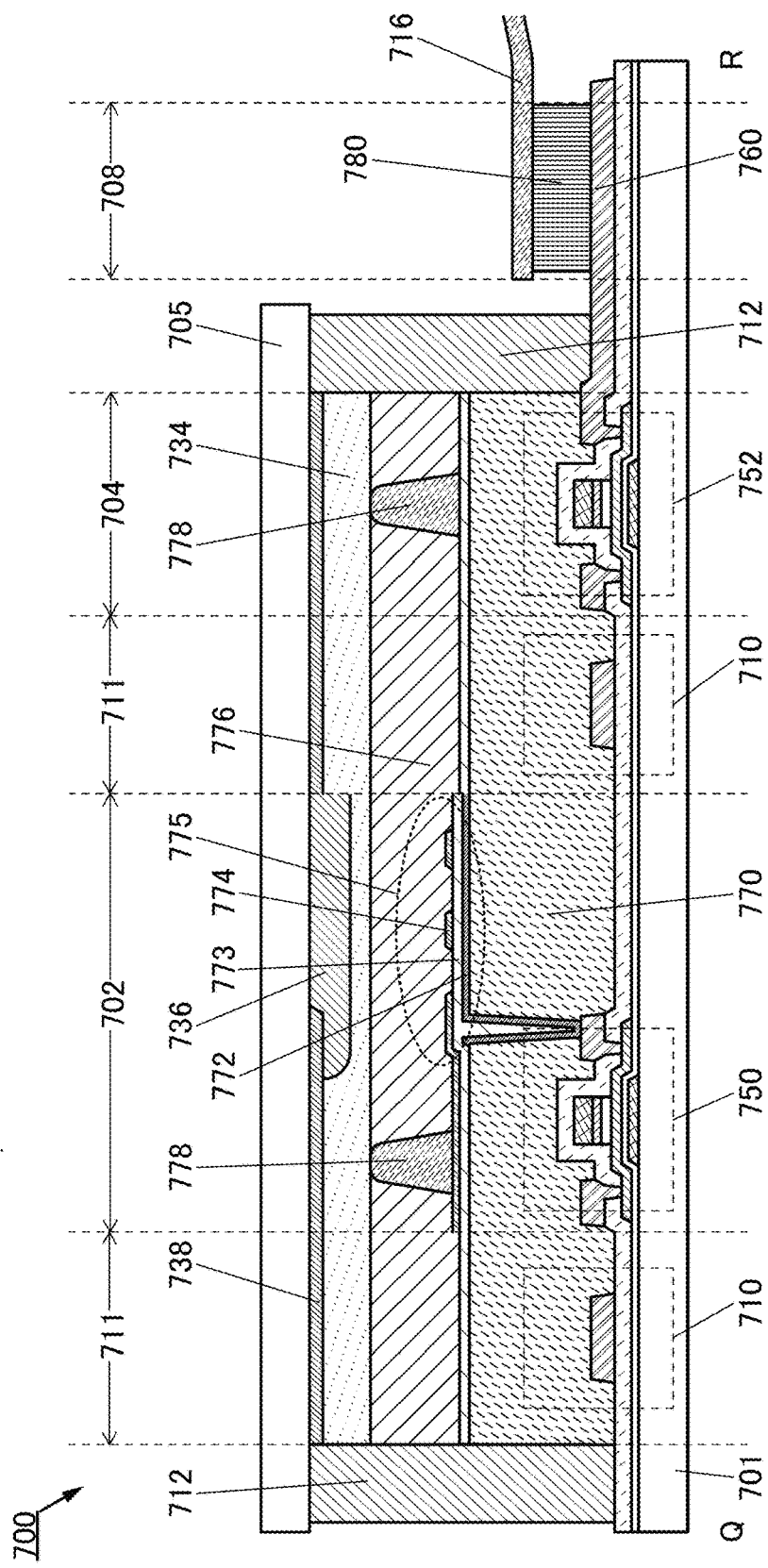
FIG. 14 A cross-sectional view of a display device.
Figure 15:
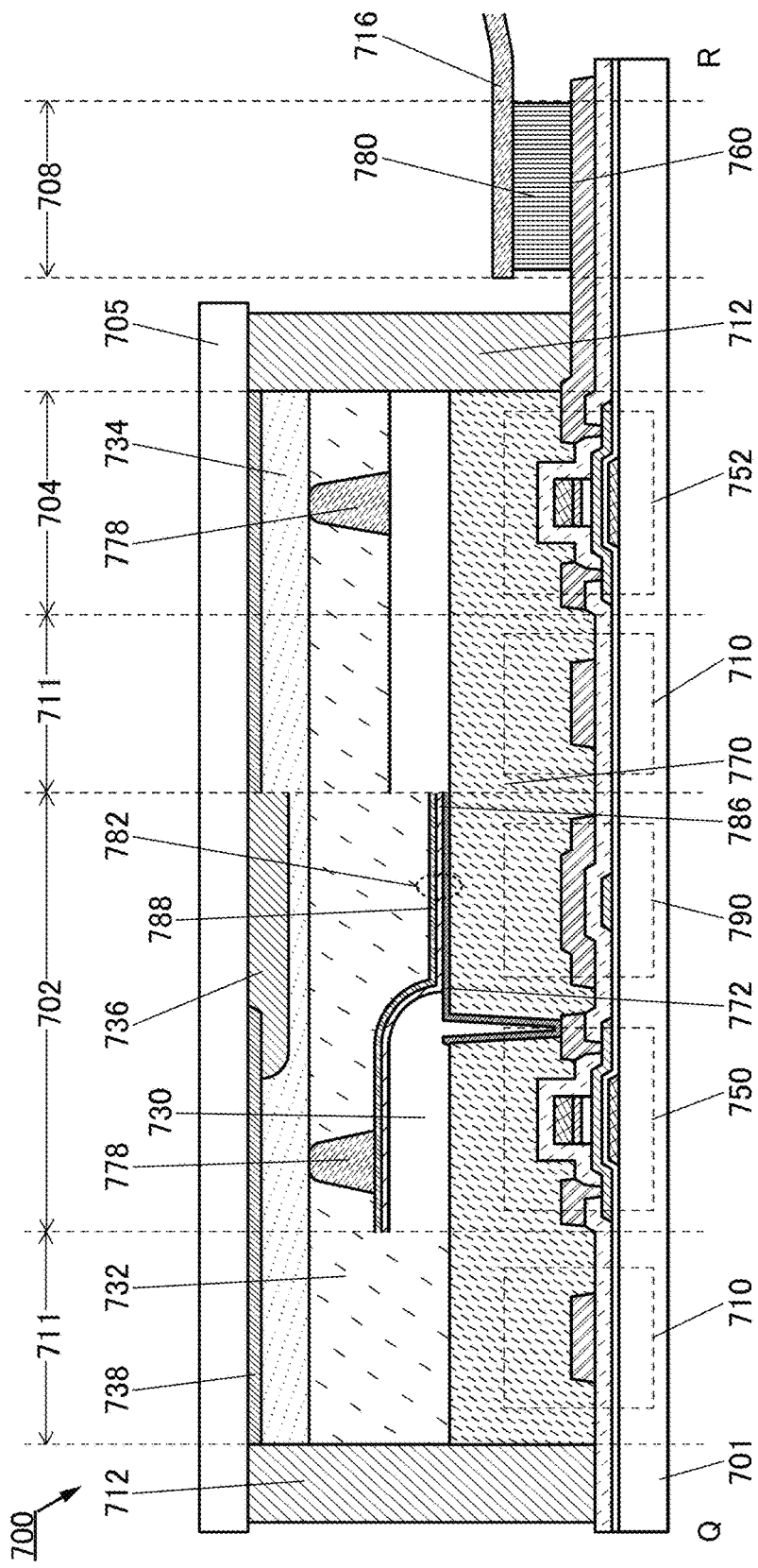
FIG. 15 A cross-sectional view of a display device.

Structures using a liquid crystal element as a display element and a structure using an EL element as a display element will be described below with reference to FIG. 13 to FIG. 15. Note that FIG. 13 to FIG. 15 are cross-sectional views taken along dashed-dotted line Q-R in FIG. 12(A). FIG. 13 and FIG. 14 each illustrate a structure using a liquid crystal element as a display element, and FIG. 15 illustrates a structure using an EL element.

[Description of Common Portions in Display Devices]

Display devices in FIG. 13 to FIG. 15 each include a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752. FIG. 14 shows a case where the capacitor 790 is not provided.

As the transistor 750 and the transistor 752, any of the transistors described in Embodiment 1 can be used.

The transistor used in this embodiment includes a highly purified oxide semiconductor film in which formation of oxygen vacancies is suppressed. The transistor can have low off-state current. Accordingly, an electrical signal such as an image signal can be held for a longer period, and the interval between writings can be set longer in a power on state. Thus, frequency of refresh operation can be reduced, which leads to lower power consumption.

In addition, the transistor used in this embodiment can have relatively high field-effect mobility and thus is capable of high-speed operation. For example, with such a transistor capable of high-speed operation used for a display device, a switching transistor in a pixel portion and a driver transistor used in a driver circuit portion can be formed over one substrate. That is, a structure in which a driver circuit formed using a silicon wafer or the like is not used is possible, in which case the number of components of the semiconductor device can be reduced. Moreover, the use of the transistor capable of high-speed operation also in the pixel portion can provide a high-quality image.

The capacitor 790 illustrated in FIG. 13 and FIG. 15 includes a lower electrode formed in such a manner that the film which is the same as that for the semiconductor layer of the transistor 750 is processed and the resistance is reduced, and an upper electrode formed by processing the conductive film which is the same as that for a source electrode or a drain electrode. Furthermore, two insulating films covering the transistor 750 are provided between the lower electrode and the upper electrode. That is, the capacitor 790 has a stacked-layer structure in which the insulating films functioning as dielectric films are interposed between a pair of electrodes.

A planarization insulating film 770 is provided over the transistor 750, the transistor 752, and the capacitor 790.

The transistor 750 in the pixel portion 702 and the transistor 752 in the source driver circuit portion 704 may have different structures. For example, a top-gate transistor may be used as one of the transistors 750 and 752, and a bottom-gate transistor may be used as the other. Note that the source driver circuit portion 704 may be replaced by a gate driver circuit portion.

The signal line 710 is formed using the same conductive film as the source electrodes, the drain electrodes, and the like of the transistors 750 and 752. In this case, a low-resistance material such as a material containing a copper element is preferably used because signal delay or the like due to the wiring resistance can be reduced and display on a large screen is possible.

The FPC terminal portion 708 includes the connection electrode 760, an anisotropic conductive film 780, and the FPC 716. The connection electrode 760 is electrically connected to a terminal of the FPC 716 through the anisotropic conductive film 780. Here, the connection electrode 760 is formed using the same conductive film as that for the source electrodes and the drain electrodes of the transistors 750 and 752, and the like.

As the first substrate 701 and the second substrate 705, a glass substrate or a flexible substrate such as a plastic substrate can be used, for example.

A light-blocking film 738, a coloring film 736, and an insulating film 734 in contact with these films are provided on the second substrate 705 side.

[Structure Example of Display Device Using Liquid Crystal Element]

The display device 700 illustrated in FIG. 13 includes a liquid crystal element 775. The liquid crystal element 775 includes a conductive layer 772, a conductive layer 774, and a liquid crystal layer 776 therebetween. The conductive layer 774 is provided on the second substrate 705 side and has a function of a common electrode. The conductive layer 772 is electrically connected to the source electrode or the drain electrode of the transistor 750. The conductive layer 772 is formed over the planarization insulating film 770 and functions as a pixel electrode.

A material that transmits visible light or a material that reflects visible light can be used for the conductive layer 772. As a light-transmitting material, for example, an oxide material including indium, zinc, tin, or the like is preferably used. As a reflective material, for example, a material including aluminum, silver, or the like is preferably used.

When a reflective material is used for the conductive layer 772, the display device 700 is a reflective liquid crystal display device. When a light-transmitting material is used for the conductive layer 772, the display device 700 is a transmissive liquid crystal display device. For a reflective liquid crystal display device, a polarizing plate is provided on the viewer side. By contrast, for a transmissive liquid crystal display device, a pair of polarizing plates is provided so that the liquid crystal element is placed therebetween.

The display device 700 in FIG. 14 is an example of employing the liquid crystal element 775 of a horizontal electric field mode (e.g., an FFS mode). The conductive layer 774 functioning as a common electrode is provided over the conductive layer 772 with an insulating layer 773 therebetween. An electric field generated between the conductive layer 772 and the conductive layer 774 can control the alignment state in the liquid crystal layer 776.

In FIG. 14, a storage capacitor can be formed with a stacked-layer structure including the conductive layer 774, the insulating layer 773, and the conductive layer 772. Therefore, it is not necessary to provide a capacitor separately, and thus the aperture ratio can be increased.

Although not illustrated in FIG. 13 and FIG. 14, a structure in which an alignment film in contact with the liquid crystal layer 776 is provided may be employed. Furthermore, an optical member (an optical substrate) such as a polarizing member, a retardation member, or an anti-reflection member, and a light source such as a backlight or a sidelight can be provided as appropriate.

For the liquid crystal layer 776, a thermotropic liquid crystal, a low-molecular liquid crystal, a high-molecular liquid crystal, a polymer dispersed liquid crystal (PDLC), a polymer network liquid crystal (PNLC), a ferroelectric liquid crystal, an anti-ferroelectric liquid crystal, or the like can be used. In the case where a horizontal electric field mode is employed, a liquid crystal exhibiting a blue phase for which an alignment film is not used may be used.

The following can be used as a mode of the liquid crystal element: a TN (Twisted Nematic) mode, a VA (Vertical Alignment) mode, an IPS (In-Plane-Switching) mode, an FFS (Fringe Field Switching) mode, an ASM (Axially Symmetric aligned Micro-cell) mode, an OCB (Optical Compensated Birefringence) mode, an ECB (Electrically Controlled Birefringence) mode, a guest-host mode, or the like.

In addition, a scattering liquid crystal employing a polymer dispersed liquid crystal, a polymer network liquid crystal, or the like can be used for the liquid crystal layer 776. At this time, monochrome image display may be performed without the coloring film 736, or color display may be performed using the coloring film 736.

As a method for driving the liquid crystal element, a time-division display method (also referred to as a field sequential driving method) in which color display is performed on the basis of a successive additive color mixing method may be employed. In that case, a structure in which the coloring film 736 is not provided may be employed. In the case where the time-division display method is employed, advantages such as the aperture ratio of each pixel or the resolution being increased can be obtained because subpixels that emit light of, for example, R (red), G (green), and B (blue), are not necessarily provided.

[Display Device Using Light-Emitting Element]

The display device 700 illustrated in FIG. 15 includes a light-emitting element 782. The light-emitting element 782 includes the conductive layer 772, an EL layer 786, and a conductive film 788. The EL layer 786 contains an organic compound or an inorganic compound such as quantum dots.

Examples of materials that can be used for an organic compound include a fluorescent material and a phosphorescent material. Examples of materials that can be used for quantum dots include a colloidal quantum dot material, an alloyed quantum dot material, a core-shell quantum dot material, and a core quantum dot material.

In the display device 700 illustrated in FIG. 15, an insulating film 730 covering part of the conductive layer 772 is provided over the planarization insulating film 770. Here, the light-emitting element 782 is a top-emission light-emitting element, which includes the conductive film 788 with a light-transmitting property. Note that the light-emitting element 782 may have a bottom-emission structure in which light is emitted to the conductive layer 772 side, or a dual-emission structure in which light is emitted to both the conductive layer 772 and the conductive film 788.

The coloring film 736 is provided to overlap with the light-emitting element 782, and the light-blocking film 738 is provided in the lead wiring portion 711, the source driver circuit portion 704, and a position overlapping with the insulating film 730. The coloring film 736 and the light-blocking film 738 are covered with the insulating film 734. A space between the light-emitting element 782 and the insulating film 734 is filled with a sealing film 732. Note that a structure in which the coloring film 736 is not provided may be employed when the EL layer 786 is formed into an island shape for each pixel or into a stripe shape for each pixel column, i.e., the EL layer 786 is formed by separate coloring.

[Structure Example of Display Device Provided with Input Device]

An input device may be provided in the display device 700 illustrated in FIG. 13 to FIG. 15. Examples of the input device include a touch sensor.

A variety of types such as a capacitive type, a resistive type, a surface acoustic wave type, an infrared type, an optical type, and a pressure-sensitive type can be used as the sensor type, for example. Alternatively, two or more of these types may be combined and used.

Examples of the touch panel structure include a so-called in-cell touch panel in which an input device is provided inside between a pair of substrates, a so-called on-cell touch panel in which an input device is formed over the display device 700, or a so-called out-cell touch panel in which an input device is attached to the display device 700.

At least part of the structure examples, the drawings corresponding thereto, and the like exemplified in this embodiment can be implemented in combination with the other structure examples, the other drawings, and the like as appropriate.

At least part of this embodiment can be implemented in combination with the other embodiments described in this specification as appropriate.

Embodiment 3

In this embodiment, a display device that includes the semiconductor device of one embodiment of the present invention will be described with reference to FIG. 16.

A display device illustrated in FIG. 16(A) includes a pixel portion 502, a driver circuit portion 504, protection circuits 506, and a terminal portion 507. Note that a structure in which the protection circuits 506 are not provided may be employed.

The transistor of one embodiment of the present invention can be used as transistors included in the pixel portion 502 and the driver circuit portion 504. The transistor of one embodiment of the present invention may also be used in the protection circuits 506.

The pixel portion 502 includes a plurality of pixel circuits 501 that drive a plurality of display elements arranged in X rows and Y columns (X and Y each independently represent a natural number of 2 or more).

The driver circuit portion 504 includes driver circuits such as a gate driver 504a that outputs a scanning signal to gate lines GL_1 to GL_X and a source driver 504b that supplies a data signal to data lines DL_1 to DL_Y. The gate driver 504a includes at least a shift register. The source driver 504b is formed using a plurality of analog switches, for example. Alternatively, the source driver 504b may be formed using a shift register or the like.

The terminal portion 507 refers to a portion provided with terminals for inputting power, control signals, image signals, and the like to the display device from external circuits.

The protection circuit 506 is a circuit that, when a potential out of a certain range is applied to a wiring to which the protection circuit 506 is connected, establishes continuity between the wiring and another wiring. The protection circuit 506 illustrated in FIG. 16(A) is connected to a variety of wirings such as the scan lines GL that are wirings between the gate driver 504a and the pixel circuits 501 and the data lines DL that are wirings between the source driver 504b and the pixel circuits 501, for example.

The gate driver 504a and the source driver 504b may be provided over a substrate over which the pixel portion 502 is provided, or a substrate where a gate driver circuit or a source driver circuit is separately formed (e.g., a driver circuit board formed using a single crystal semiconductor film or a polycrystalline semiconductor film) may be mounted on the substrate by COG or TAB (Tape Automated Bonding).

The plurality of pixel circuits 501 illustrated in FIG. 16(A) can have a configuration illustrated in FIG. 16(B) or FIG. 16(C), for example.

The pixel circuit 501 illustrated in FIG. 16(B) includes a liquid crystal element 570, a transistor 550, and a capacitor 560. The data line DL_n, the scan line GL_m, a potential supply line VL, and the like are connected to the pixel circuit 501.

The potential of one of a pair of electrodes of the liquid crystal element 570 is set appropriately in accordance with the specifications of the pixel circuit 501. The alignment state of the liquid crystal element 570 is set depending on written data. Note that a common potential may be supplied to one of the pair of electrodes of the liquid crystal element 570 included in each of the plurality of pixel circuits 501. Moreover, a different potential may be supplied to one of the pair of electrodes of the liquid crystal element 570 of the pixel circuit 501 in each row.

The pixel circuit 501 illustrated in FIG. 16(C) includes transistors 552 and 554, a capacitor 562, and a light-emitting element 572. The data line DL_n, the scan line GL_m, a potential supply line VL_a, a power supply line VL_b, and the like are connected to the pixel circuit 501.

Note that a high power supply potential VDD is supplied to one of the potential supply line VL_a and the potential supply line VL_b, and a low power supply potential VSS is supplied to the other. Current flowing through the light-emitting element 572 is controlled in accordance with a potential applied to a gate of the transistor 554, whereby the luminance of light emitted from the light-emitting element 572 is controlled.

At least part of the structure examples, the drawings corresponding thereto, and the like exemplified in this embodiment can be implemented in combination with the other structure examples, the other drawings, and the like as appropriate.

At least part of this embodiment can be implemented in combination with the other embodiments described in this specification as appropriate.

Embodiment 4

A pixel circuit including a memory for correcting gray levels displayed by pixels and a display device including the pixel circuit will be described below. The transistor described in Embodiment 1 can be used as a transistor used in the pixel circuit described below.

[Circuit Configuration]

Figure 17A:
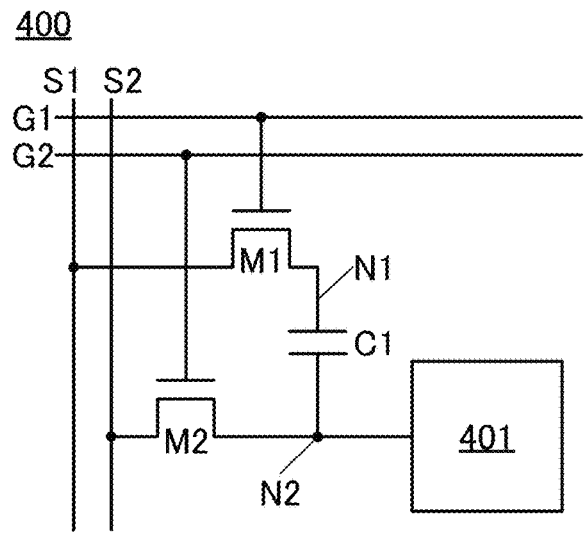
FIGS. 17A-17D Circuit diagrams of display devices.

FIG. 17(A) is a circuit diagram of a pixel circuit 400. The pixel circuit 400 includes a transistor M1, a transistor M2, a capacitor C1, and a circuit 401. A wiring S1, a wiring S2, a wiring G1, and a wiring G2 are connected to the pixel circuit 400.

In the transistor M1, a gate is connected to the wiring G1, one of a source and a drain is connected to the wiring S1, and the other is connected to one electrode of the capacitor C1. In the transistor M2, a gate is connected to the wiring G2, one of a source and a drain is connected to the wiring S2, and the other is connected to the other electrode of the capacitor C1 and the circuit 401.

The circuit 401 is a circuit including at least one display element. Any of a variety of elements can be used as the display element, and typically, a light-emitting element such as an organic EL element or an LED element, a liquid crystal element, a MEMS (Micro Electro Mechanical Systems) element, or the like can be used.

A node connecting the transistor M1 and the capacitor C1 is denoted as N1, and a node connecting the transistor M2 and the circuit 401 is denoted as N2.

In the pixel circuit 400, the potential of the node N1 can be retained when the transistor M1 is turned off. The potential of the node N2 can be retained when the transistor M2 is turned off. When a predetermined potential is written to the node N1 through the transistor M1 with the transistor M2 being in an off state, the potential of the node N2 can be changed in accordance with displacement of the potential of the node N1 owing to capacitive coupling through the capacitor C1.

Here, the transistor using an oxide semiconductor, which is described in Embodiment 1, can be used as one or both of the transistor M1 and the transistor M2. Accordingly, owing to an extremely low off-state current, the potentials of the node N1 and the node N2 can be retained for a long time. Note that in the case where the period in which the potential of each node is retained is short (specifically, the case where the frame frequency is higher than or equal to 30 Hz, for example), a transistor using a semiconductor such as silicon may be used.

[Driving Method Example]

Figure 17B:
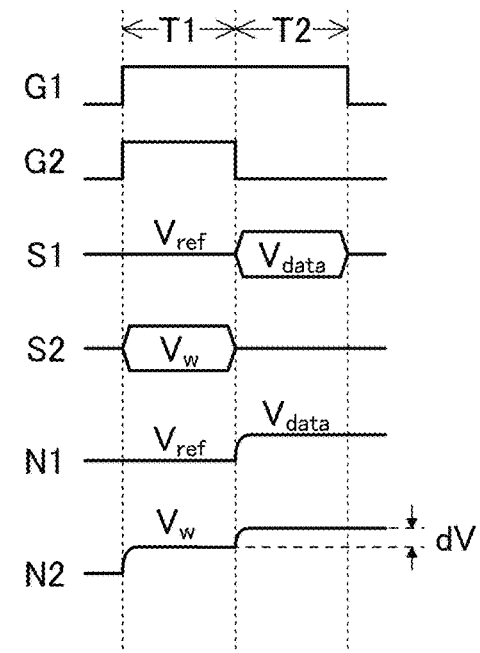

Next, an example of a method for operating the pixel circuit 400 is described with reference to FIG. 17(B). FIG. 17(B) is a timing chart of the operation of the pixel circuit 400. Note that for simplification of description, the influence of various kinds of resistance such as wiring resistance, parasitic capacitance of a transistor, a wiring, or the like, the threshold voltage of the transistor, and the like is not taken into account here.

In the operation shown in FIG. 17(B), one frame period is divided into a period T1 and a period T2. The period T1 is a period in which a potential is written to the node N2, and the period T2 is a period in which a potential is written to the node N1.

[Period T1]

In the period T1, a potential for turning on the transistor is supplied to both the wiring G1 and the wiring G2. In addition, a potential $V_{ref}$ that is a fixed potential is supplied to the wiring S1, and a first data potential $V_w$ is supplied to the wiring S2.

The potential $V_{ref}$ is supplied from the wiring S1 to the node N1 through the transistor M1. The first data potential $V_w$ is supplied to the node N2 through the transistor M2. Accordingly, a potential difference $V_w - V_{ref}$ is retained in the capacitor C1.

[Period T2]

Next, in the period T2, a potential for turning on the transistor M1 is supplied to the wiring G1, and a potential for turning off the transistor M2 is supplied to the wiring G2. A second data potential $V_{data}$ is supplied to the wiring S1. The wiring S2 may be supplied with a predetermined constant potential or brought into a floating state.

The second data potential $V_{data}$ is supplied to the node N1 through the transistor M1. At this time, capacitive coupling due to the capacitor C1 changes the potential of the node N2 in accordance with the second data potential $V_{data}$ by a potential dV. That is, a potential that is the sum of the first data potential $V_w$ and the potential dV is input to the circuit 401. Note that although dV is shown as a positive value in FIG. 17(B), dV may be a negative value. That is, the potential $V_{data}$ may be lower than the potential $V_{ref}$.

Here, the potential dV is roughly determined by the capacitance of the capacitor C1 and the capacitance of the circuit 401. When the capacitance of the capacitor C1 is sufficiently larger than the capacitance of the circuit 401, the potential dV is a potential close to the second data potential $V_{data}$.

In the above manner, the pixel circuit 400 can generate a potential to be supplied to the circuit 401 including the display element, by combining two kinds of data signals; hence, a gray level can be corrected in the pixel circuit 400.

The pixel circuit 400 can also generate a potential exceeding the maximum potential that can be supplied to the wiring S1 and the wiring S2. For example, in the case where a light-emitting element is used, high-dynamic range (HDR) display or the like can be performed. In the case where a liquid crystal element is used, overdriving or the like can be achieved.

Application Examples

[Example Using Liquid Crystal Element]

Figure 17C:
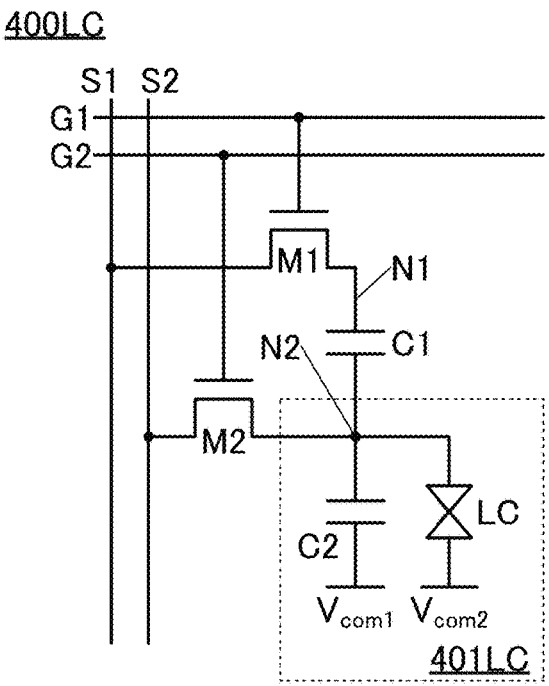

A pixel circuit 400LC illustrated in FIG. 17(C) includes a circuit 401LC. The circuit 401LC includes a liquid crystal element LC and a capacitor C2.

In the liquid crystal element LC, one electrode is connected to the node N2 and one electrode of the capacitor C2, and the other electrode is connected to a wiring supplied with a potential $V_{com2}$. The other electrode of the capacitor C2 is connected to a wiring supplied with a potential $V_{com1}$.

The capacitor C2 functions as a storage capacitor. Note that the capacitor C2 can be omitted when not needed.

In the pixel circuit 400LC, a high voltage can be supplied to the liquid crystal element LC; thus, high-speed display can be performed by overdriving or a liquid crystal material with a high driving voltage can be employed, for example. Moreover, by supply of a correction signal to the wiring S1 or the wiring S2, a gray level can be corrected in accordance with the operating temperature, the deterioration state of the liquid crystal element LC, or the like.

[Example Using Light-Emitting Element]

Figure 17D:
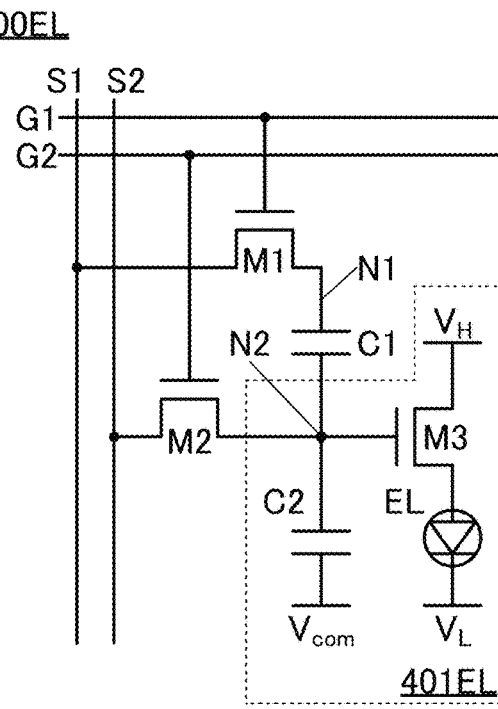

A pixel circuit 400EL illustrated in FIG. 17(D) includes a circuit 401EL. The circuit 401EL includes a light-emitting element EL, a transistor M3, and the capacitor C2.

In the transistor M3, a gate is connected to the node N2 and one electrode of the capacitor C2, one of a source and a drain is connected to a wiring supplied with a potential $V_H$, and the other is connected to one electrode of the light-emitting element EL. The other electrode of the capacitor C2 is connected to a wiring supplied with a potential $V_{com}$. The other electrode of the light-emitting element EL is connected to a wiring supplied with a potential $V_L$.

The transistor M3 has a function of controlling a current to be supplied to the light-emitting element EL. The capacitor C2 functions as a storage capacitor. The capacitor C2 can be omitted when not needed.

Note that although the structure in which the anode side of the light-emitting element EL is connected to the transistor M3 is described here, the transistor M3 may be connected to the cathode side. In that case, the values of the potential $V_H$ and the potential $V_L$ can be appropriately changed.

In the pixel circuit 400EL, a large amount of current can flow through the light-emitting element EL when a high potential is applied to the gate of the transistor M3, which enables HDR display, for example. Moreover, a variation in the electrical characteristics of the transistor M3 and the light-emitting element EL can be corrected by supply of a correction signal to the wiring S1 or the wiring S2.

Note that the configuration is not limited to the circuits shown in FIG. 17(C) and FIG. 17(D), and a configuration to which a transistor, a capacitor, or the like is further added may be employed.

At least part of this embodiment can be implemented in combination with the other embodiments described in this specification as appropriate.

Embodiment 5

In this embodiment, a display module that can be fabricated using one embodiment of the present invention will be described.

Figure 18A:
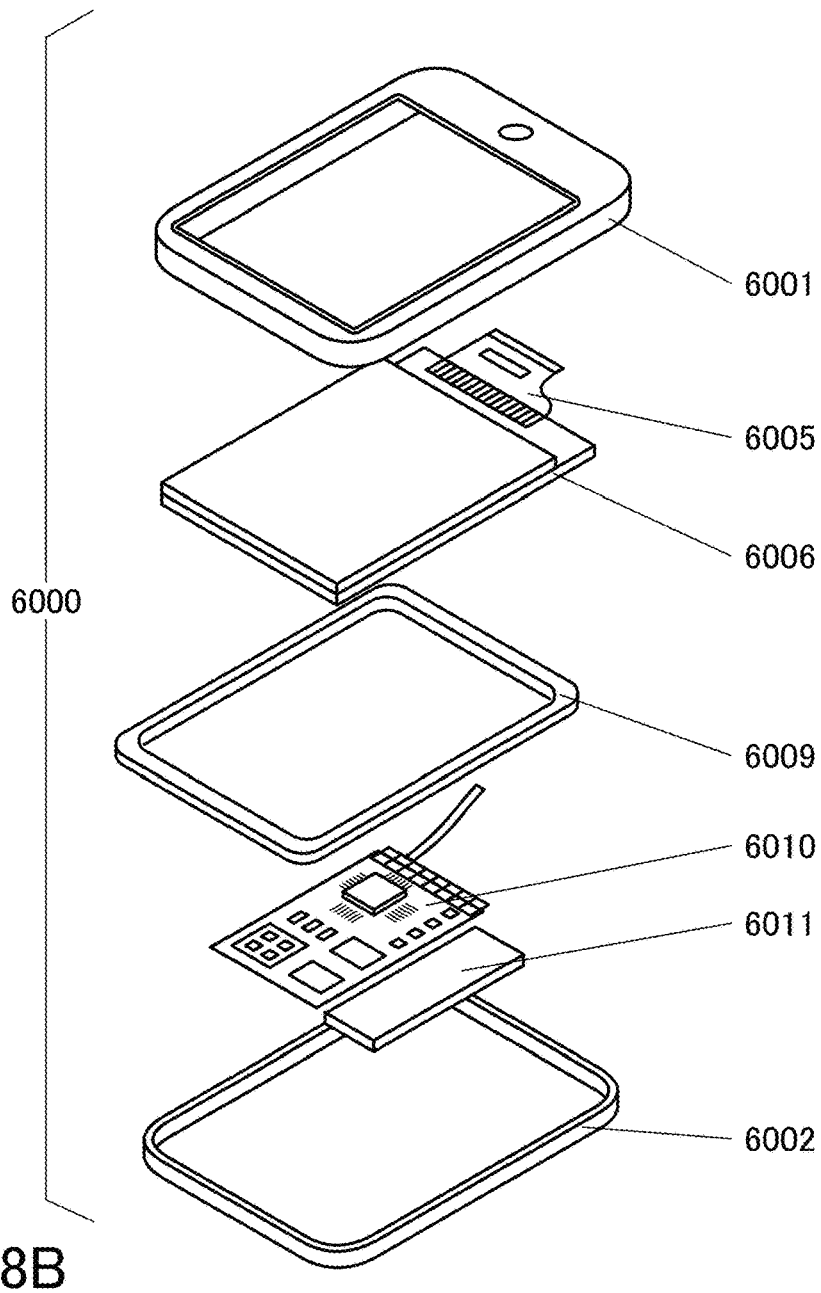
FIGS. 18A-18B A structure example of a display module.

In a display module 6000 illustrated in FIG. 18(A), a display device 6006 to which an FPC 6005 is connected, a frame 6009, a printed circuit board 6010, and a battery 6011 are provided between an upper cover 6001 and a lower cover 6002.

A display device fabricated using one embodiment of the present invention can be used as the display device 6006, for example. With the display device 6006, a display module with extremely low power consumption can be achieved.

The shape and size of the upper cover 6001 and the lower cover 6002 can be changed as appropriate in accordance with the size of the display device 6006.

The display device 6006 may have a function of a touch panel.

The frame 6009 may have a function of protecting the display device 6006, a function of blocking electromagnetic waves generated by the operation of the printed circuit board 6010, a function of a heat dissipation plate, or the like.

The printed circuit board 6010 includes a power supply circuit, a signal processing circuit for outputting a video signal and a clock signal, a battery control circuit, and the like. The power supply may be from the battery 6011.

Figure 18B:
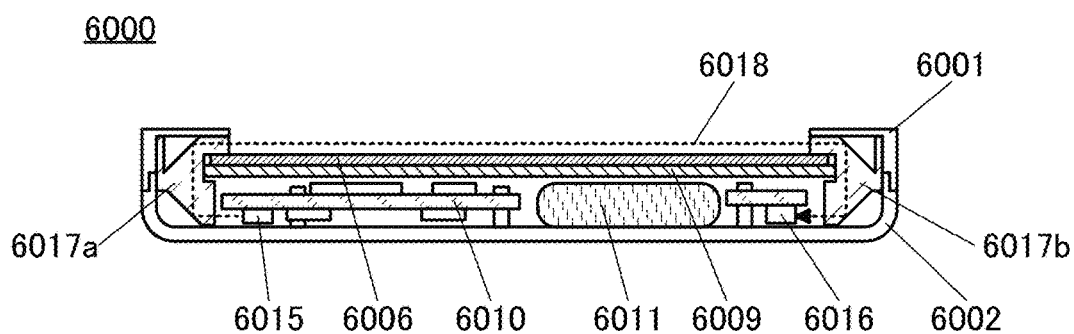

FIG. 18(B) is a schematic cross-sectional view of the display module 6000 having an optical touch sensor.

The display module 6000 includes a light-emitting portion 6015 and a light-receiving portion 6016 that are provided on the printed circuit board 6010. Furthermore, a pair of light guide portions (a light guide portion 6017a and a light guide portion 6017b) is provided in a region surrounded by the upper cover 6001 and the lower cover 6002.

The display device 6006 overlaps the printed circuit board 6010 and the battery 6011 with the frame 6009 therebetween. The display device 6006 and the frame 6009 are fixed to the light guide portion 6017a and the light guide portion 6017b.

Light 6018 emitted from the light-emitting portion 6015 travels over the display device 6006 through the light guide portion 6017a and reaches the light-receiving portion 6016 through the light guide portion 6017b. For example, blocking of the light 6018 by a sensing target such as a finger or a stylus enables detection of touch operation.

A plurality of light-emitting portions 6015 are provided along two adjacent sides of the display device 6006, for example. A plurality of light-receiving portions 6016 are provided at the positions on the opposite side of the light-emitting portions 6015. Accordingly, information about the position of touch operation can be obtained.

As the light-emitting portion 6015, a light source such as an LED element can be used, for example, and it is particularly preferable to use a light source emitting infrared rays. As the light-receiving portion 6016, a photoelectric element that receives light emitted from the light-emitting portion 6015 and converts it into an electric signal can be used. A photodiode that can receive infrared rays can be suitably used.

With the use of the light guide portion 6017a and the light guide portion 6017b which transmit the light 6018, the light-emitting portion 6015 and the light-receiving portion 6016 can be placed under the display device 6006, and a malfunction of the touch sensor due to external light reaching the light-receiving portion 6016 can be suppressed. Particularly when a resin that absorbs visible light and transmits infrared rays is used, a malfunction of the touch sensor can be suppressed more effectively.

At least part of this embodiment can be implemented in combination with the other embodiments described in this specification as appropriate.

Embodiment 6

In this embodiment, electronic devices each including a display device manufactured using one embodiment of the present invention are described.

Electronic devices exemplified below include a display device of one embodiment of the present invention in a display portion. Thus, the electronic devices achieve high resolution. In addition, the electronic devices can achieve both high resolution and a large screen.

The display portion of the electronic device of one embodiment of the present invention can display a video with a resolution of, for example, full high definition, 4K2K, 8K4K, 16K8K, or higher.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a laptop personal computer, a monitor device, digital signage, a pachinko machine, or a game machine.

The electronic device using one embodiment of the present invention can be incorporated along a flat surface or a curved surface of an inside wall or an outside wall of a house or a building, an interior or an exterior of a car, or the like.

Figure 19A:
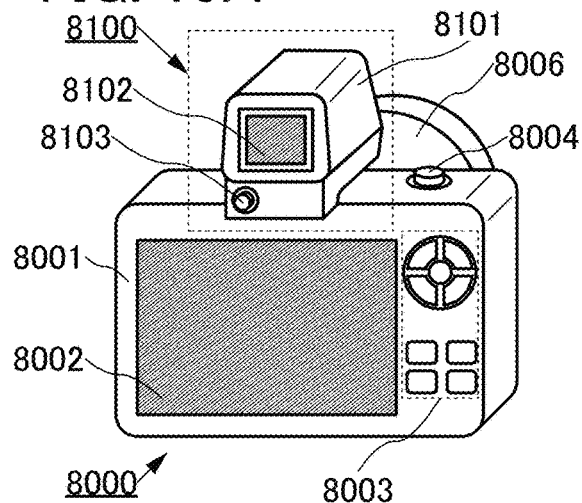
FIGS. 19A-19E Structure examples of electronic devices.

FIG. 19(A) is a diagram showing appearance of a camera 8000 to which a finder 8100 is attached.

The camera 8000 includes a housing 8001, a display portion 8002, operation buttons 8003, a shutter button 8004, and the like. A detachable lens 8006 is attached to the camera 8000.

Note that the lens 8006 and the housing may be integrated with each other in the camera 8000.

The camera 8000 can take images by the press of the shutter button 8004 or touch on the display portion 8002 serving as a touch panel.

The housing 8001 includes a mount including an electrode, so that, in addition to the finder 8100, a stroboscope or the like can be connected to the housing.

The finder 8100 includes a housing 8101, a display portion 8102, a button 8103, and the like.

The housing 8101 is attached to the camera 8000 with a mount engaging with a mount of the camera 8000. The finder 8100 can display a video received from the camera 8000 and the like on the display portion 8102.

The button 8103 serves as a power button or the like.

The display portion 8002 of the camera 8000 and the display portion 8102 of the finder 8100 can use the display device of one embodiment of the present invention. Note that a finder may be incorporated in the camera 8000.

Figure 19B:
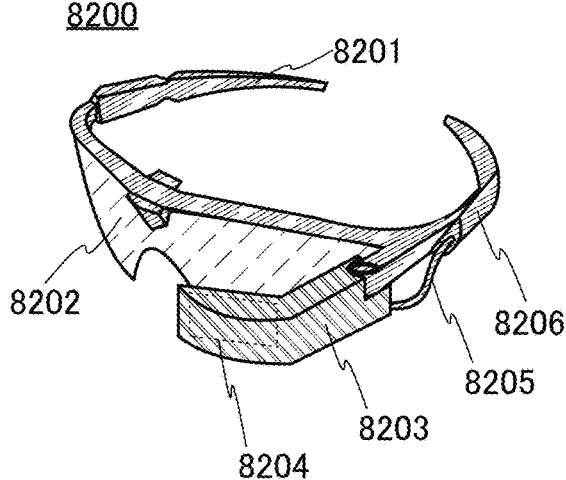

FIG. 19(B) is a diagram showing appearance of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like and can display received video information on the display portion 8204. The main body 8203 is provided with a camera, and data on the movement of the user's eyeball and eyelid can be used as an input means.

The mounting portion 8201 may include a plurality of electrodes capable of sensing current flowing in response to the movement of the user's eyeball in a position in contact with the user to achieve a function of recognizing the points the user looks at. A function of monitoring the user's pulse with the use of current flowing through the electrodes may be achieved. The mounting portion 8201 may include various sensors such as a temperature sensor, a pressure sensor, and an acceleration sensor to have a function of displaying the user's biological information on the display portion 8204 or a function of changing a video displayed on the display portion 8204 in accordance with the movement of the user's head.

The display portion 8204 can use the display device of one embodiment of the present invention.

Figure 19C:
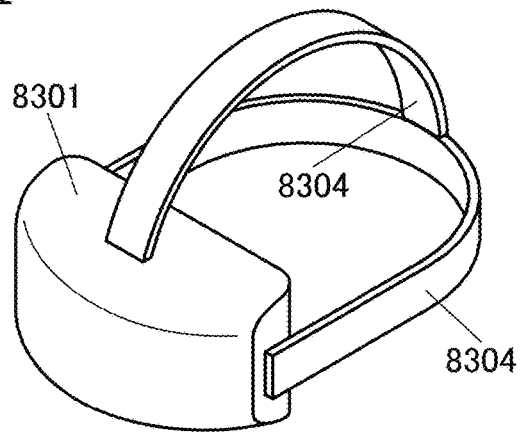
Figure 19D:
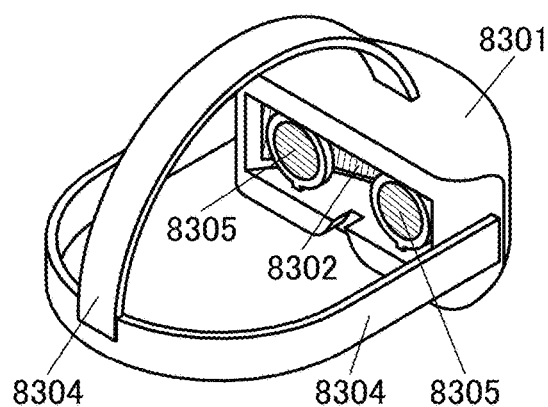
Figure 19E:
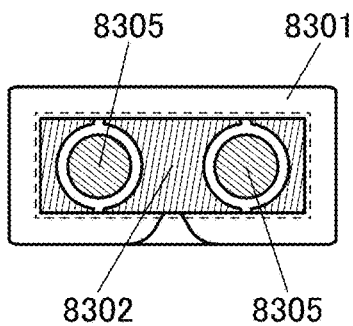

FIG. 19(C), FIG. 19(D), and FIG. 19(E) are diagrams showing appearance of a head-mounted display 8300. The head-mounted display 8300 includes a housing 8301, a display portion 8302, a band-shaped fixing unit 8304, and a pair of lenses 8305.

A user can see display on the display portion 8302 through the lenses 8305. Note that the display portion 8302 is preferably curved and placed, in which case the user can feel a high realistic sensation. When another image displayed in a different region of the display portion 8302 is viewed through the lenses 8305, three-dimensional display using parallax or the like can also be performed. Note that the configuration is not limited to that in which one display portion 8302 is provided, and two display portions 8302 may be provided so that one display portion is provided for one eye of the user.

Note that the display device of one embodiment of the present invention can be used in the display portion 8302. The display device including the semiconductor device of one embodiment of the present invention has an extremely high resolution; thus, even when a video is magnified using the lenses 8305 as in FIG. 19(E), the user does not perceive pixels, and a more realistic video can be displayed.

Electronic devices illustrated in FIG. 20(A) to FIG. 20(G) include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 20(A) to FIG. 20(G) have a variety of functions. For example, the electronic devices can have a function of displaying a variety of data (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each include a camera or the like and have a function of taking a still image or a moving image and storing the taken image in a recording medium (external or incorporated in the camera), a function of displaying the taken image on the display portion, or the like.

The details of the electronic devices illustrated in FIG. 20(A) to FIG. 20(G) will be described below.

Figure 20A:
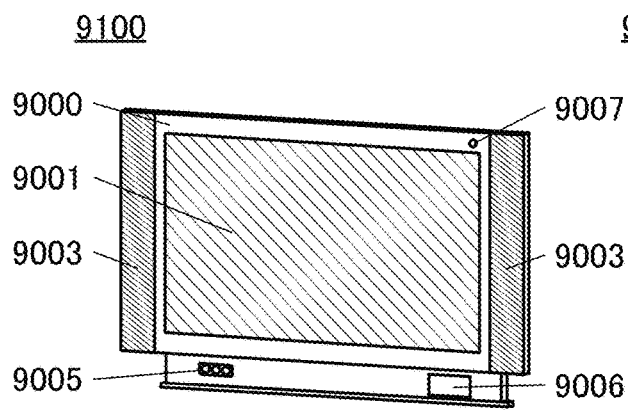
FIGS. 20A-20G Structure examples of electronic devices.

FIG. 20(A) is a perspective view showing a television device 9100. The television device 9100 can include the display portion 9001 having a large screen size of, for example, 50 inches or more, or 100 inches or more.

Figure 20B:
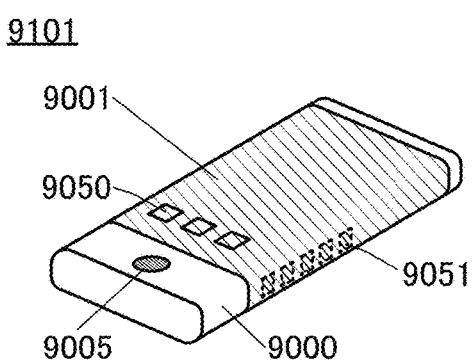

FIG. 20(B) is a perspective view showing a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display characters and image information on its plurality of surfaces. FIG. 20(B) shows an example in which three icons 9050 are displayed. Information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in the position where the information 9051 is displayed.

Figure 20C:
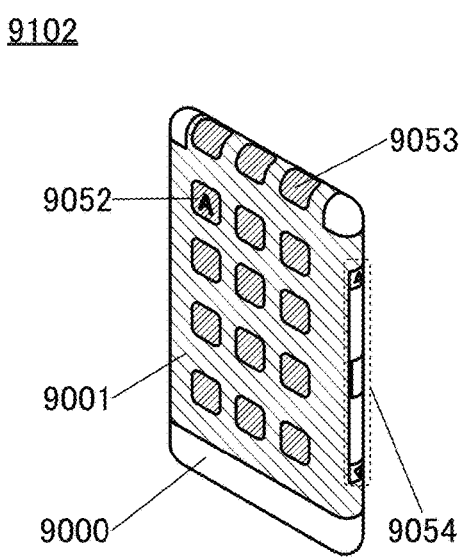

FIG. 20(C) is a perspective view showing a portable information terminal 9102. The portable information terminal 9102 has a function of displaying information on three or more surfaces of the display portion 9001. Here, an example in which information 9052, information 9053, and information 9054 are displayed on different surfaces is shown. For example, a user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer the call, for example.

Figure 20D:
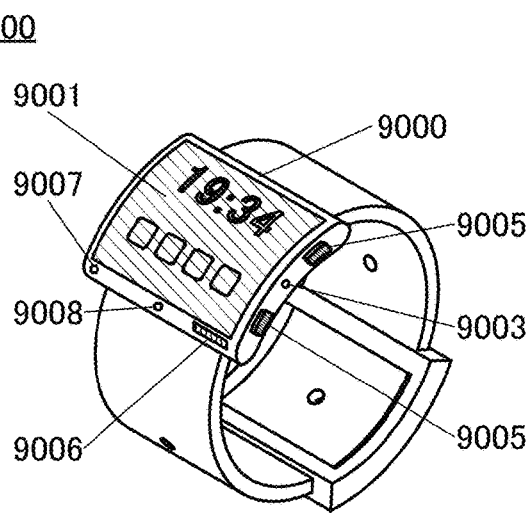

FIG. 20(D) is a perspective view showing a watch-type portable information terminal 9200. For example, the portable information terminal 9200 can be used as a smart watch. The display surface of the display portion 9001 is curved and provided, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 20E:
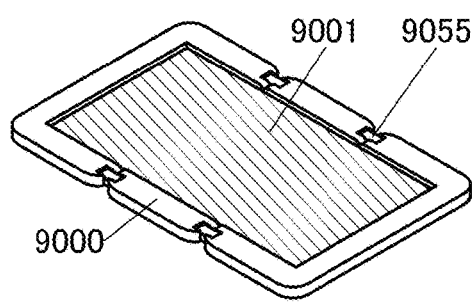
Figure 20F:
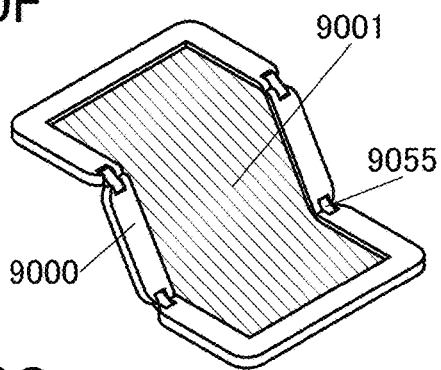
Figure 20G:
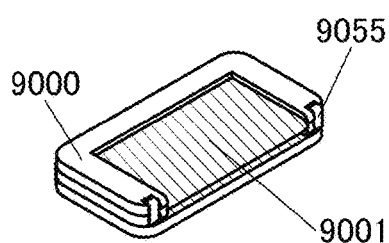

FIG. 20(E), FIG. 20(F), and FIG. 20(G) are perspective views showing a foldable portable information terminal 9201. FIG. 20(E) is a perspective view of an opened state of the portable information terminal 9201, FIG. 20(G) is a perspective view of a folded state thereof, and FIG. 20(F) is a perspective view of a state in the middle of change from one of FIG. 20(E) and FIG. 20(G) to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be folded with a radius of curvature of greater than or equal to 1 mm and less than or equal to 150 mm.

Figure 21A:
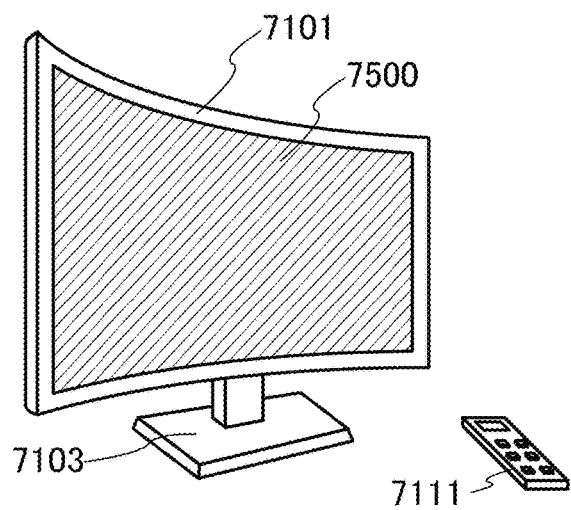
FIGS. 21A-21D Structure examples of electronic devices.

FIG. 21(A) shows an example of a television device. In a television device 7100, a display portion 7500 is incorporated in a housing 7101. Here, a structure in which the housing 7101 is supported by a stand 7103 is illustrated.

Operation of the television device 7100 illustrated in FIG. 21(A) can be performed with an operation switch provided in the housing 7101 or a separate remote controller 7111. Alternatively, a touch panel may be used for the display portion 7500, and the television device 7100 may be operated by touch on the touch panel. The remote controller 7111 may be provided with a display portion in addition to operation buttons.

Note that the television device 7100 may include a television receiver and a communication device for a network connection.

Figure 21B:
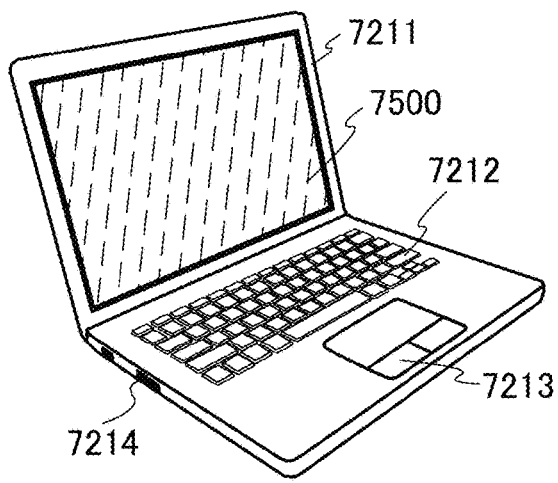

FIG. 21(B) illustrates a laptop personal computer 7200. The laptop personal computer 7200 includes a housing 7211, a keyboard 7212, a pointing device 7213, an external connection port 7214, and the like. In the housing 7211, the display portion 7500 is incorporated.

Figure 21C:
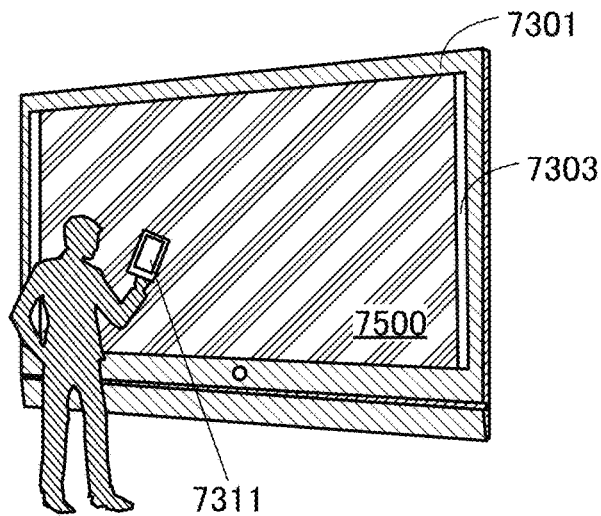
Figure 21D:
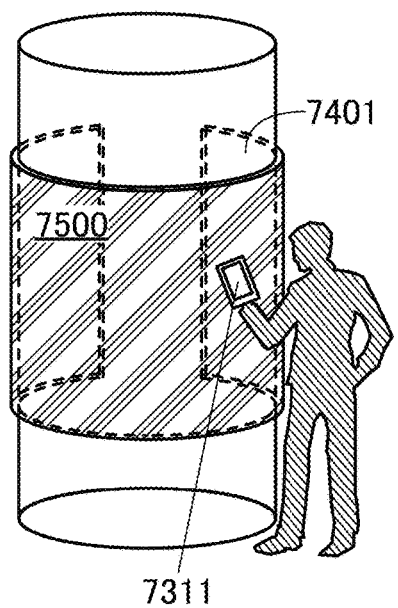

FIG. 21(C) and FIG. 21(D) show examples of digital signage.

Digital signage 7300 illustrated in FIG. 21(C) includes a housing 7301, the display portion 7500, a speaker 7303, and the like. Furthermore, the digital signage can include an LED lamp, operation keys (including a power switch or an operation switch), a connection terminal, a variety of sensors, a microphone, and the like.

FIG. 21(D) illustrates digital signage 7400 attached to a cylindrical pillar 7401. The digital signage 7400 includes the display portion 7500 provided along a curved surface of the pillar 7401.

The larger display portion 7500 can increase the amount of data that can be provided at a time and attracts more attention, so that the effectiveness of the advertisement can be increased, for example.

A touch panel is preferably used in the display portion 7500 so that the user can operate the digital signage. Thus, the digital signage can be used for not only advertising but also providing information that the user needs, such as route information, traffic information, and an information map of a commercial facility.

As illustrated in FIG. 21(C) and FIG. 21(D), it is preferable that the digital signage 7300 or the digital signage 7400 be capable of working with an information terminal 7311 such as user's smartphone through wireless communication. For example, information of an advertisement displayed on the display portion 7500 can be displayed on a screen of the information terminal 7311. By operation of the information terminal 7311, display on the display portion 7500 can be switched.

It is possible to make the digital signage 7300 or the digital signage 7400 execute a game with the use of the information terminal 7311 as an operation means (controller). Thus, an unspecified number of users can join in and enjoy the game concurrently.

The display device of one embodiment of the present invention can be used in the display portion 7500 in FIGS. 21(A) to 21(D).

The electronic devices of this embodiment each include a display portion; however, one embodiment of the present invention can also be used in an electronic device without a display portion.

At least part of this embodiment can be implemented in combination with the other embodiments described in this specification as appropriate.

Example

In this example, an insulating film was formed over a conductive film, and the conductive film after heat treatment was evaluated.

Two samples, Sample A that is one embodiment of the present invention and Comparative sample, were used. In Sample A, an insulating film containing boron was used as the insulating film. In Comparative sample, an insulating film not containing boron was used as the insulating film.
<Sample Fabrication>

First, a tungsten film with a thickness of approximately 150 nm was deposited over a quartz substrate in each of Sample A and Comparative sample. The tungsten film was deposited by a sputtering method using a tungsten target.

Next, a silicon oxynitride film with a thickness of approximately 150 nm was deposited over the tungsten film in each of Sample A and Comparative sample. The silicon oxynitride film was deposited by a plasma CVD method using a silane gas and a dinitrogen monoxide gas as a deposition gas. Note that the substrate temperature at the time of deposition was 200° C.

Then, an impurity element was added in Sample A. Boron (11B) was added as the impurity element; an ion implantation apparatus without a mass separation mechanism was used in adding the impurity element. Comparative sample was not subjected to implantation of the impurity element.

The implantation of boron was performed under optimized conditions such that the boron concentration was the highest in the silicon oxynitride film. The conditions for implanting boron were a beam energy of 20 keV and a dosage of $5 \times 10^{15}$ cm$^{-2}$.

Next, each of Sample A and Comparative sample was subjected to heat treatment. The heat treatment was performed in an air atmosphere at 600° C. for one hour.
<Simulation of Implantation Amount>

The implantation amount of boron in the depth direction of the sample was calculated. In the calculation, TRIM (Transport of Ion in Matter), which is software for calculating an ion implantation process by a Monte Carlo method, was used.

An insulating film of a silicon oxide film with a thickness of 300 nm and a density of 2.2 g/cm$^3$ was used as an implantation target film in the calculation. Boron was used as the impurity element, and the dosage was $5\times10^{15}$ cm$^{-2}$. The beam energy was set to 20 keV.

Figure 22:
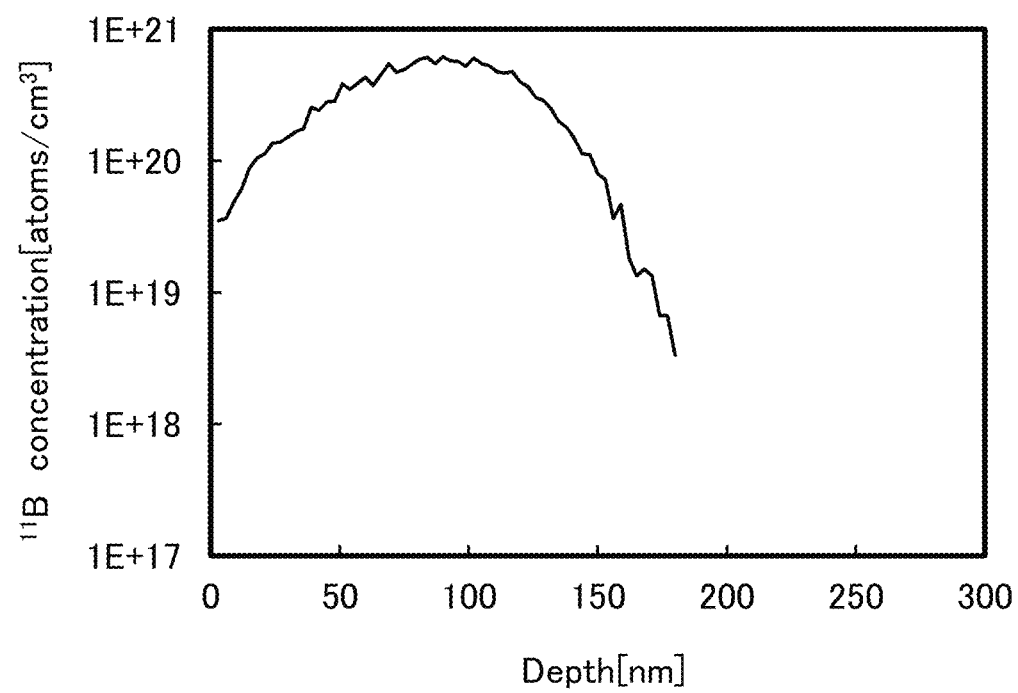
FIG. 22 A calculation result of the concentration of an impurity element.

FIG. 22 shows the calculation result. In FIG. 22, the vertical axis represents the volume concentration of boron (11B concentration) and the horizontal axis represents depth (Depth). As shown in FIG. 22, the boron concentration was found to be the highest at a depth of around 100 nm from the surface.

<Cross-Sectional Observation and EDX Analysis>

Next, Sample A and Comparative sample were thinned by focused ion beam (FIB) and cross sections were observed with a scanning transmission electron microscope (by STEM: Scanning Transmission Electron Microscopy). The STEM observation was performed at an acceleration voltage of 200 kV using a scanning transmission electron microscope HD-2300 manufactured by Hitachi High-Technologies Corporation.

Figure 23A:
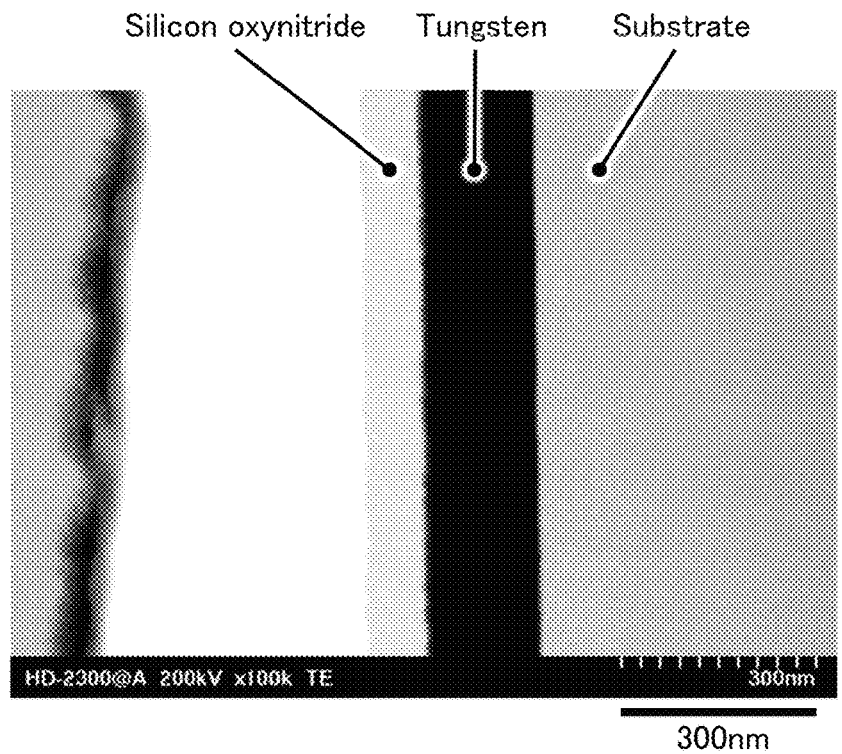
FIGS. 23A-23B Cross-sectional STEM images.
Figure 23B:
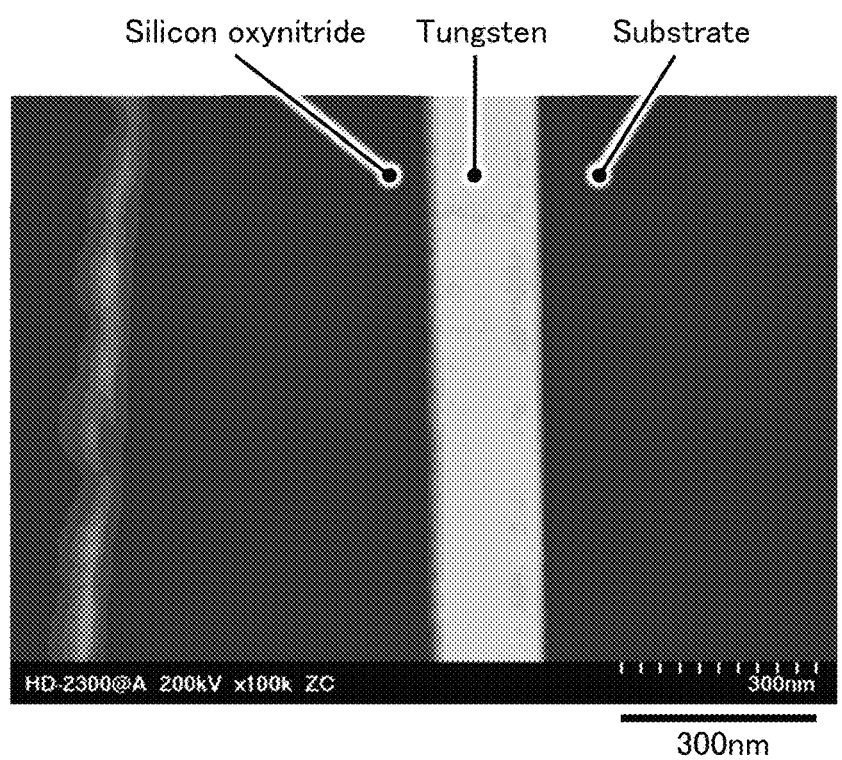

FIG. 23(A) and FIG. 23(B) are STEM images of the cross section of Sample A. FIG. 23(A) is a transmission electron image (TE image) at a magnification of 100000 times. FIG. 23(B) is a Z contrast image (ZC image) of the same portion as the portion in FIG. 23(A) at a magnification of 100000 times. A substance having a larger atomic number is seen brighter in a Z contrast image. As shown in FIG. 23(A) and FIG. 23(B), a layer was not observed between the tungsten film and the silicon oxynitride film.

Figure 24A:
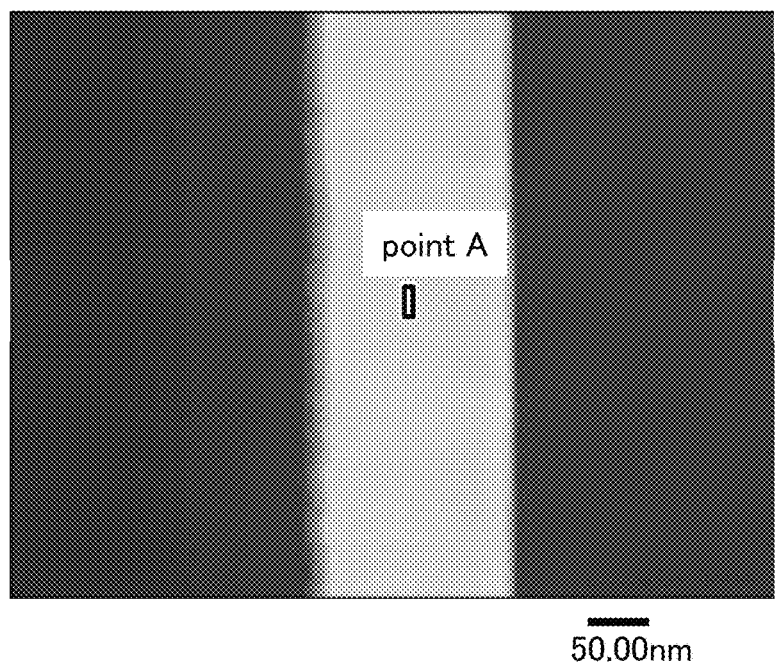
FIGS. 24A-24B A cross-sectional STEM image and an EDX spectrum.
Figure 24B:
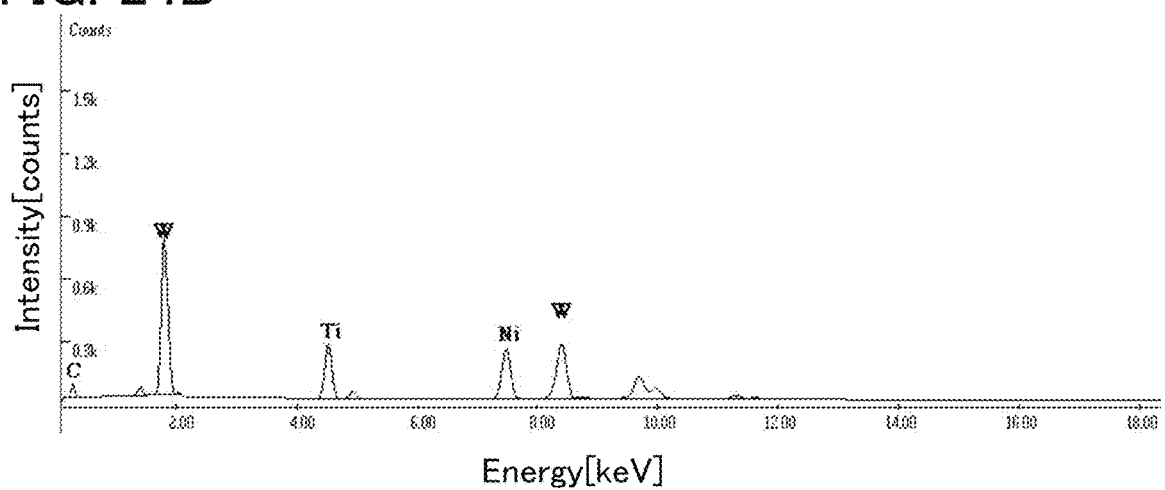

EDX analysis was performed on the tungsten film with the use of the cross-sectional STEM image shown in FIG. 23(B). The portion subjected to EDX analysis is one, i.e., point A in FIG. 24(A). The EDX spectrum at point A is shown in FIG. 24(B). In FIG. 24(B), the vertical axis represents the energy of the characteristic X-ray and the horizontal axis represents intensity. As shown in FIG. 24(B), tungsten was detected in Sample A and oxygen was less than or equal to the lower detection limit.

Note that titanium and copper detected in the EDX analysis are attributed to the sample holder used in the STEM observation and the EDX analysis, and nickel is attributed to the mesh used for fixing the sample. In the EDX analysis, the lower detection limit is approximately 0.5 atomic %.

Figure 25A:
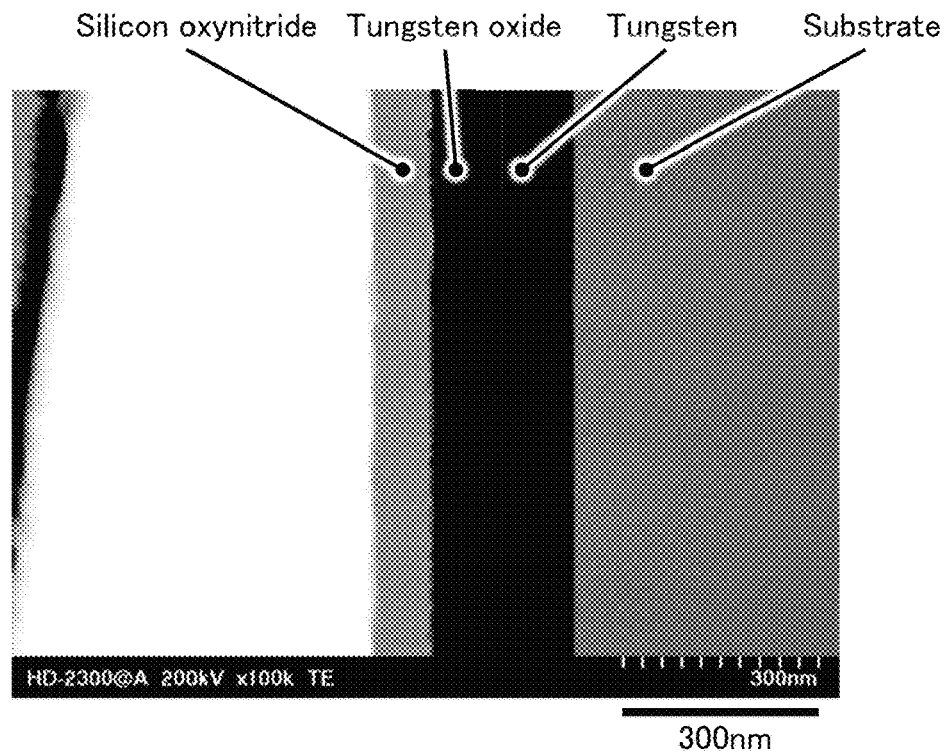
FIGS. 25A-25B Cross-sectional STEM images.
Figure 25B:
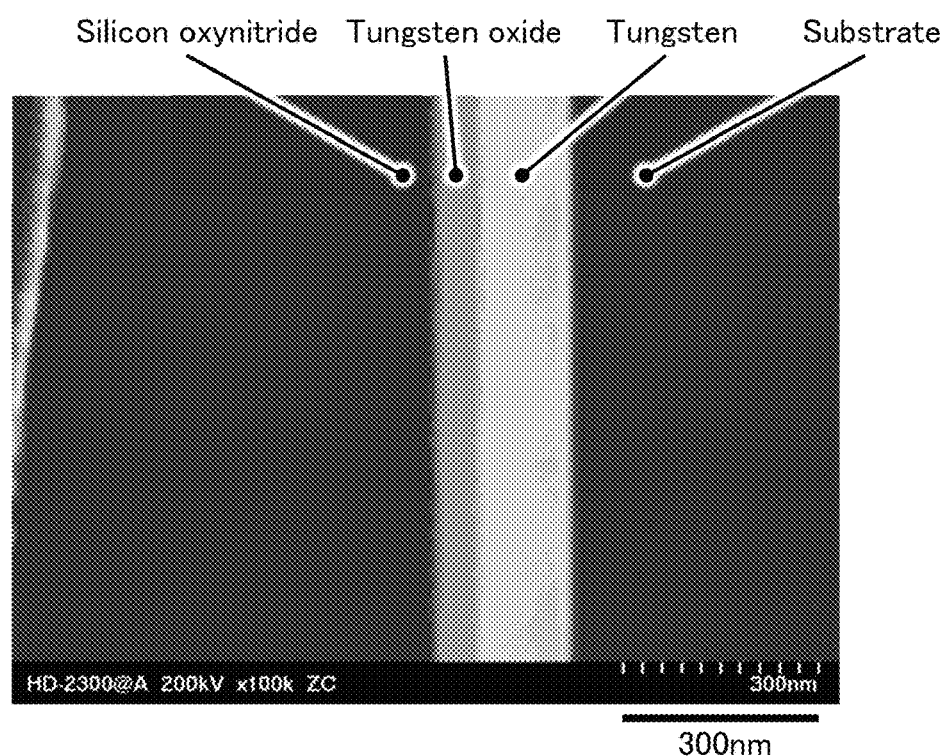

FIG. 25(A) and FIG. 25(B) are STEM images of the cross section of Comparative sample. FIG. 25(A) is a TE image at a magnification of 100000 times. FIG. 25(B) is a ZC image of the same portion as the portion in FIG. 25(A) at a magnification of 100000 times. As shown in FIG. 25(B), a layer was observed between the tungsten film and the silicon oxynitride film. The layer was observed darker than tungsten in the ZC image.

Figure 26A:
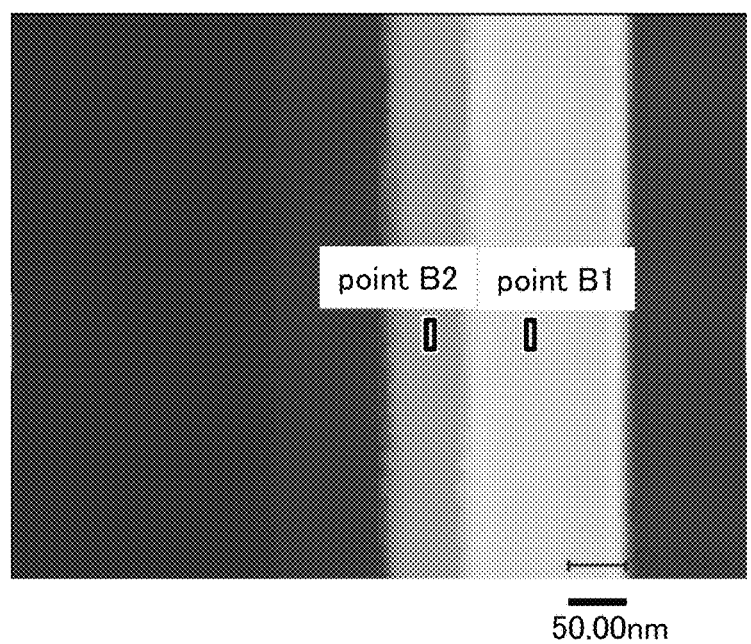
FIGS. 26A-26C A cross-sectional STEM image and EDX spectra.
Figure 26B:
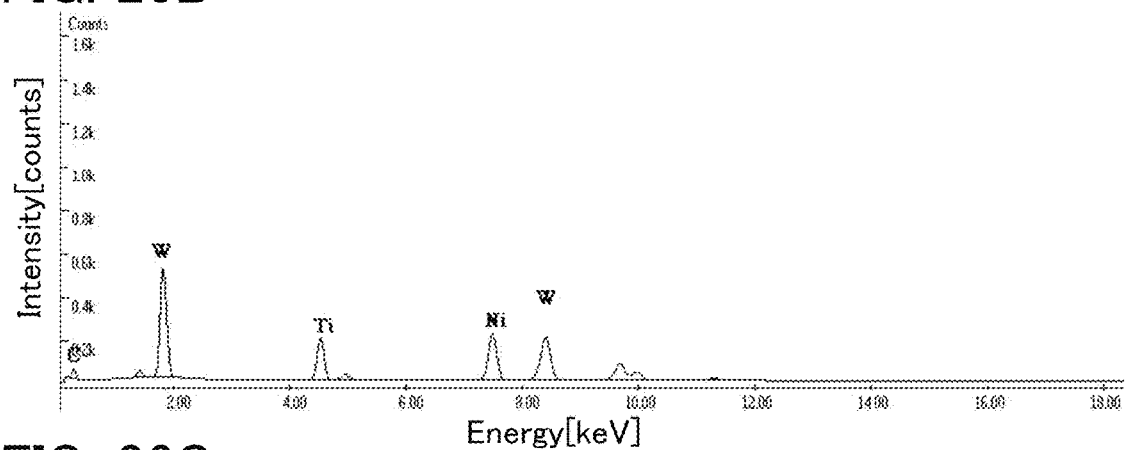
Figure 26C:
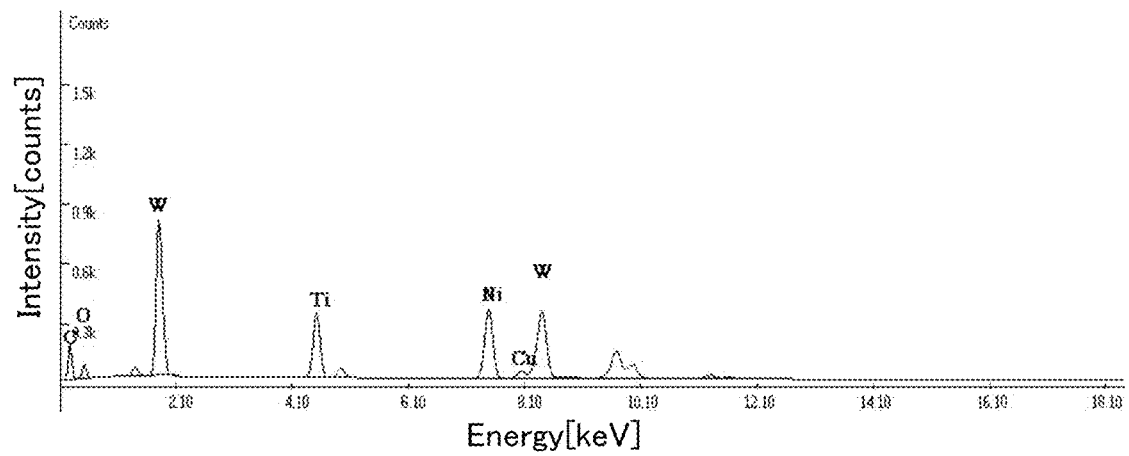

EDX analysis was performed on the tungsten film and the layer with the use of the cross-sectional STEM image shown in FIG. 25(B). The portion subjected to EDX analysis is two, i.e., point B1 and point B2 in FIG. 26(A). Point B1 was in the tungsten film. Point B2 was in the layer. The EDX spectrum at point B1 is shown in FIG. 26(B) and the EDX spectrum at point B2 is shown in FIG. 26(C). In FIG. 26(B) and FIG. 26(C), the vertical axis represents the energy of the characteristic X-ray and the horizontal axis represents intensity. As shown in FIG. 26(B), in the tungsten film, tungsten was detected and oxygen was less than or equal to the lower detection limit. As shown in FIG. 26(C), in the layer, tungsten and oxygen were detected, and the layer was found to be tungsten oxide.

The tungsten oxide film was observed between the tungsten film and the silicon oxynitride film in Comparative sample in the cross-sectional observation and the EDX analysis, while the layer was not observed between the tungsten film and the silicon oxynitride film in Sample A. It is assumed that, in Comparative sample, the tungsten film was oxidized by oxygen contained in silicon oxynitride and the tungsten oxide film was consequently formed. On the other hand, it is assumed that, in Sample A that is one embodiment of the present invention, owing to boron contained in the silicon oxynitride film, oxygen contained in the silicon oxynitride film was not easily released and thus the tungsten film was not easily oxidized. That is, it was confirmed that an oxide insulating film containing boron has a function of not easily releasing oxygen.

REFERENCE NUMERALS 100, 100A, 100B, 100C, 100D, 100E: transistor, 102: substrate, 103, 110, 118: insulating layer, 103d, 108n, 110d: region, 106, 106c, 112, 120a, 120b: conductive layer, 108, 108c: semiconductor layer, 112f: conductive film, 114: metal oxide layer, 114f: metal oxide film, 130A, 130B: capacitor, 141a, 141b, 142: opening.

What is claimed is:
1. A method for manufacturing a semiconductor device, comprising steps of:
forming a semiconductor layer over a first insulating layer;
forming a second insulating layer over the semiconductor layer;
forming a metal oxide layer over the second insulating layer;
forming a conductive layer over the metal oxide layer; and
forming a third insulating layer in contact with a top surface of the semiconductor layer, a side surface of the second insulating layer, a side surface of the metal oxide layer, and a top surface and a side surface of the conductive layer,
wherein the semiconductor layer comprises a metal oxide,
wherein the third insulating layer comprises a first element, and
wherein the first element is one or more of phosphorus and boron.
2. The method for manufacturing the semiconductor device, according to claim 1, wherein the semiconductor layer comprises indium, gallium, and zinc.
3. The method for manufacturing the semiconductor device, according to claim 1, wherein, in a thickness direction of the third insulating layer, a ratio of a maximum concentration of the first element to a minimum concentration of the first element is greater than or equal to 1.0 and less than or equal to 10.0.
4. The method for manufacturing the semiconductor device, according to claim 1, further performing a heat treatment after forming the third insulating layer.
5. The method for manufacturing the semiconductor device, according to claim 4, wherein the first element in the third insulating layer is diffused to the first insulating layer by the heat treatment.
6. A method for manufacturing a semiconductor device, comprising steps of:
forming a first conductive layer over a substrate;
forming a first insulating layer over the first conductive layer;
forming a semiconductor layer over the first insulating layer;
forming a second insulating layer over the semiconductor layer;

forming a metal oxide layer over the second insulating layer;

forming a second conductive layer over the metal oxide layer;

forming a third insulating layer to cover a top surface of the first insulating layer, a top surface and a side surface of the semiconductor layer, a side surface of the second insulating layer, a side surface of the metal oxide layer, and a top surface and a side surface of the second conductive layer;

forming a first opening and a second opening reaching the semiconductor layer in the third insulating layer; and forming a third conductive layer in contact with the semiconductor layer in the first opening and forming a fourth conductive layer in contact with the semiconductor layer in the second opening, wherein the metal oxide layer comprises aluminum or hafnium, wherein the semiconductor layer comprises a metal oxide, wherein the third insulating layer is formed by a CVD method using a silicon source, an oxygen source, and an impurity element source as a source gas, and wherein the impurity element source is at least one of $PH_3$ and $B_2H_6$.

7. The method for manufacturing the semiconductor device, according to claim 6, wherein the semiconductor layer comprises indium, gallium, and zinc.

8. The method for manufacturing the semiconductor device, according to claim 6, wherein, in a thickness direction of the third insulating layer, a ratio of a maximum impurity concentration to a minimum impurity concentration is greater than or equal to 1.0 and less than or equal to 10.0.

9. The method for manufacturing the semiconductor device, according to claim 6, further performing a heat treatment after forming the third insulating layer.

10. A method for manufacturing a semiconductor device, comprising steps of:

forming a first conductive layer over a substrate;

forming a first insulating layer over the first conductive layer;

forming a semiconductor layer over the first insulating layer;

forming a second insulating layer over the semiconductor layer;

forming a metal oxide layer over the second insulating layer;

forming a second conductive layer over the metal oxide layer;

forming a third insulating layer to cover a top surface of the first insulating layer, a top surface and a side surface of the semiconductor layer, a side surface of the second insulating layer, a side surface of the metal oxide layer, and a top surface and a side surface of the second conductive layer;

forming a first opening and a second opening reaching the semiconductor layer in the third insulating layer; and forming a third conductive layer in contact with the semiconductor layer in the first opening and forming a fourth conductive layer in contact with the semiconductor layer in the second opening, wherein the semiconductor layer comprises indium and gallium, wherein a content ratio of gallium in the metal oxide layer is higher than a content ratio of gallium in the semiconductor layer, wherein a content ratio of indium in the semiconductor layer is higher than a content ratio of gallium in the metal oxide layer, wherein the third insulating layer is formed by a CVD method using a silicon source, an oxygen source, and an impurity element source as a source gas, and wherein the impurity element source is at least one of $PH_3$ and $B_2H_6$.

11. The method for manufacturing the semiconductor device, according to claim 10, wherein the semiconductor layer comprises zinc.

12. The method for manufacturing the semiconductor device, according to claim 10, wherein, in a thickness direction of the third insulating layer, a ratio of a maximum impurity concentration to a minimum impurity concentration is greater than or equal to 1.0 and less than or equal to 10.0.

13. The method for manufacturing the semiconductor device, according to claim 10, further performing a heat treatment after forming the third insulating layer.

* * * * *